United States Patent
Serizawa et al.

(10) Patent No.: US 12,543,353 B2
(45) Date of Patent: Feb. 3, 2026

(54) SEMICONDUCTOR DEVICE AND SEMICONDUCTOR DEVICE MANUFACTURING METHOD

(71) Applicant: Socionext Inc., Kanagawa (JP)

(72) Inventors: Haruhiko Serizawa, Yokohama (JP); Tatsuo Chijimatsu, Yokohama (JP)

(73) Assignee: Socionext Inc., Kanagawa (JP)

( * ) Notice: Subject to any disclaimer, the term of this patent is extended or adjusted under 35 U.S.C. 154(b) by 407 days.

(21) Appl. No.: 17/982,005

(22) Filed: Nov. 7, 2022

(65) Prior Publication Data
US 2023/0053433 A1 Feb. 23, 2023

Related U.S. Application Data

(63) Continuation of application No. PCT/JP2020/019228, filed on May 14, 2020.

(51) Int. Cl.
| | |
|---|---|
| *H10D 62/10* | (2025.01) |
| *H01L 23/48* | (2006.01) |
| *H10D 30/01* | (2025.01) |
| *H10D 30/43* | (2025.01) |
| *H10D 30/67* | (2025.01) |

(52) U.S. Cl.
CPC ......... *H10D 62/121* (2025.01); *H01L 23/481* (2013.01); *H10D 30/014* (2025.01); *H10D 30/43* (2025.01); *H10D 30/6757* (2025.01)

(58) Field of Classification Search
CPC ......... H01L 29/66545; H01L 21/02233; H01L 21/76224
See application file for complete search history.

(56) References Cited

U.S. PATENT DOCUMENTS

| | | | |
|---|---|---|---|
| 9,129,829 B2 | 9/2015 | Kuhn et al. | |
| 9,570,395 B1 | 2/2017 | Sengupta et al. | |
| 9,837,414 B1 | 12/2017 | Balakrishnan et al. | |
| (Continued) | | | |

FOREIGN PATENT DOCUMENTS

CN 113437150 A 9/2021

OTHER PUBLICATIONS

International Search Report (ISR) of Int. Appl. No. PCT/JP2020/019228 dated Jul. 28, 2020, with English translation.
(Continued)

*Primary Examiner* — Brian Turner
(74) *Attorney, Agent, or Firm* — Rimon P.C.

(57) ABSTRACT

A semiconductor device includes, above a substrate, a first layer with, on both sides in a direction, first regions; a second layer above the first layer with, on both sides in the direction, second regions above the first regions; a third layer, third regions, a fourth layer, and fourth regions, corresponding to the first layer, first regions, second layer, and second regions, respectively, the third layer being side by side with the first layer in another direction, the fourth layer being side by side with the second layer in the other direction; first and second gate electrodes above the first and second layers and the third and fourth layers, and having gate insulating films between these gate electrodes and these layers; and an insulating wall extending in the direction with both side surfaces contacted by the first and second layers and the third and fourth layers, respectively.

9 Claims, 63 Drawing Sheets

(56) References Cited

U.S. PATENT DOCUMENTS

| | | |
|---|---|---|
| 10,236,217 B1 | 3/2019 | Ando et al. |
| 10,424,639 B1 | 9/2019 | Miao et al. |
| 10,510,620 B1 | 12/2019 | Chanemougame et al. |
| 10,559,566 B1 | 2/2020 | Lee et al. |
| 11,239,236 B2 | 2/2022 | Lilak et al. |
| 2017/0040321 A1 | 2/2017 | Mitard |
| 2019/0131394 A1 | 5/2019 | Reznicek et al. |
| 2019/0172828 A1 | 6/2019 | Smith et al. |
| 2019/0305104 A1 | 10/2019 | Xie et al. |
| 2019/0355845 A1 | 11/2019 | Zhou et al. |
| 2020/0118891 A1 | 4/2020 | Cheng et al. |
| 2020/0127054 A1 | 4/2020 | Ando et al. |
| 2020/0286900 A1* | 9/2020 | Mann ............... H10D 30/62 |
| 2021/0202500 A1* | 7/2021 | Chanemougame .... H10D 89/10 |
| 2021/0296315 A1* | 9/2021 | Lilak ................. H10D 88/01 |
| 2021/0399099 A1* | 12/2021 | Chu ............... H01L 21/28525 |
| 2022/0102346 A1 | 3/2022 | Lilak et al. |

OTHER PUBLICATIONS

Stacked nanosheet fork architecture for SRAM design and device co-optimization toward 3nm_001_IEDM17-505-508, Dec. 2-6, 2017.
Novel forksheet device architecture as ultimate logic scaling device towards 2nm_001_IEDM19-871-874, Dec. 7-11, 2019.
Chinese Office Action dated May 20, 2025 issued in the corresponding Chinese Patent Application No. 202080100676.1, with English translation.
Chinese Office Action dated Sep. 16, 2025 issued in the corresponding Chinese Patent Application No. 202080100676.1, with English machine translation.
Chinese Office Action dated Dec. 14, 2025 issued in the corresponding Chinese Patent Application No. 202080100676.1, with English translation.

* cited by examiner

SEMICONDUCTOR DEVICE AND SEMICONDUCTOR DEVICE MANUFACTURING METHOD

CROSS-REFERENCE TO RELATED APPLICATION

The present application is a continuation of the international application No. PCT/JP2020/019228, filed on May 14, 2020, and designated the U.S., the entire contents of which are incorporated herein by reference.

BACKGROUND OF THE INVENTION

1. Field of the Invention

The present invention relates to a semiconductor device and a semiconductor device manufacturing method.

2. Description of the Related Art

A device called a complementary field effect transistor (CFET) is known. In a CFET, an n-channel FET and a p-channel FET are stacked on a substrate. A CFET is suitable for miniaturization of a semiconductor device.

Also a device called a forksheet transistor is known. In a forksheet transistor, channels of nanowires or nanosheets are arranged in such a manner that a wall-like insulating film is placed between the channels. Also a forksheet transistor is suitable for miniaturization of a semiconductor device.

RELATED ART DOCUMENTS

Patent Documents

[Patent Document 1] U.S. Pat. No. 9,570,395
[Patent Document 2] U.S. Pat. No. 9,837,414
[Patent Document 3] United States Patent Application Publication No. 2017/0040321
[Patent Document 4] U.S. Pat. No. 9,129,829

Non-Patent Documents

[Non-Patent Document 1] IEDM17-505, 2-6 Dec. 2017
[Non-Patent Document 2] IEDM19-871, 7-11 Dec. 2019

SUMMARY

Means for Solving the Problems

A semiconductor device according to a disclosed technology includes: a substrate; a first semiconductor layer disposed above the substrate; a first semiconductor region and a second semiconductor region that are disposed above the substrate, the first semiconductor layer being disposed between the first semiconductor region and the second semiconductor region with respect to a first direction in plan view; a second semiconductor layer disposed above the first semiconductor layer; a third semiconductor region and a fourth semiconductor region that are disposed above the first semiconductor region and the second semiconductor region, respectively, the second semiconductor layer being disposed between the third semiconductor region and the fourth semiconductor region with respect to the first direction; a third semiconductor layer disposed above the substrate and disposed side by side with respect to the first semiconductor layer with respect to a second direction different from the first direction in plan view; a fifth semiconductor region and a sixth semiconductor region disposed above the substrate, the third semiconductor layer being disposed between the fifth semiconductor region and the sixth semiconductor region with respect to the first direction in plan view; a fourth semiconductor layer disposed above the third semiconductor layer and disposed side by side with respect to the second semiconductor layer with respect to the second direction in plan view; a seventh semiconductor region and an eighth semiconductor region disposed above the fifth semiconductor region and the sixth semiconductor region, respectively, the fourth semiconductor layer being disposed between the seventh semiconductor region and the eighth semiconductor region with respect to the first direction; an insulating wall having an insulating property, disposed above the substrate, extending in the first direction, and having a first side surface and a second side surface opposite the first side surface; a first gate electrode disposed above the first semiconductor layer and the second semiconductor layer, first gate insulating films being disposed between the first gate electrode and the first semiconductor layer and between the first gate electrode and the second semiconductor layer; and a second gate electrode disposed above the third semiconductor layer and the fourth semiconductor layer, second gate insulating films being disposed between the second gate electrode and the third semiconductor layer and between the second gate electrode and the fourth semiconductor layer. The first side surface is in contact with the first semiconductor layer and the second semiconductor layer, and the second side surface is in contact with the third semiconductor layer and the fourth semiconductor layer.

The object and advantages of the invention will be implemented and attained by the elements and combinations particularly pointed out in the appended claims.

It is to be understood that both the foregoing general description and the following detailed description are exemplary and explanatory and are not restrictive of the invention as claimed.

BRIEF DESCRIPTION OF DRAWINGS

Other objects and further features of embodiments will become apparent from the following detailed description when read in conjunction with the accompanying drawings, in which.

DESCRIPTION OF EMBODIMENTS

Figure 1:
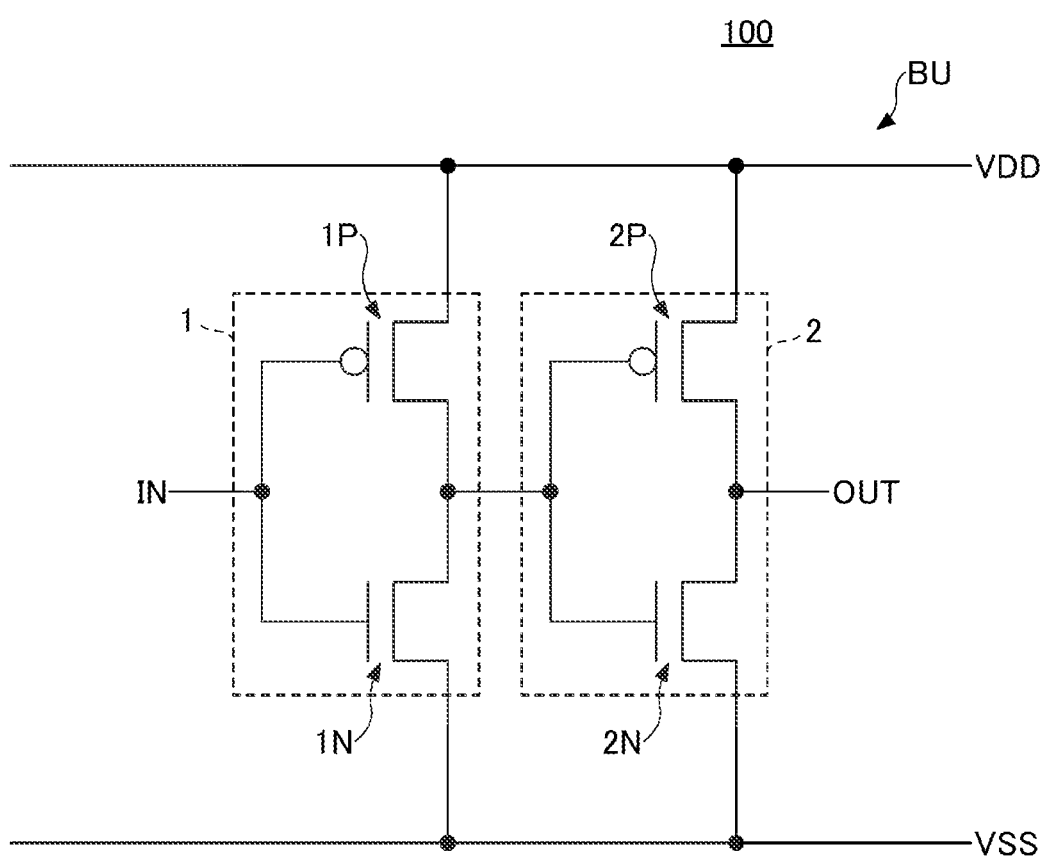
FIG. 1 is a diagram illustrating a configuration of a circuit included in a semiconductor device according to an embodiment.

In the related arts, study for a specific structure enabling further miniaturization has not been made in detail.

An object of the present invention is to provide a semiconductor device enabling further miniaturization and a method of manufacturing the same.

According to the disclosed technology, it is possible to provide a semiconductor device enabling further miniaturization and a method of manufacturing the same.

Hereinafter, embodiments will be described in detail with reference to the accompanying drawings. In the specification and the drawings, components having substantially the same functions and configurations are denoted by the same reference numerals, and redundant description thereof may be omitted. In the following description, two directions parallel to a surface of a substrate and orthogonal to each other are referred to as an X direction and a Y direction, and a direction perpendicular to the surface of the substrate is referred to as a Z direction. An n-channel field-effect transistor may be referred to as an nFET, and a p-channel field-effect transistor may be referred to as a pFET. In addition, being the same in the arrangement in the present disclosure does not strictly exclude not being the same due to manufacturing variation, and even in a case where deviation occurs in the arrangement due to manufacturing variation, the arrangement can be regarded as being the same.

(Circuit included in Semiconductor Device)

A circuit included in a semiconductor device according to an embodiment will be described. FIG. 1 is a diagram illustrating the configuration of the circuit included in the semiconductor device according to the embodiment.

As depicted in FIG. 1, the semiconductor device 100 according to the embodiment includes a buffer BU, a VDD wiring to which a power supply potential VDD is applied, and a VSS wiring to which a power supply potential VSS is applied. The VDD wiring is also called a power supply wiring in some cases. The power supply potential of VSS is, for example, a ground potential, and the VSS wiring is sometimes referred to as a ground wiring. The buffer BU includes an inverter 1 and an inverter 2. An input signal IN is input to the inverter 1, an output of the inverter 1 is input to the inverter 2, and an output signal OUT is output from the inverter 2. The inverter 1 includes a p-channel field-effect transistor (pFET) 1P and an n-channel field-effect transistor (nFET) 1N, and the inverter 2 includes a pFET 2P and an nFET 2N.

(Configuration of Buffer)

Figure 2:
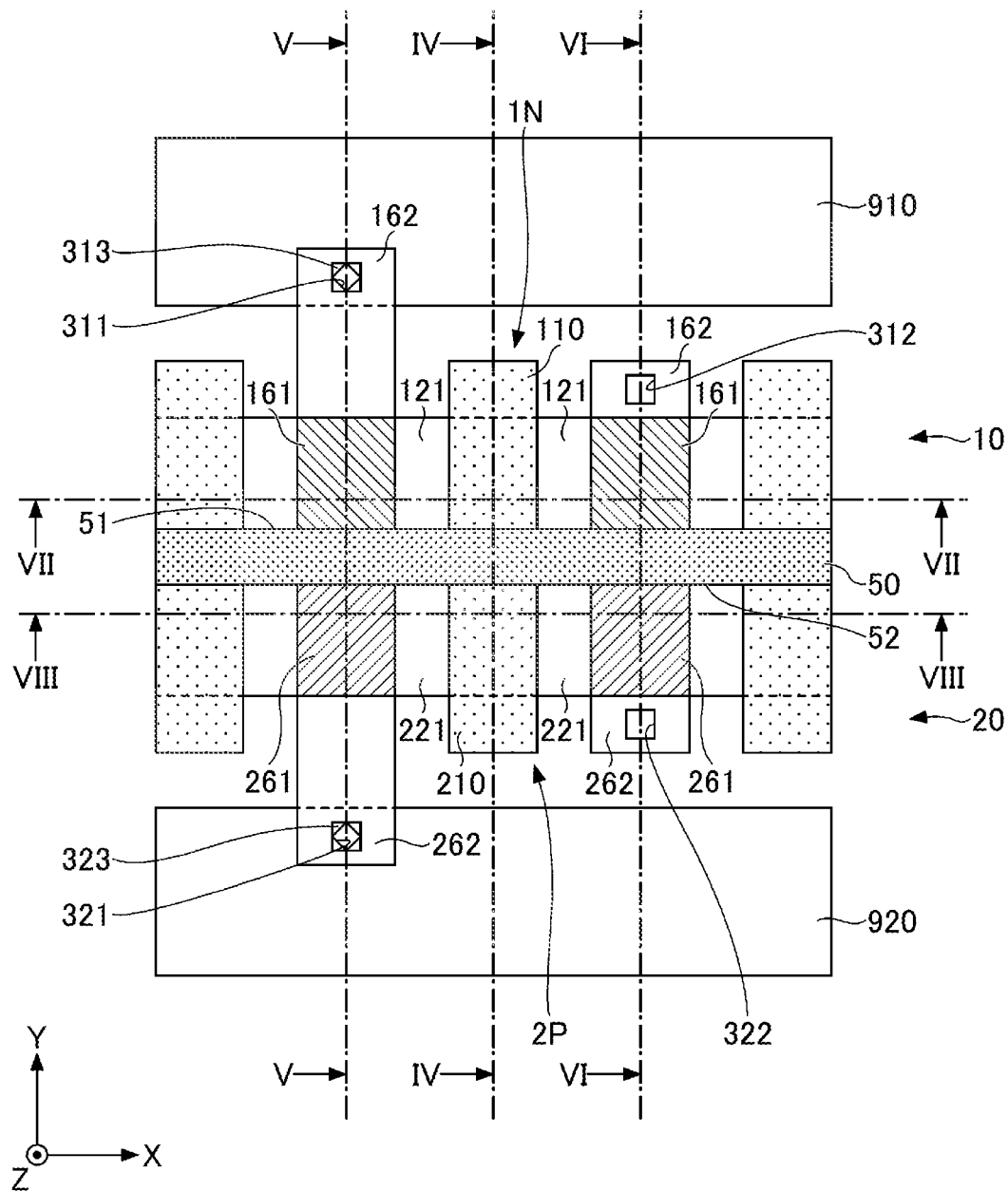
FIGS. 2 and 3 are schematic diagrams illustrating a planar configuration of a buffer.
Figure 3:
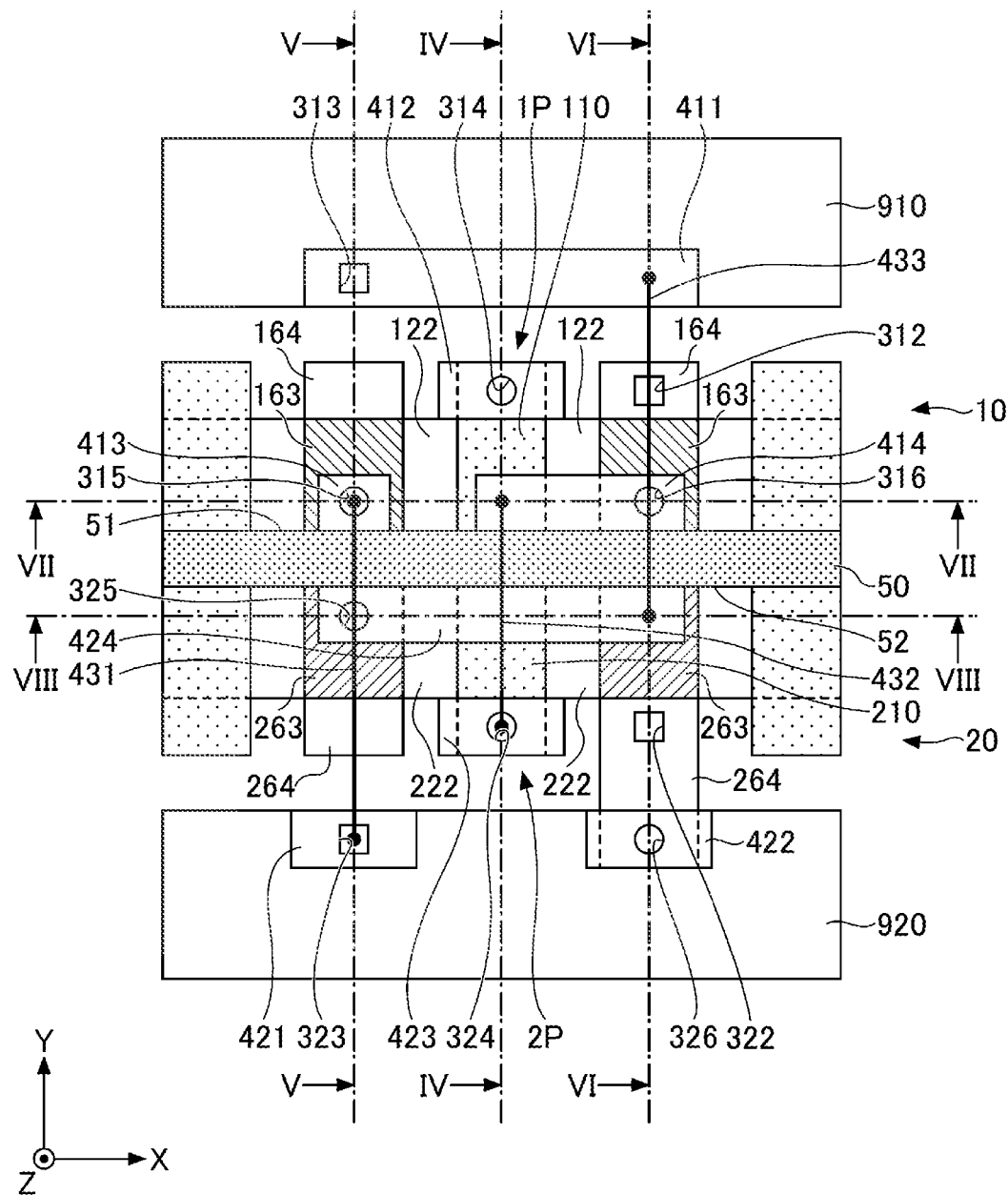
Figure 4:
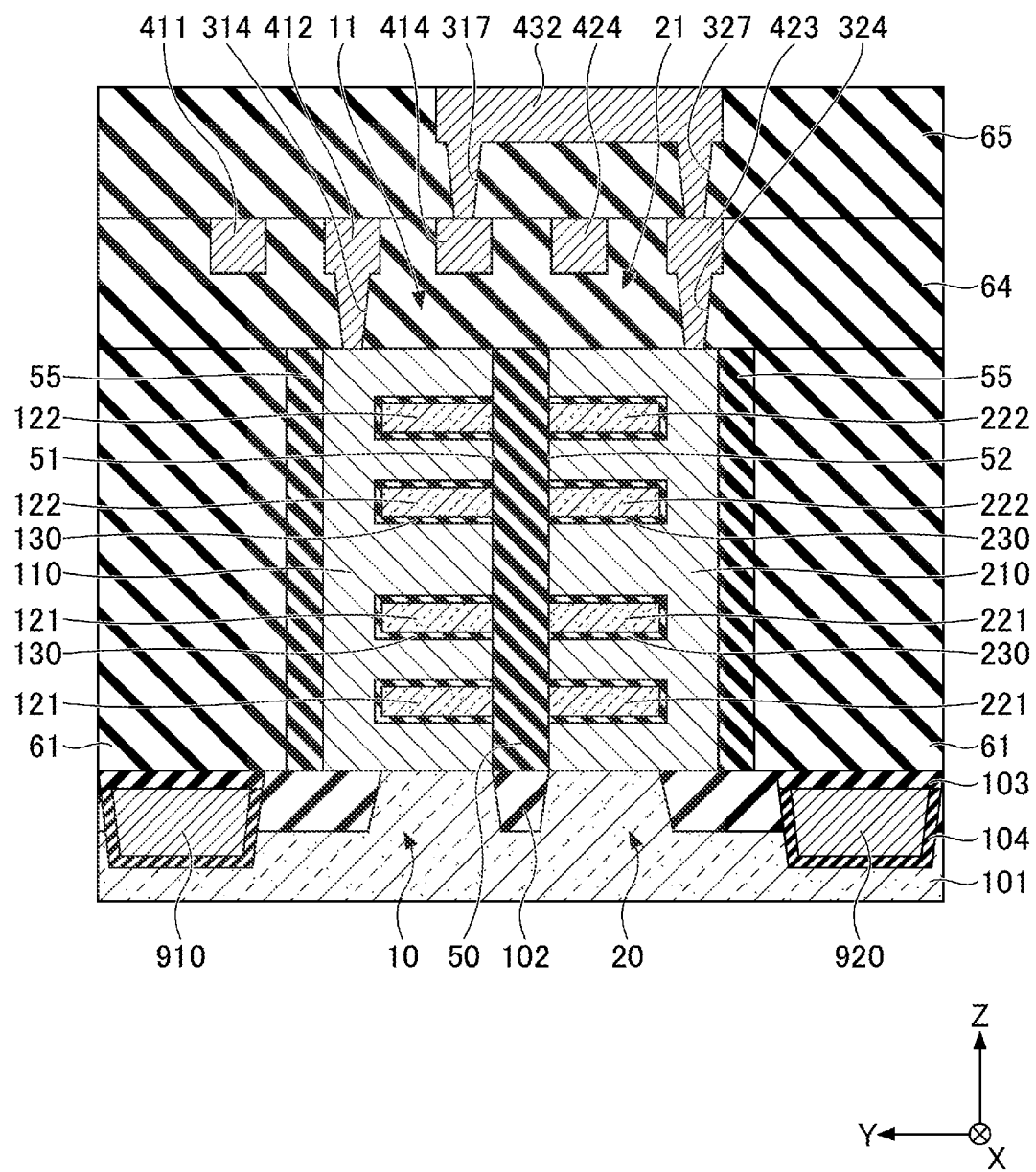
FIGS. 4-8 are cross-sectional views of the buffer.
Figure 5:
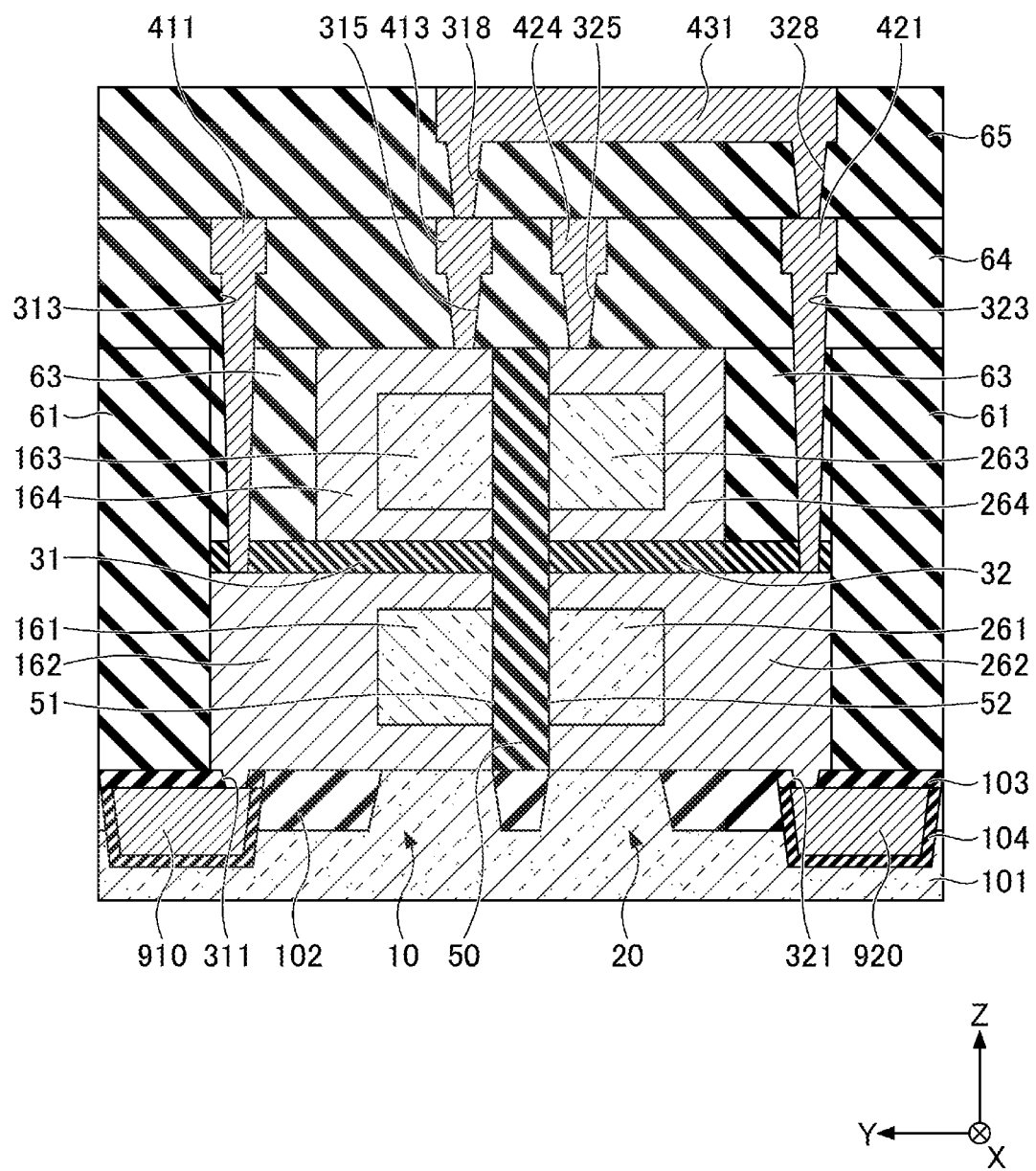
Figure 6:
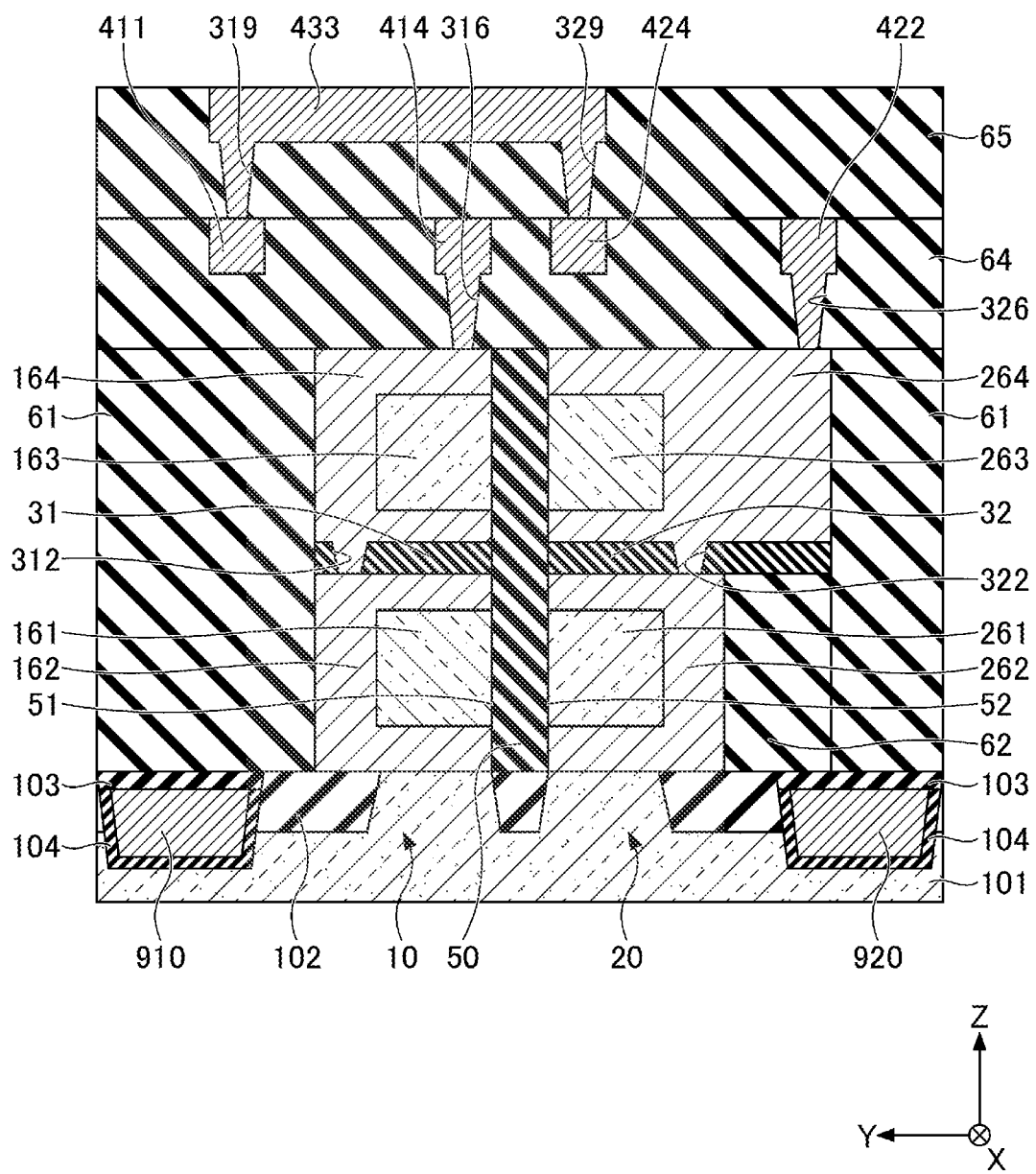
Figure 7:
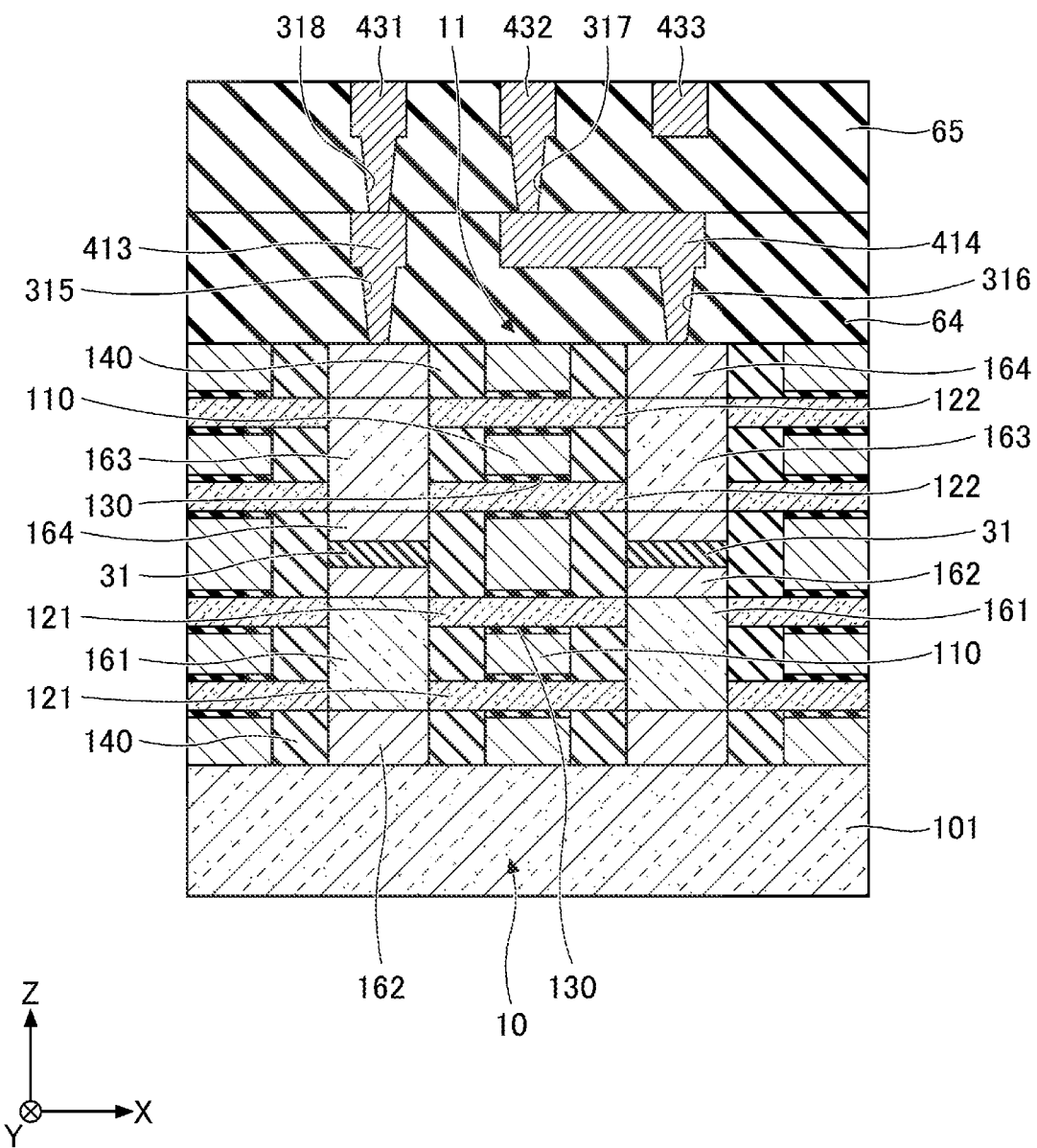
Figure 8:
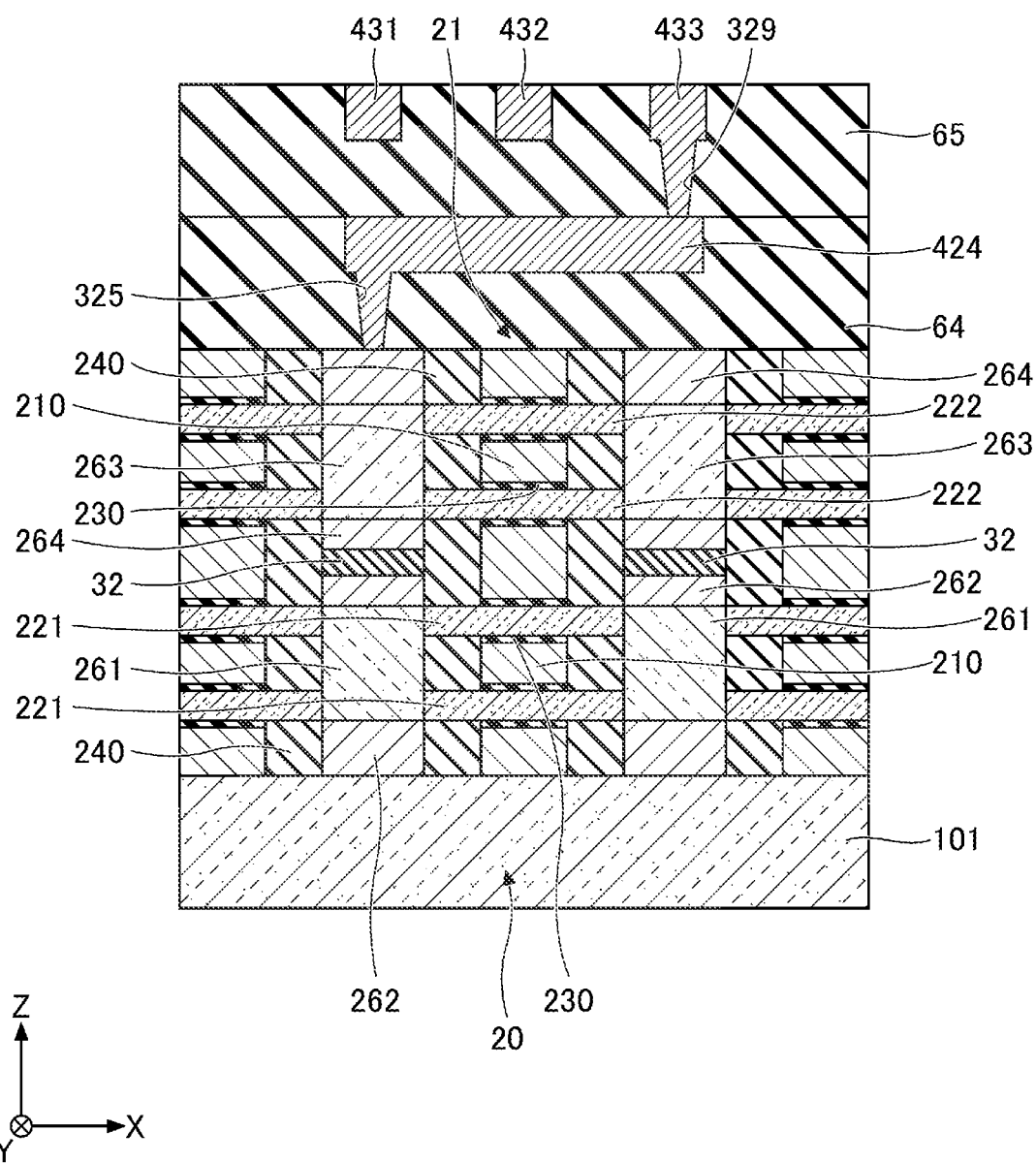

Next, the configuration of the buffer BU will be described. FIG. 2 and FIG. 3 depict schematic plan-view configurations of the buffer BU. FIG. 2 mainly depicts a layout of the nFET IN and the pFET 2P. FIG. 3 mainly depicts a layout of the pFET 1P and the nFET 2N. Except for the structure depicted in both FIGS. 2 and 3, the structure depicted in FIG. 3 is located above the structure depicted in FIG. 2. FIGS. 4, 5, 6, 7, and 8 are cross-sectional views depicting the buffer BU. FIG. 4 corresponds to a cross-sectional view taken along the line IV-IV in FIGS. 2 and 3. FIG. 5 corresponds to a cross-sectional view taken along the line V-V in FIGS. 2 and 3. FIG. 6 corresponds to a cross-sectional view taken along the line VI-VI in FIGS. 2 and 3. FIG. 7 corresponds to a cross-sectional view taken along the line VII-VII in FIGS. 2 and 3. FIG. 8 corresponds to a cross-sectional view taken along the line VIII-VIII in FIGS. 2 and 3.

As depicted in FIGS. 2 to 8, isolation films 102 are formed on a surface of a substrate 101. The isolation films 102 are formed by, for example, a shallow trench isolation (STI) method. A plurality of trenches extending in the X direction are formed on the substrate 101 and the isolation films 102, and power supply lines 910 and 920 are formed in these trenches via insulating films 104. For example, the surfaces of the power supply lines 910 and 920 are covered by insulating films 103. For example, the surfaces of the isolation films 102 and the surfaces of the insulating films 103 may be flush with and need not be flush with the surface of the substrate 101. Power supply lines 910 and 920 are embedded in the substrate 101. The power supply lines 910 and 920 having such structures may be referred to as buried power rails (BPR). For example, the power supply line 910 corresponds to the VDD wiring, and the power supply line 920 corresponds to the VSS wiring.

For example, two regions 10 and 20 arranged along the Y direction are defined by the isolation film 102. Generally, the inverter 1 is formed in the region 10, and the inverter 2 is formed in the region 20.

In the region 10, a stacked transistor structure 11 is formed on the substrate 101. The stacked transistor structure 11 includes a gate electrode 110, nanosheets 121 and 122, gate insulating films 130, and spacers 140. The gate electrode 110 extends in the Y direction and extends upward in the Z direction. The nanosheets 121 and 122 penetrate the gate electrode 110 in the X direction, and are arranged in the Y direction and the direction. The gate insulating film 130 is formed between the gate electrode 110 and the nanosheets 121 and 122. In the X direction, the gate electrode 110 and the gate insulating films 130 are formed in such a manner as to recede from both ends of the nanosheets 121 and 122, and the spacers 140 are formed in these receded spaces. In other words, with respect to the X direction, the spacers 140 are formed between the gate electrode 110 and semiconductor layers that include n-type semiconductor layers 161 and p-type semiconductor layers 163, which will be described later.

For example, each of the number of the nanosheets 121 arranged in the Z direction and the number of the nanosheets 122 arranged in the Z direction is two, and the two nanosheets 122 are arranged above the two nanosheets 121. The thickness of each of the nanosheets 121 and each of the nanosheets 122 is, for example, about 5 nm. Each of the number of the nanosheets 121 and the number of the nanosheets 122 may be one, or three or more. In addition, the number of nanosheets 121 and the number of nanosheets 122 may be the same as each other or different from each other.

In the region 10, the two n-type semiconductor layers 161 in contact with the ends of the nanosheets 121 are formed so that the gate electrode 110 is disposed between the n-type semiconductor layers 161 in the X direction. Two local wirings 162 in contact with the n-type semiconductor layers 161 are formed in such a manner that the gate electrode 110 is disposed between the local wirings 162 in the X direction. The two p-type semiconductor layers 163 in contact with ends of the nanosheets 122 are formed in such a manner that the gate electrode 110 is disposed between the p-type semiconductor layers 163 in the X direction. Two local wirings 164 in contact with the p-type semiconductor layers 163 are formed in such a manner that the gate electrode 110 is disposed between the local wirings 164 in the X direction. Insulating films 31 are formed between the local wirings 162 and the local wirings 164. For example, the n-type semiconductor layers 161 are n-type Si layers, and the p-type semiconductor layers 163 are p-type SiGe layers. For example, silicon oxide or silicon nitride can be used for the insulating films 31. Contact holes 312 are formed in the insulating films 31 between the local wirings 162 and the local wirings 164. The local wirings 164 is electrically connected to the local wirings 162 through conductors in the contact holes 312.

A portion of the gate electrode 110, the nanosheets 121, portions of the gate insulating films 130, and the n-type semiconductor layers 161 are included in the nFET 1N. In the nFET 1N, one of the n-type semiconductor layers 161 functions as a source region, the other n-type semiconductor layer 161 functions as a drain region, and the nanosheets 121 function as channels. A portion of the gate electrode 110, the nanosheets 122, portions of the gate insulating films 130, and the p-type semiconductor layers 163 are included in the pFET 1P. In the pFET 1P, the one p-type semiconductor layer 163 functions as a source region, the other p-type semiconductor layer 163 functions as a drain region, and the nanosheets 122 function as channels. The n-type semiconductor layers 161 and the substrate 101 may be electrically connected to each other, or may be electrically separated from each other by insulating films formed therebetween.

In the region 20, a stacked transistor structure 21 is formed on the substrate 101. The stacked transistor structure 21 includes a gate electrode 210, nanosheets 221 and 222, gate insulating films 230, and spacers 240. The gate electrode 210 extends in the Y direction and extends upward in the Z direction. The nanosheets 221 and 222 penetrate the gate electrode 210 in the X direction, and are arranged in the Y direction and the direction. The gate insulating films 230 are formed between the gate electrode 210 and the nanosheets 221 and 222. In the X direction, the gate electrode 210 and the gate insulating films 230 are formed in such a manner as to recede from both ends of the nanosheets 221 and 222, and the spacers 240 are formed in these receded spaces. In other words, in the X direction, the spacers 240 are formed between the gate electrode 210 and semiconductor layers that include the p-type semiconductor layers 261 and the n-type semiconductor layers 263, which will be described later.

For example, each of the number of nanosheets 221 arranged in the Z direction and the number of nanosheets 222 arranged in the Z direction is two, and the two nanosheets 222 are arranged above the two nanosheets 221. The thickness of each of the nanosheets 221 and 222 is, for example, less than or equal to 10 nm, preferably less than or equal to 5 nm. Each of the number of nanosheets 221 and the number of nanosheets 222 may be one, or three or more. In addition, each of the number of nanosheets 221 and the number of nanosheets 222 may be the same as or different from each other.

In the region 20, the two p-type semiconductor layers 261 in contact with the ends of the nanosheets 221 are formed in such a manner as to sandwich the gate electrode 210 in the X direction. Two local wirings 262 in contact with the p-type semiconductor layers 261 are formed in such a manner that the gate electrode 210 is disposed between the local wirings 262 in the X direction. The two n-type semiconductor layers 263 in contact with the ends of the nanosheets 222 are formed in such a manner that the gate electrode 210 is disposed between the n-type semiconductor layers 263 in the X direction. Two local wirings 264 in contact with the n-type semiconductor layers 263 are formed in such a manner that the gate electrode 210 is disposed between the local wirings 264 in the X direction. Insulating films 32 is formed between the local wirings 262 and the local wirings 264. For example, the p-type semiconductor layers 261 are p-type SiGe layers, and the n-type semiconductor layers 263 are n-type Si layers. For example, silicon oxide or silicon nitride can be used for the insulating films 32. Contact holes 322 are formed in the insulating films 32 between the local wirings 262 and the local wirings 264. The local wirings 264 are electrically connected to the local wirings 262 through conductors in the contact holes 322. The p-type semiconductor layers 261 and the substrate 101 may be electrically connected to each other, or may be electrically separated from each other by insulating films formed therebetween.

A portion of the gate electrode 210, the nanosheets 221, portions of the gate insulating films 230, and the p-type semiconductor layers 261 are included in the pFET 2P. In the pFET 2P, one of the p-type semiconductor layers 261 functions as a source region, the other p-type semiconductor layer 261 functions as a drain region, and the nanosheets 221 function as channels. A portion of the gate electrode 210, the nanosheets 222, portions of the gate insulating films 230, and the n-type semiconductor layers 263 are included in the nFET 2N. In the nFET 2N, one of the n-type semiconductor layers 263 functions as a source region, the other n-type semiconductor layer 263 functions as a drain region, and the nanosheets 222 function as channels.

Although not depicted in the drawings, insulating films are formed between the substrate 101 and the gate electrodes 110 and 210 to electrically isolate the gate electrodes 110 and 210 from the substrate 101.

The local wiring 162 extends in the Y direction. The local wiring 162 thus extends to a position above the power supply line 910. A contact hole 311 is formed in the insulating film 103 between the local wiring 162 and the power supply line 910. The local wiring 162 is connected to the power supply line 910 through a conductor in the contact hole 311.

The local wiring 262 extends in the Y direction. The local wiring 262 thus extends to a position above the power supply line 920. A contact hole 321 is formed in the insulating film 103 between the local wiring 262 and the power supply line 920. The local wiring 262 is connected to the power supply line 920 through a conductor in the contact hole 321.

An insulating wall 50 is provided on the substrate 101 between the regions 10 and 20. The wall 50 extends in the X direction and extends upward in the Z direction. The wall 50 includes a side surface 51 and a side surface 52 opposite to the side surface 51, the side surface 51 being in contact with the nanosheets 121 and 122 and the side surface 52 being in contact with the nanosheets 221 and 222. The width of the wall 50, i.e., the distance between the side surfaces 51 and 52, is, for example, less than or equal to 15 nm, preferably less than or equal to 8 nm.

As depicted in FIG. 4, side walls 55 are formed in such a manner as that the gate electrodes 110 and 210 together with the wall 50 are disposed between the side walls 55 with respect to the Y direction. Insulating films 61 are formed on the sides of the side walls 55. As depicted in FIG. 5, insulating films 63 are formed between the insulating films 61 and the local wirings 164 and 264; and, as depicted in FIG. 6, an insulating film 62 is formed between the insulating film 61 and the local wiring 262.

An insulating film 64 is formed on the wall 50, the gate electrodes 110 and 210, the spacers 140 and 240, the local wirings 164 and 264, the side walls 55, and the insulating films 61 and 63; and an insulating film 65 is formed on the insulating film 64.

A contact hole 313 reaching the local wiring 162 is formed in the insulating films 64, 63, and 31; and a contact hole 323 reaching the local wiring 262 is formed in the insulating films 64, 63, and 32. For example, the contact hole 313 is formed above the contact hole 311, and the contact hole 323 is formed above the contact hole 321.

Signal lines 411 and 421 are formed in the insulating film 64. The signal line 411 is connected to the local wiring 162 through a conductor in the contact hole 313. The signal line 421 is connected to the local wiring 262 through a conductor in the contact hole 323.

A contact hole 314 reaching the gate electrode 110, a contact hole 315 reaching one of the local wirings 164, and a contact hole 316 reaching the other local wiring 164 are formed in the insulating film 64. A contact hole 324 reaching the gate electrode 210, a contact hole 325 reaching one of the local wirings 264, and a contact hole 326 reaching the other local wiring 264 are formed in the insulating film 64.

Signal lines 412, 413, 414, 422, 423, and 424 are formed in the insulating film 64. The signal line 412 is connected to the gate electrode 110 through a conductor in the contact hole 314. The signal line 413 is connected to the one local wiring 164 through a conductor in the contact hole 315. The signal line 414 is connected to the other local wiring 164 through a conductor in the contact hole 316. The signal line 423 is connected to the gate electrode 210 through a conductor in the contact hole 324. The signal line 424 is connected to the one local wiring 264 through a conductor in a contact hole 325. The signal line 422 is connected to the other local wiring 264 through a conductor in the contact hole 326.

A contact hole 317 reaching the signal line 414, a contact hole 318 reaching the signal line 413, and a contact hole 319 reaching the signal line 411 are formed in the insulating film 65. A contact hole 327 reaching the signal line 423, a contact hole 328 reaching the signal line 421, and a contact hole 329 reaching the signal line 424 are formed in the insulating film 65.

Signal lines 431, 432, and 433 are formed in the insulating film 65. The signal line 431 is connected to the signal line 413 through a conductor in the contact hole 318, and connected to the signal line 421 through a conductor in the contact hole 328. The signal line 432 is connected to the signal line 414 through a conductor in the contact hole 317, and connected to the signal line 423 through a conductor in the contact hole 327. The signal line 433 is connected to the signal line 411 through a conductor in the contact hole 319, and connected to the signal line 424 through a conductor in the contact hole 329.

In the buffer BU, the input signal IN is input to the signal line 412, and the output signal OUT is output from the signal line 422.

For example, ruthenium (Ru), molybdenum (Mo), cobalt (Co), tungsten (W), or the like is used as the materials of the power supply lines 910 and 920. For example, copper (Cu), ruthenium (Ru), molybdenum (Mo), cobalt (Co), or the like is used as the materials of the signal lines 411 to 414, 421 to 424, and 431 to 433. When copper, cobalt, or tungsten is used, it is preferable to form conductive underlying films (barrier metal films), for example, tantalum (Ta) films or tantalum nitride (TaN) films, but, when ruthenium is used, such underlying films need not be formed.

For example, copper (Cu), ruthenium (Ru), molybdenum (Mo), cobalt (Co), tungsten (W), or the like is used as the materials of the local wirings 162, 164, 262, and 264. When copper, cobalt, or tungsten is used, it is preferable to form conductive underlying films (barrier metal films) such as titanium (Ti) films or titanium nitride (TiN) films, but, when molybdenum or ruthenium is used, such underlying films need not be formed. For example, materials same as or similar to the materials of the local wirings can be used as the conductors (vias) in the contact holes.

For example, a semiconductor such as silicon (Si) can be used for the substrate 101. For example, a semiconductor such as silicon (Si) can be used for the nanosheets 121, 122, 221, and 222. For the p-type semiconductor layers 163 and 261, a semiconductor such as silicon, silicon carbide (SiC), or silicon germanium (SiGe), containing boron (B) as a p-type impurity, can be used. A semiconductor such as silicon, silicon carbide, or silicon germanium, containing phosphorus (P) as an n-type impurity, can be used for the n-type semiconductor layers 161 and 263.

For example, a conductive material such as titanium (Ti), titanium nitride (TiN), or polycrystalline silicon (poly-Si) can be used for the gate electrodes 110 and 210. For example, for the gate insulating films 130 and 230, a high-dielectric-constant material such as hafnium oxide, aluminum oxide, or an oxide of hafnium and aluminum can be used. The gate insulating films 130 formed on the nanosheets 121 and the gate insulating films 130 formed on the nanosheets 122 may contain different materials between the gate insulating films 130 formed on the nanosheets 121 and the gate insulating films 130 formed on the nanosheets 122. Further, the gate insulating films 230 formed on the nanosheets 221 and the gate insulating films 230 formed on the nanosheets 222 may contain different materials between gate insulating films 230 formed on the nanosheets 221 and the gate insulating films 230 formed on the nanosheets For example, the local wirings and the signal lines are formed by a dual damascene method together with the contact holes provided below the same. Further, the local wirings and the signal lines may be formed by a single damascene method, separately from the contact holes provided below the same.

For example, silicon oxide, silicon nitride, or the like can be used as the materials of the side walls 55, the spacers 140 and 240, and the insulating wall 50.

(Semiconductor Device Manufacturing Method)

Next, a method of manufacturing the semiconductor device 100 according to the embodiment will be described. FIGS. 9 to 24 are plan views illustrating the semiconductor device manufacturing method according to the embodiment. FIGS. 25 to 37 are cross-sectional views illustrating the semiconductor device manufacturing method according to the embodiment. FIGS. 25 to 37 depict changes in the cross sections taken along the line Iv-Iv in FIGS. 2 and 3. FIGS. 38 to 44 are cross-sectional views illustrating the semiconductor device manufacturing method according to the embodiment. FIGS. 38 to 44 depict changes in the cross sections taken along the line v-v in FIGS. 2 and 3. FIGS. 45 to 48 are cross-sectional views illustrating the semiconductor device manufacturing method according to the embodiment. FIGS. 45 to 48 depict changes in the cross sections taken along the line VI-VI in FIGS. 2 and 3. FIGS. 49 to 63 are cross-sectional views illustrating the semiconductor device manufacturing method according to the embodiment. FIGS. 49 to 63 depict changes in the cross sections taken along the line VII-VII in FIGS. 2 and 3. In FIGS. 12 to 24, the insulating films other than the gate insulating films are omitted.

Figure 9:
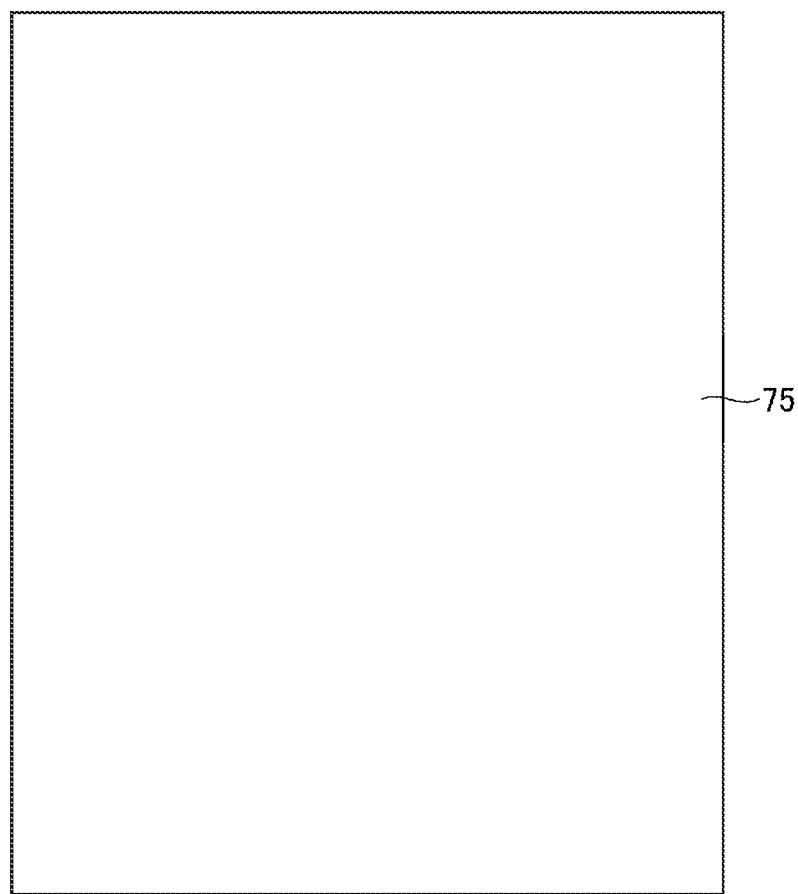
FIGS. 9-24 are plan views illustrating a semiconductor device manufacturing method according to the embodiment.
Figure 9:
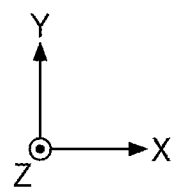
Figure 25:
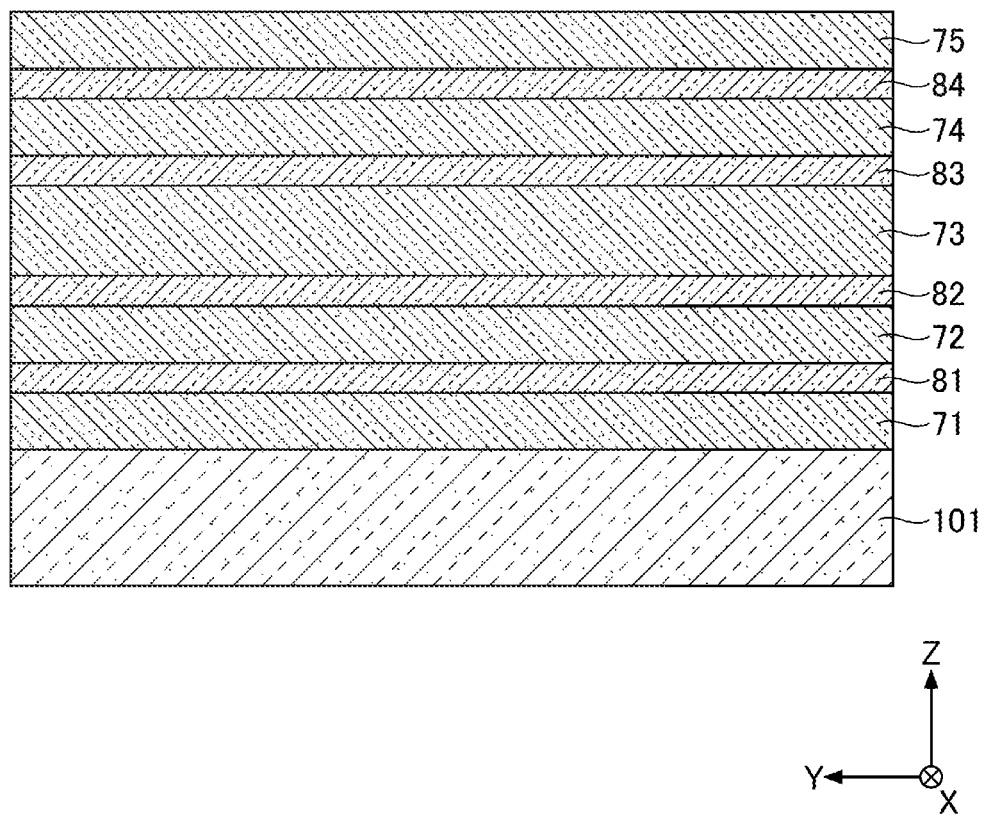
FIGS. 25-63 are cross-sectional views illustrating the semiconductor device manufacturing method according to the embodiment.
Figure 49:
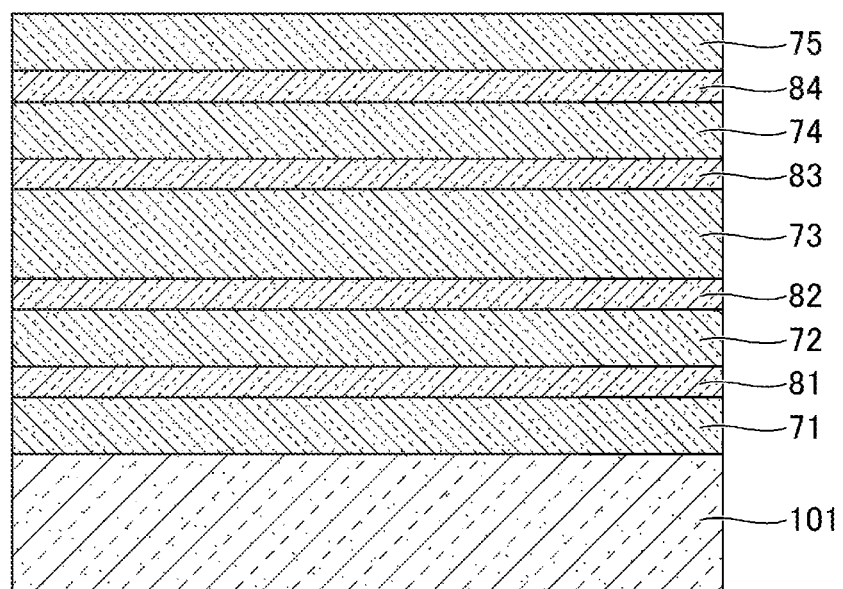

First, as depicted in FIGS. 9, 25, and 49, a SiGe film 71, a Si film 81, a SiGe film 72, a Si film 82, a SiGe film 73, a Si film 83, a SiGe film 74, a Si film 84, and a SiGe film 75 are formed on a substrate 101. The Si films 81 and 82 are used to form the nanosheets 121 and 221, and the Si films 83 and 84 are used to form the nanosheets 122 and 222. Each of the thicknesses of the Si films 81 to 84 is, for example, about 5 nm. Each of the thicknesses of the SiGe films 71 to 75 is, for example, about in the range of nm to 8 nm. The SiGe film 73 may be thicker than each of the SiGe films 71, 72, 74, and 75. The SiGe films 71 to 75 and the Si films 81 to 84 are formed by, for example, an epitaxial growth method.

Figure 10:
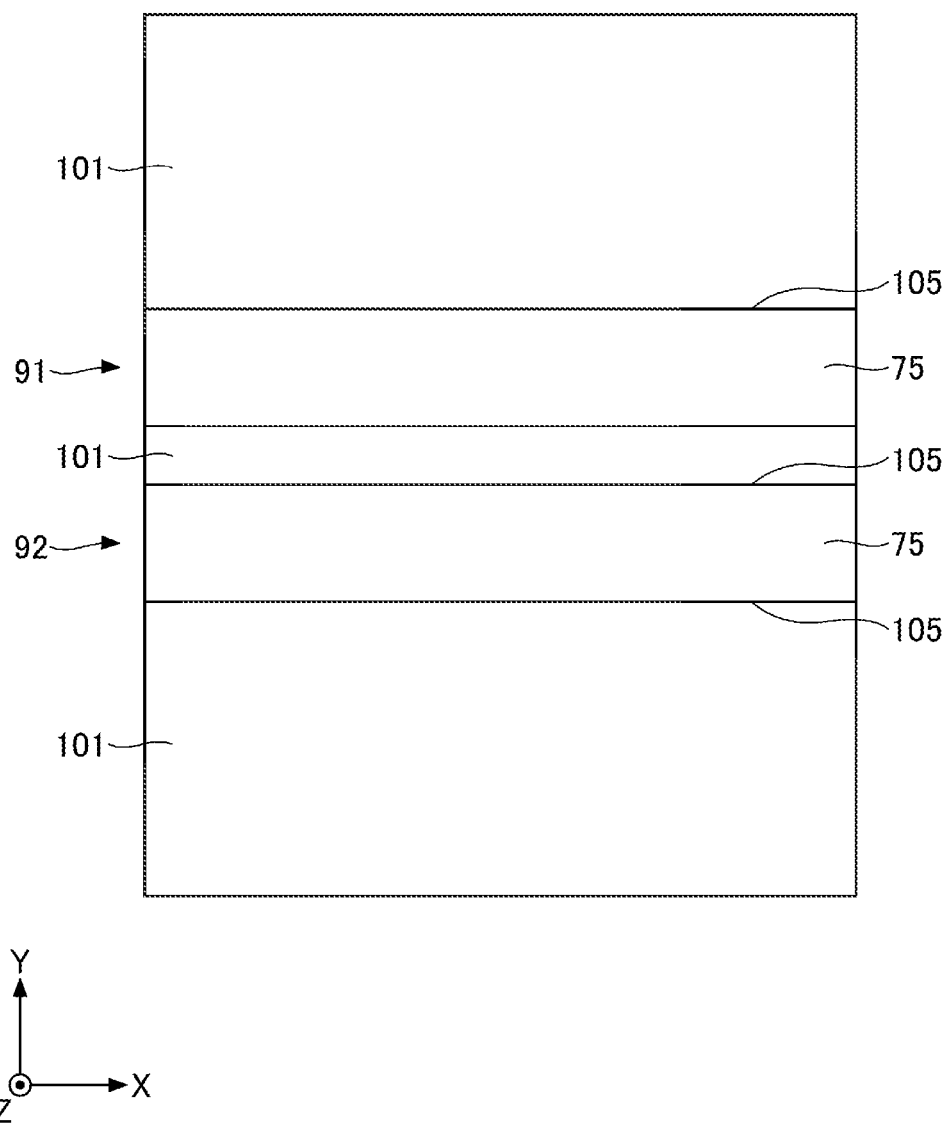
Figure 26:
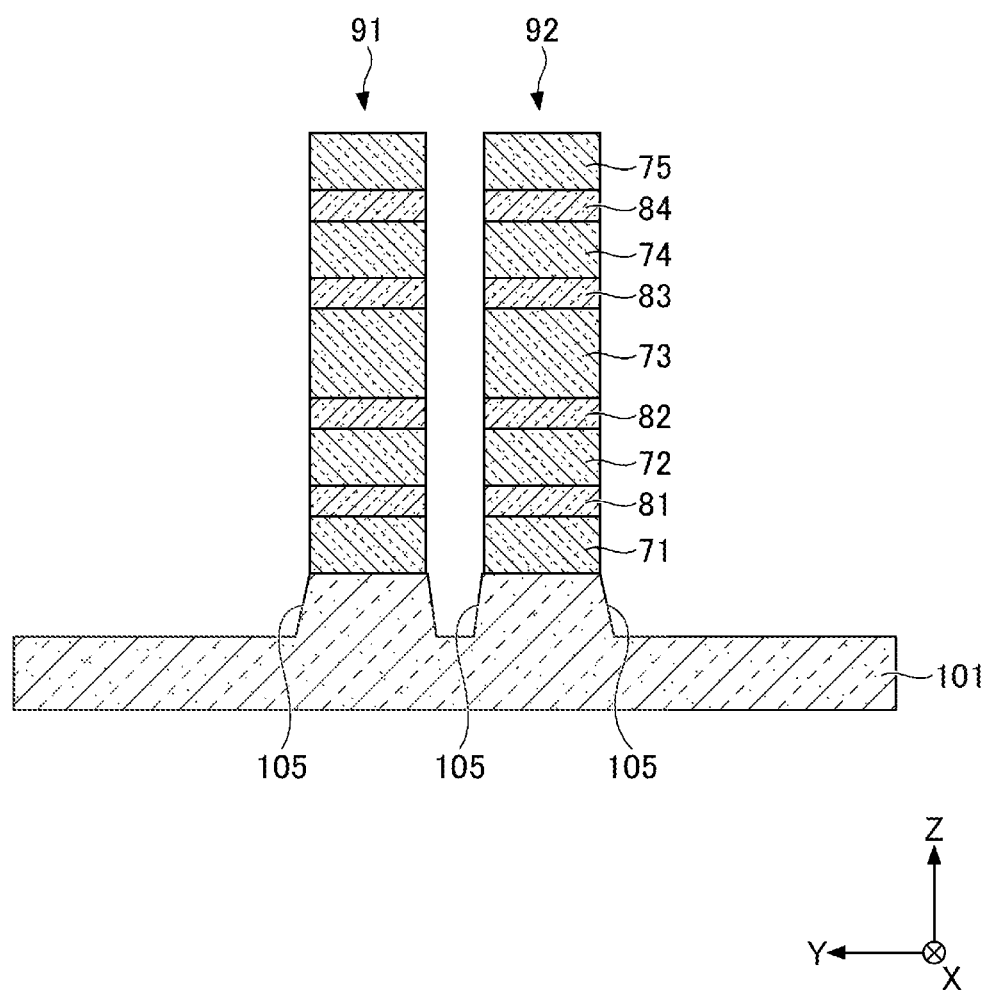

Next, as depicted in FIGS. 10 and 26, a lamination of the SiGe films 71 to 75 and the Si films 81 to 84 is etched and patterned into plate shapes protruding from the substrate 101. By this patterning process, fins 91 and 92 extending in the Y direction are formed for the regions 10 and 20, respectively. The fins 91 and 92 are provided side by side with respect to the X-direction. Further, trenches 105 for the isolation films 102 are formed on the surface of the substrate 101 on the sides of the fins 91 and 92 in plan view.

Figure 27:
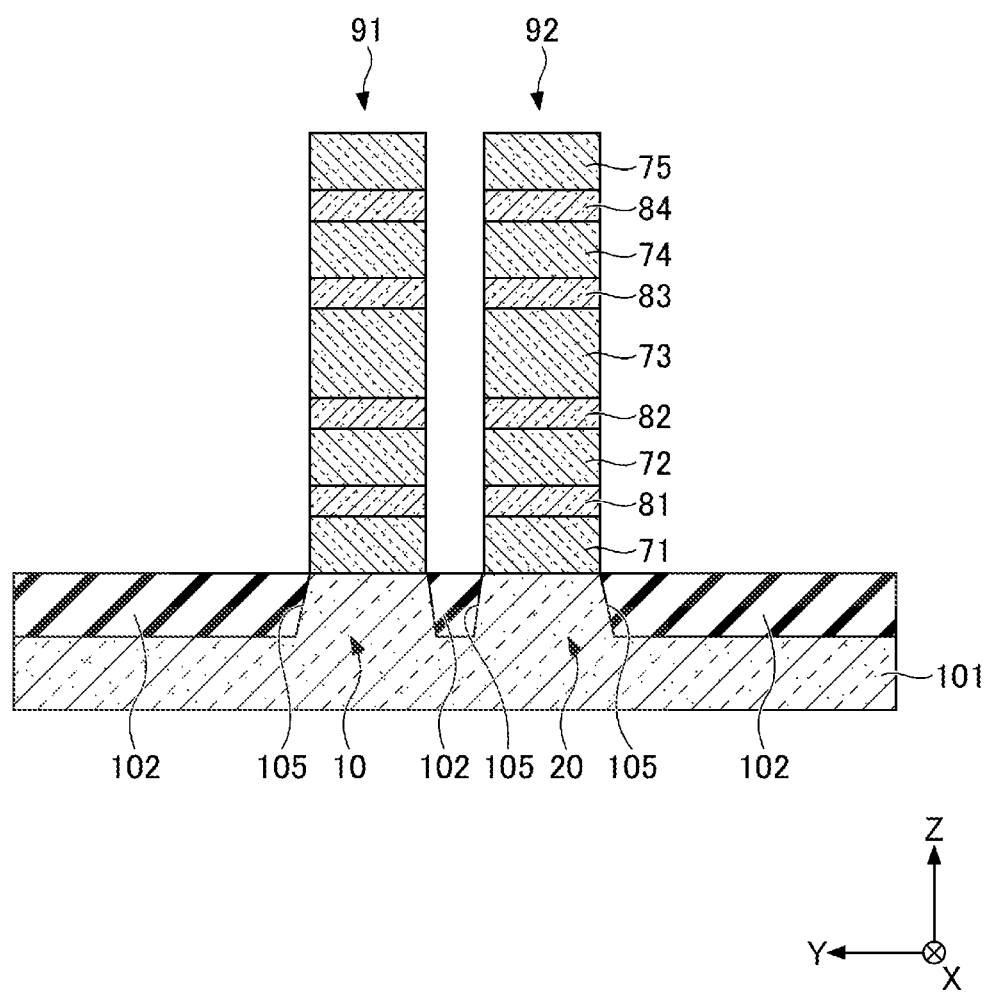

Then, as depicted in FIG. 27, the isolation films 102 are formed in the trenches 105. For example, the two regions 10 and 20 arranged side by side with respect to the X direction are delimited by the isolation films 102.

Figure 28:
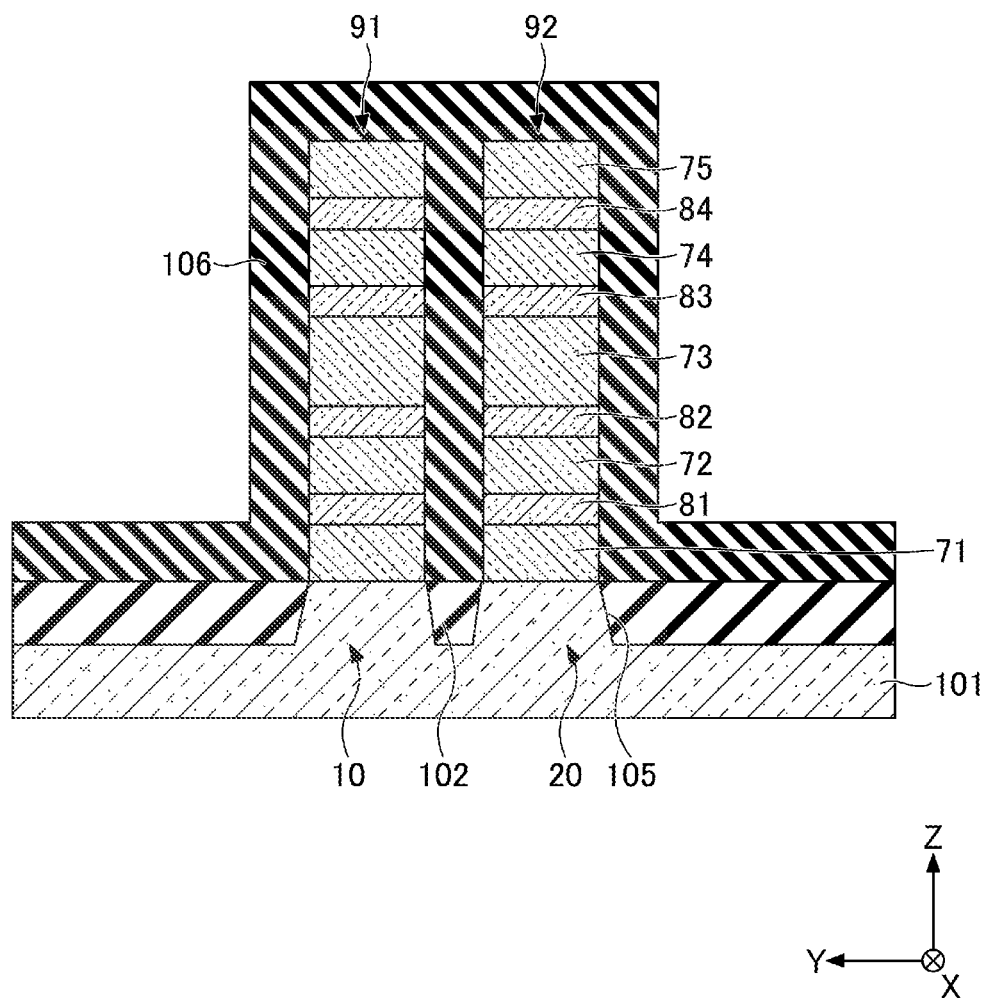

Subsequently, as depicted in FIG. 28, an insulating film 106 is formed to cover the top and side surfaces of the fins 91 and 92 and the top surface of the isolation films 102. The insulating film 106 is formed to fill the gap between the fins 91 and 92.

Figure 11:
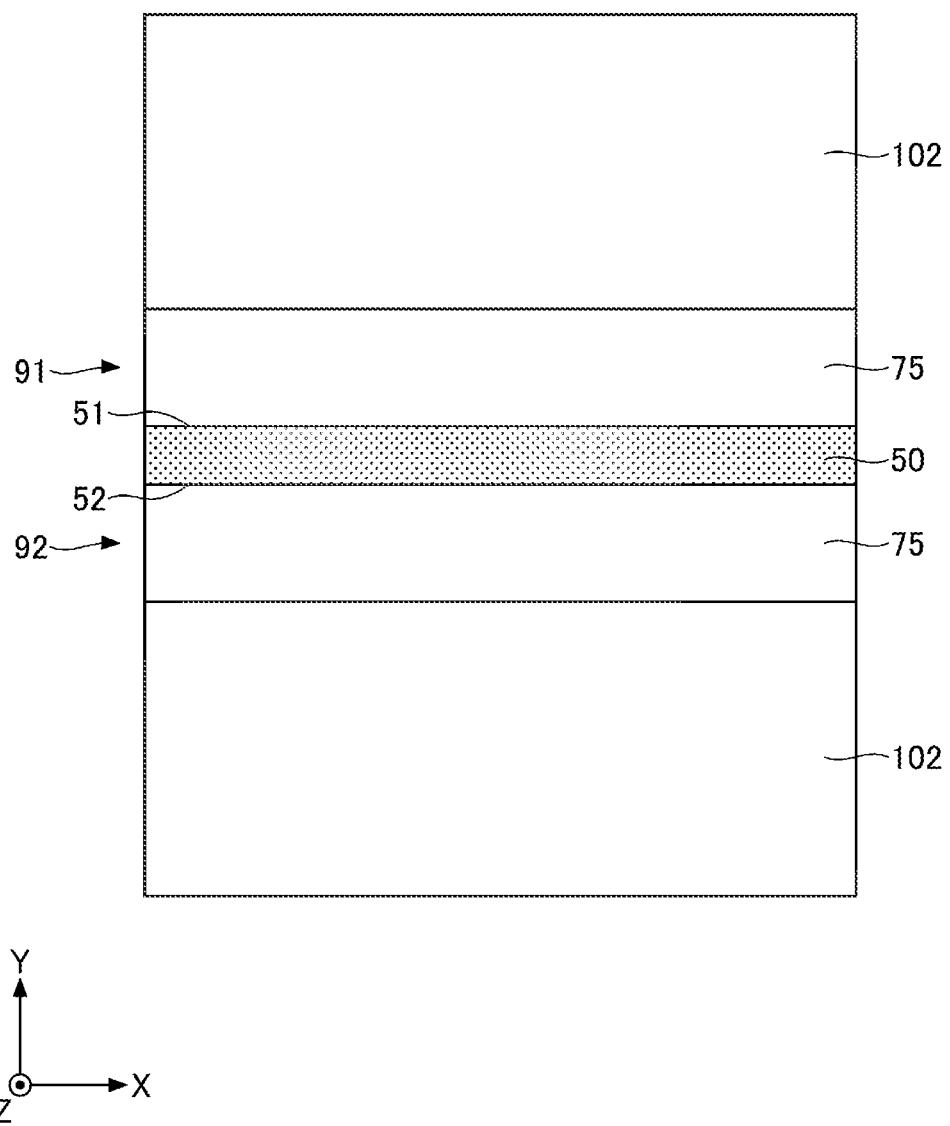
Figure 29:
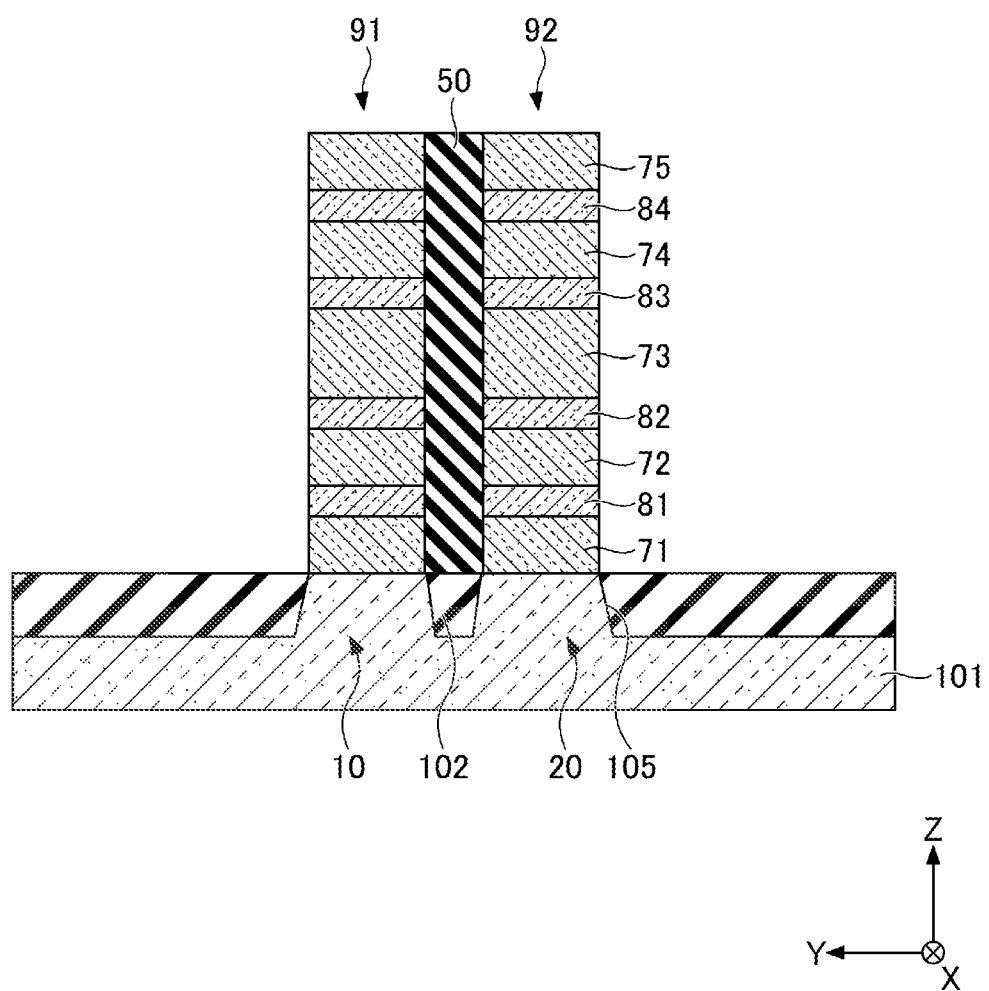

Next, as depicted in FIGS. 11 and 29, the insulating film 106 is etched in such a manner as to remain in the gap between the fins 91 and 92, thereby forming the insulating wall 50. The wall 50 has the side surface 51 in contact with the fin 91 and the side surface 52 in contact with the fin 92. Note that the insulating film 106 may be formed before the isolation film 102 is formed; the insulating film 106 may be etched in such a manner as to remain in the gap between the fins 91 and 92; and then, the isolation film 102 may be formed. In this case, instead of the isolation film 102, the wall 50 is formed in the trench 105 between the fins 91 and 92. In addition, the isolation film 102 and the insulating film 106 may be formed at a time, and then, the insulating film 106 may be etched in such a manner as to remain in the gap between the fins 91 and 92.

Figure 12:
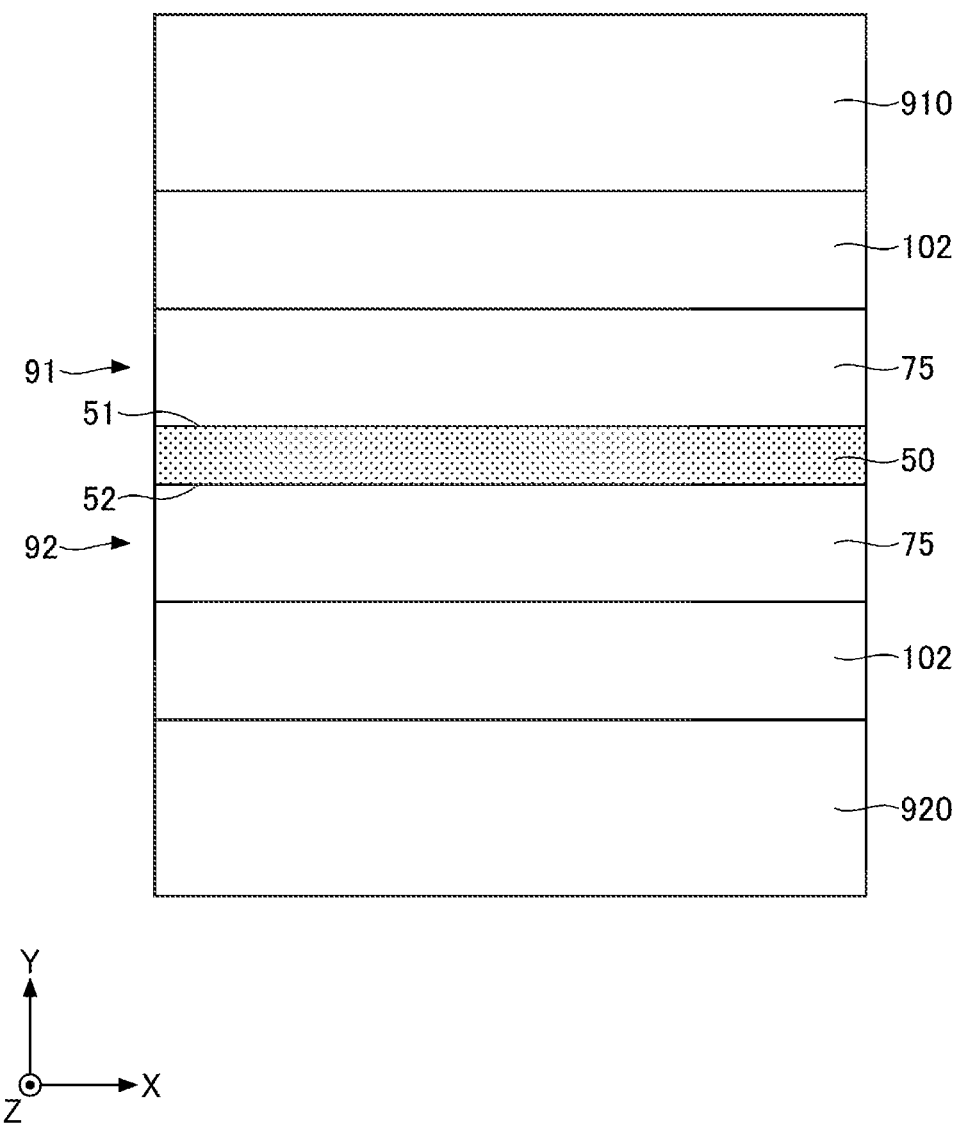
Figure 30:
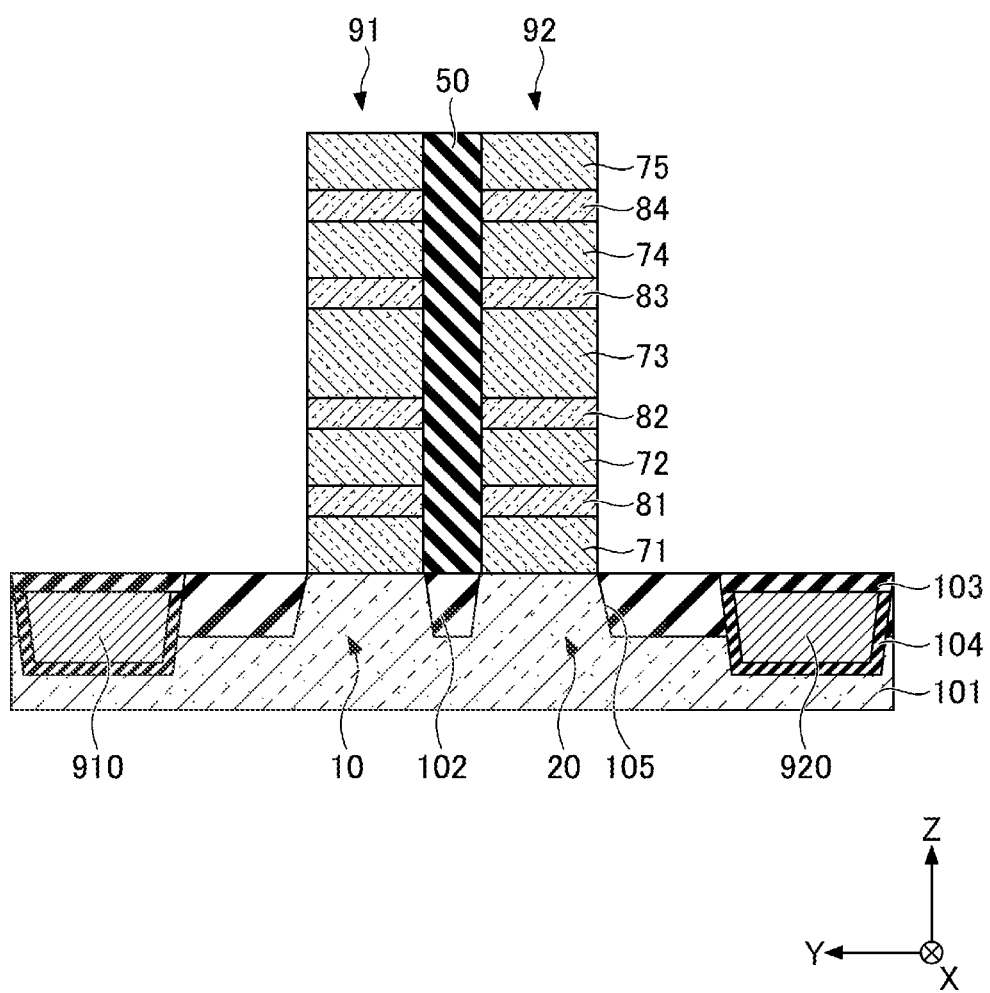

Thereafter, as depicted in FIGS. 12 and 30, a plurality of trenches for the power supply lines 910 and 920 extending in the X direction are formed in the isolation films 102 and the substrate 101, and insulating films 104 are formed along the bottom and side surfaces of these trenches. Then, the power supply lines 910 and 920 are formed on the insulating films 104, and insulating films 103 are formed on the power supply lines 910 and 920. The formation of the trenches, the formation of the insulating films 104, the formation of the power supply lines 910 and 920, and the formation of the insulating films 103 may be performed before the formation of the wall 50.

Figure 13:
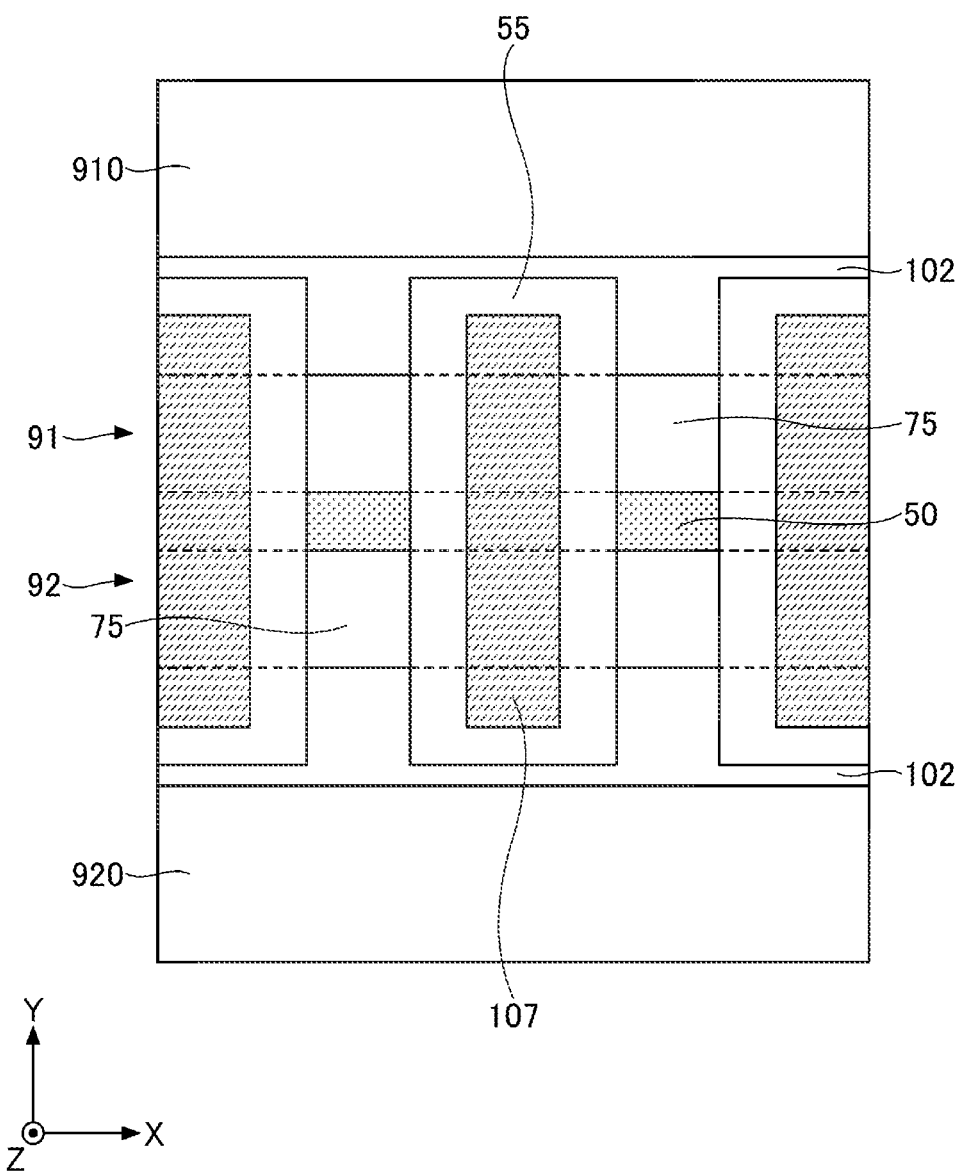
Figure 14:
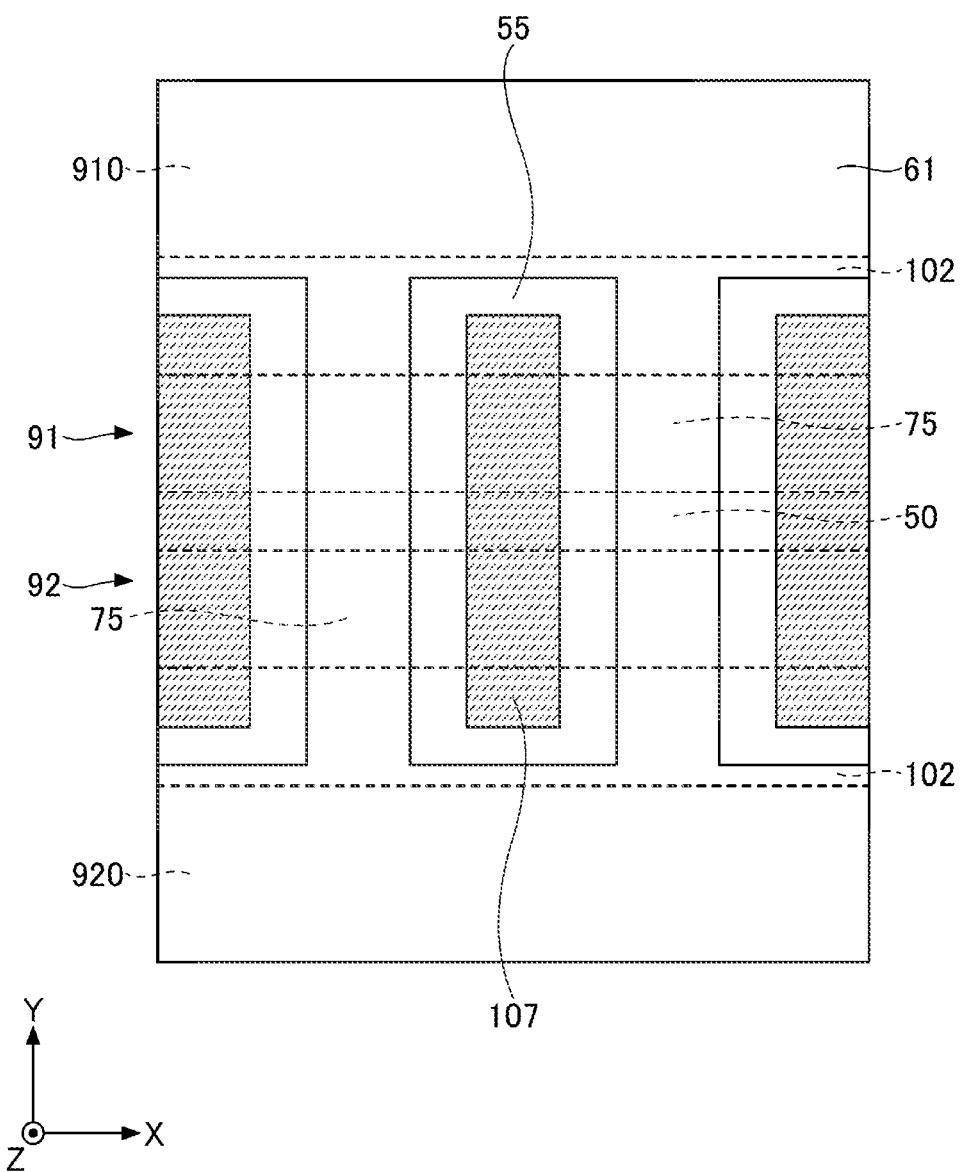
Figure 31:
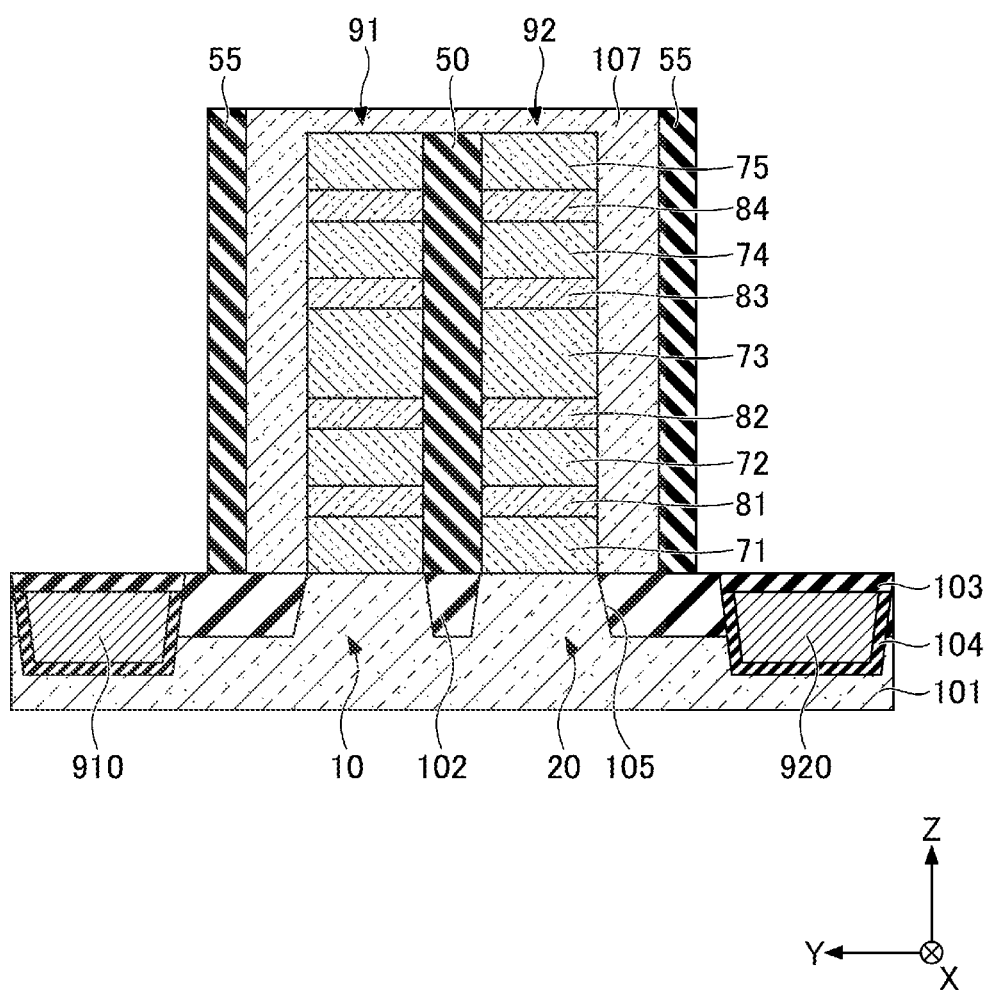
Figure 32:
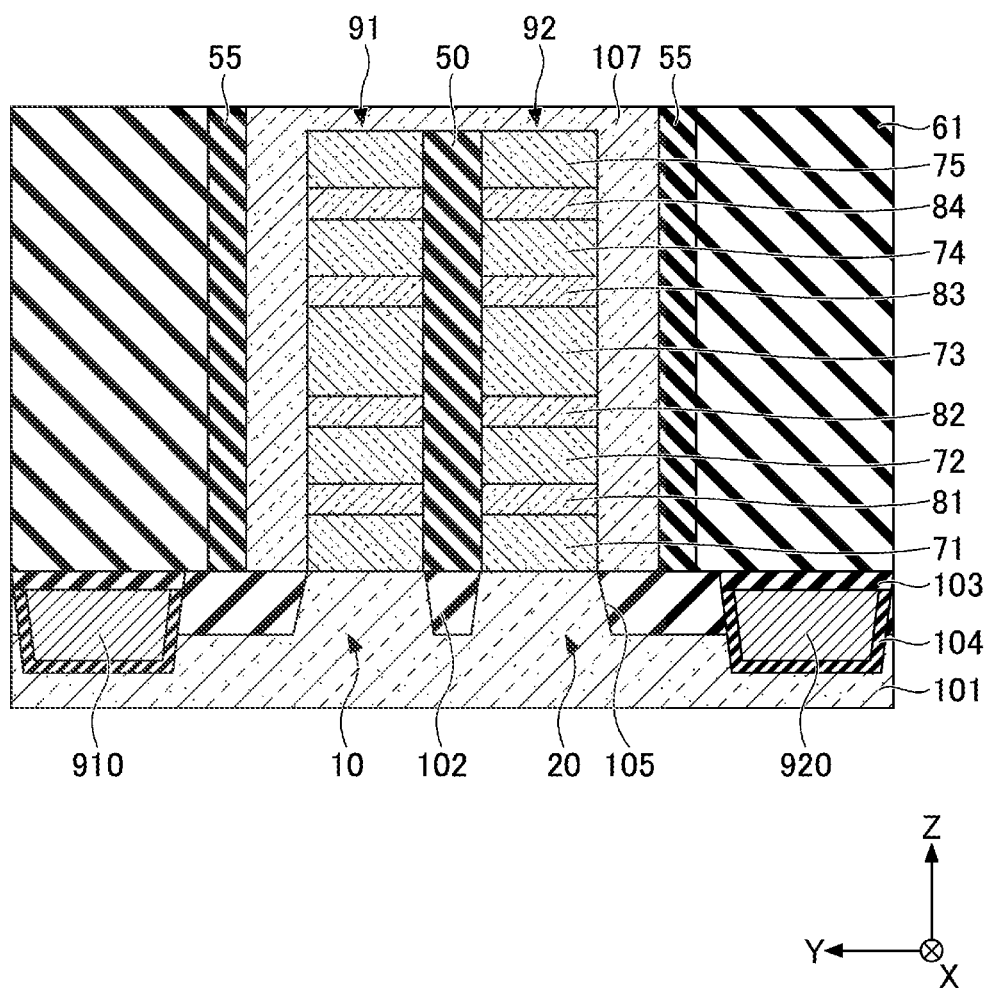
Figure 50:
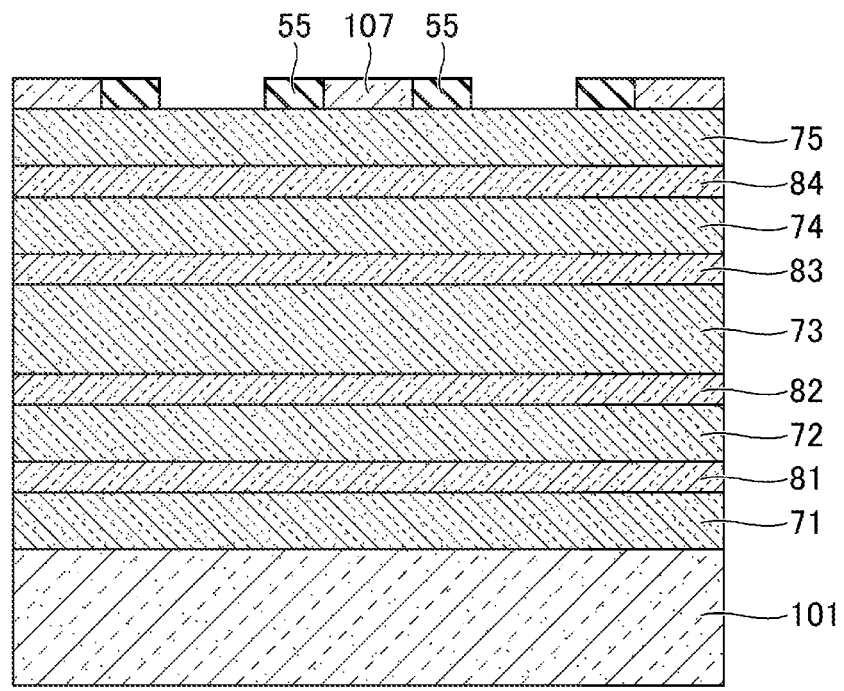
Figure 51:
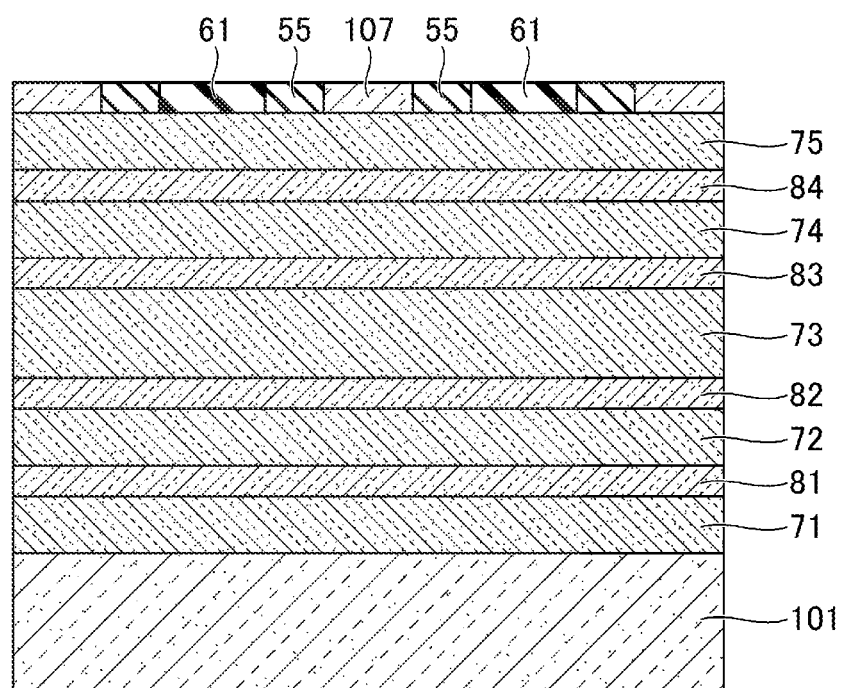
Figure 51:
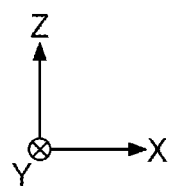

Subsequently, as depicted in FIGS. 13, 31, and 50, sacrificial gates 107 and side walls 55 are formed. The sacrificial gates 107 are, for example, polycrystalline silicon films. The side walls 55 can be formed by, for example, forming insulating films and performing etching back thereon.

Next, as depicted in FIGS. 14, 32, 38, and 51, an insulating film 61 is formed. In the formation of the insulating film 61, for example, a silicon oxide film is formed, and an upper surface of the silicon oxide film is polished by chemical mechanical polishing (CMP) until the sacrificial gates 107 and the side walls 55 are exposed.

Figure 15:
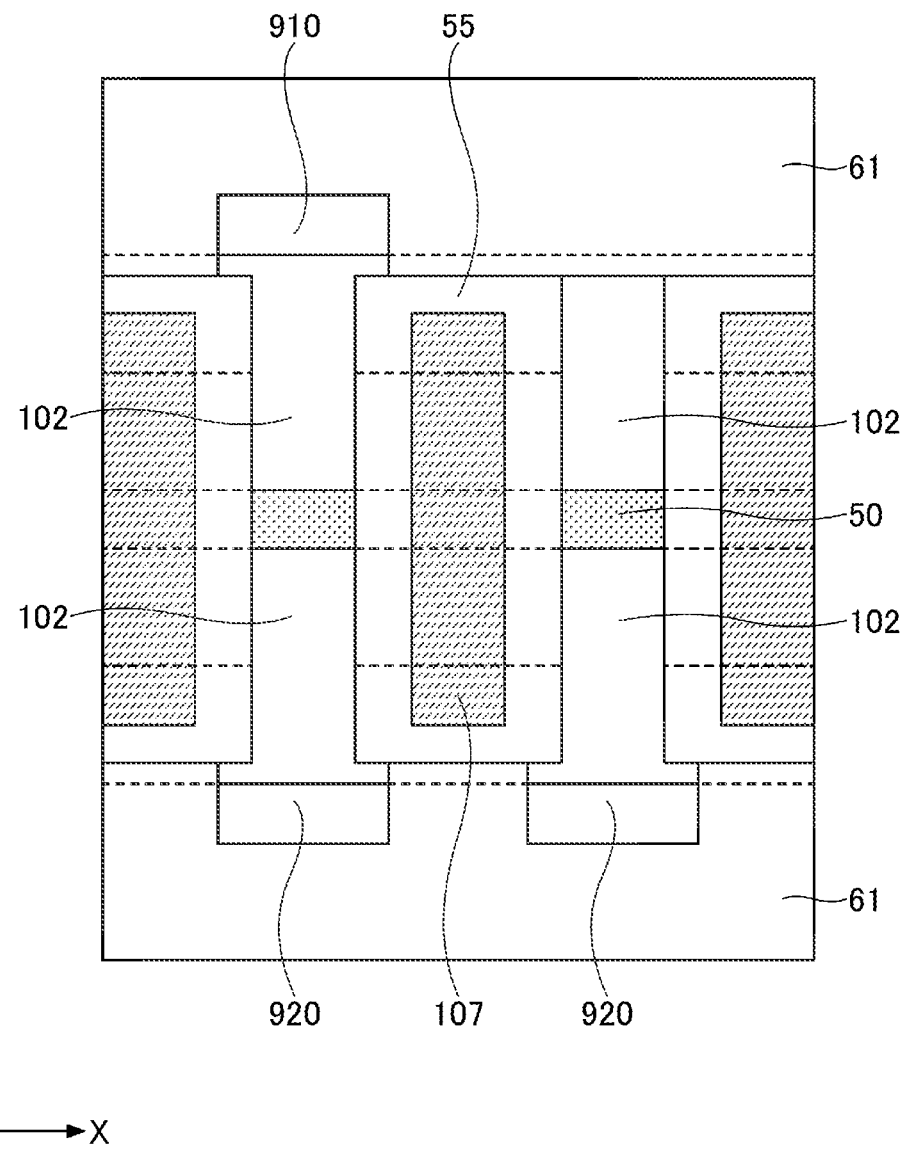
Figure 39:
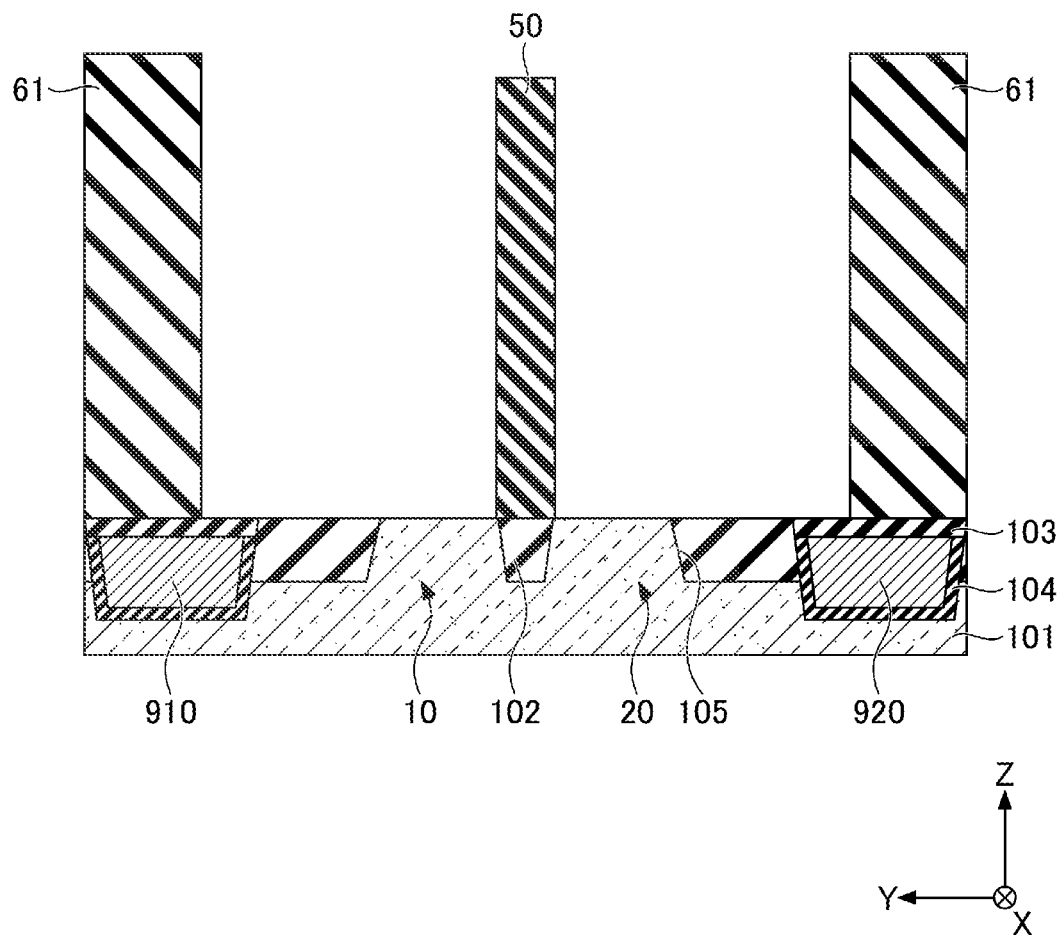
Figure 52:
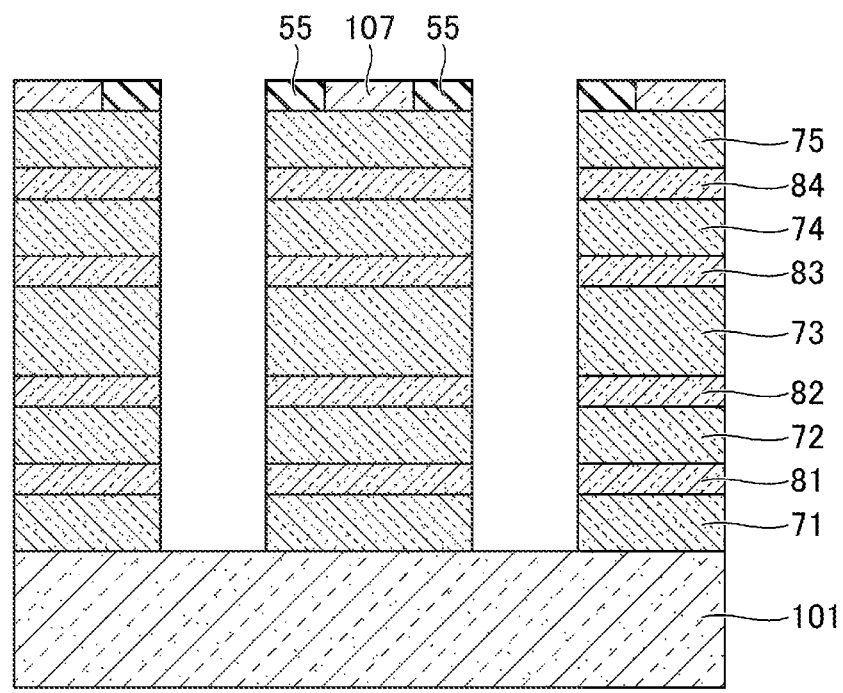
Figure 52:
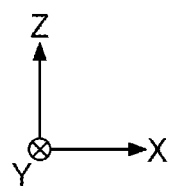

Thereafter, as depicted in FIGS. 15, 39, and 52, the insulating film 61 is selectively removed in regions where the gate electrodes and the local wirings are to be formed, and portions of the fins 91 and 92 exposed without being covered by the sacrificial gates 107 and the side walls 55 are removed.

Figure 53:
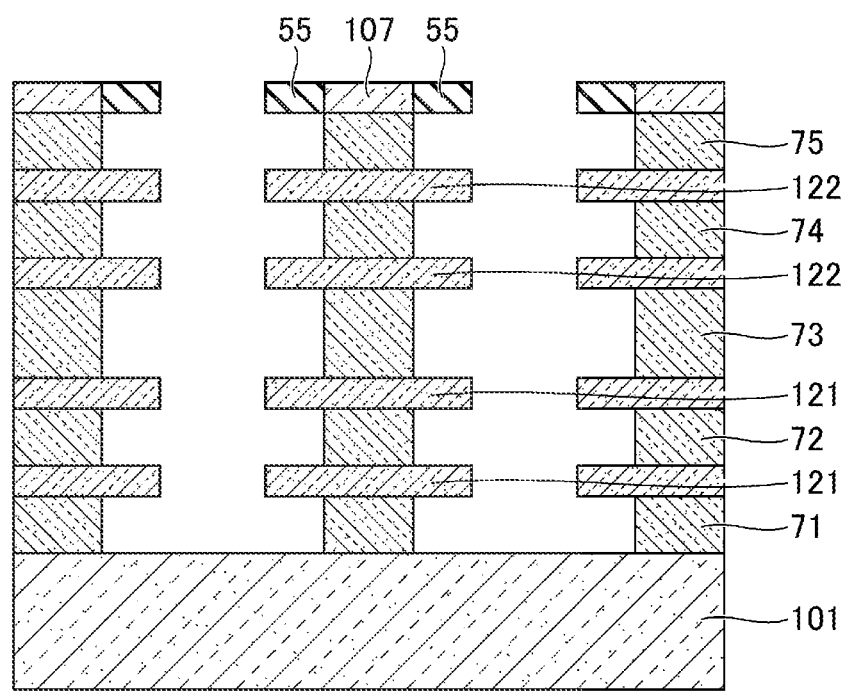

Subsequently, as depicted in FIG. 53, both ends of the SiGe films 71 to 75 are caused to recede in the X direction by isotropic etching. Portions of the Si films 81 and 82 in the fin 91 are used as the nanosheets 121, portions of the Si films 81 and 82 in the fin 92 are used as the nanosheets 221, portions of the Si films 83 and 84 in the fin 91 are used as the nanosheets 122, and portions of the Si films 83 and 84 in the fin 92 are used as the nanosheets 222.

Figure 54:
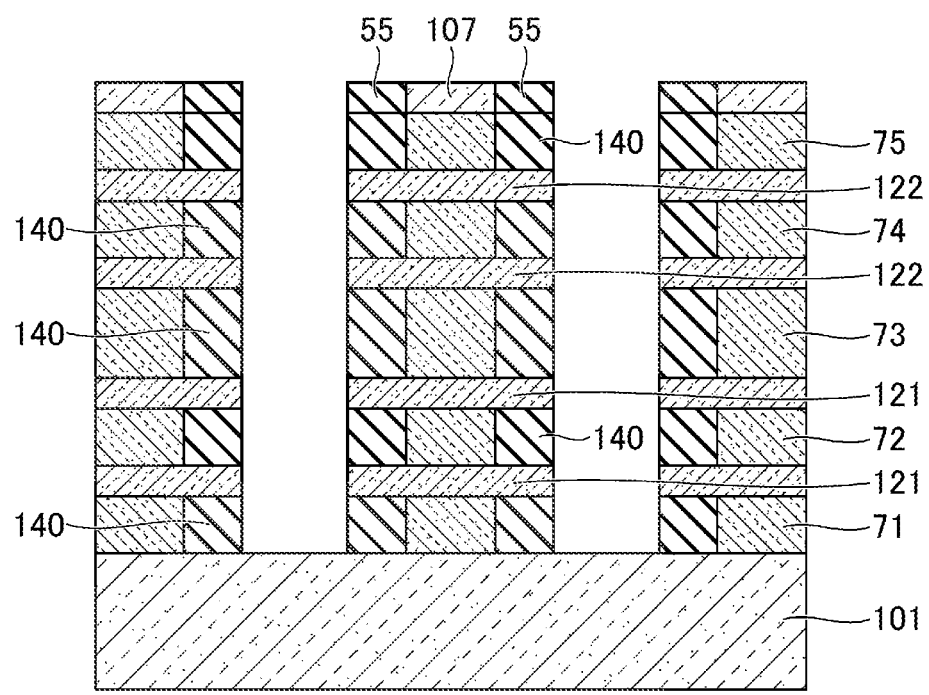

Next, as depicted in FIG. 54, the spacers 140 are formed at portions where the SiGe films 71 to 75 have thus receded.

Figure 16:
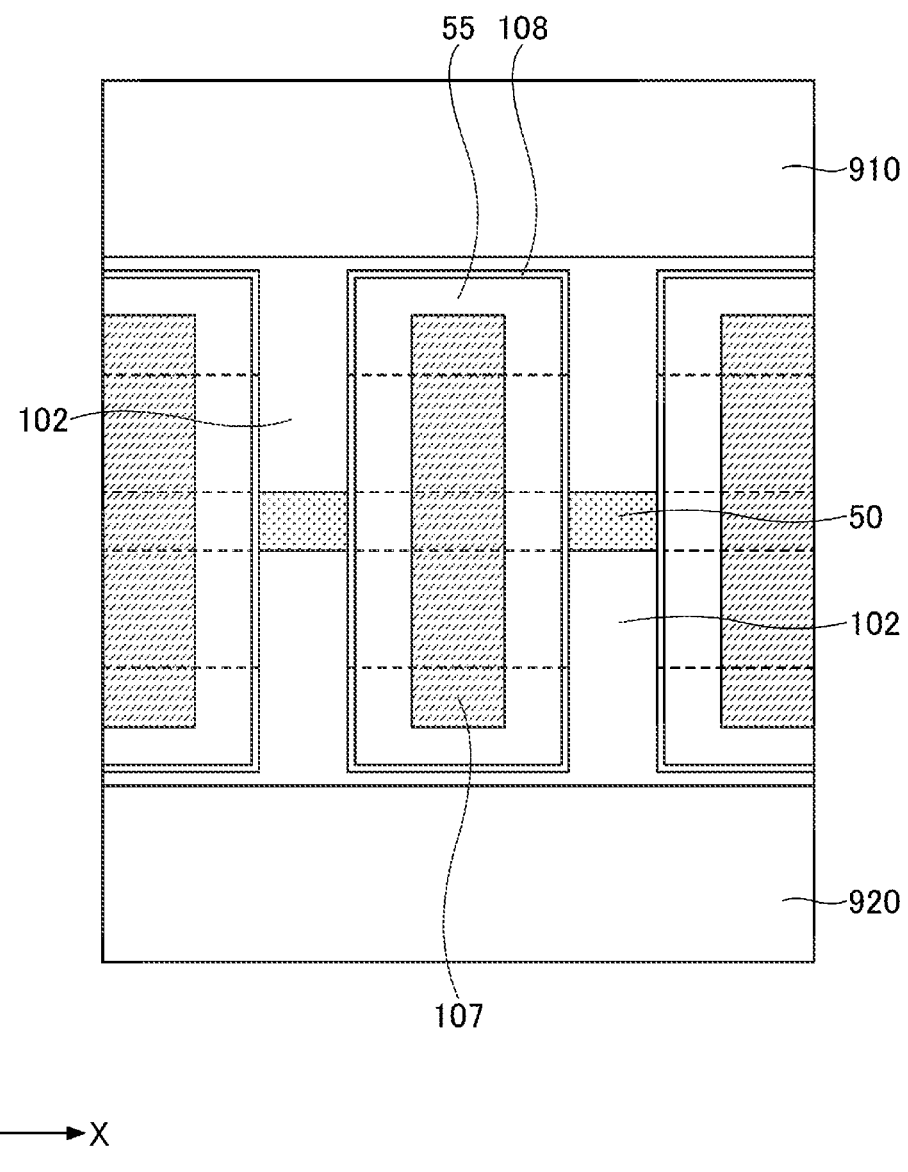
Figure 55:
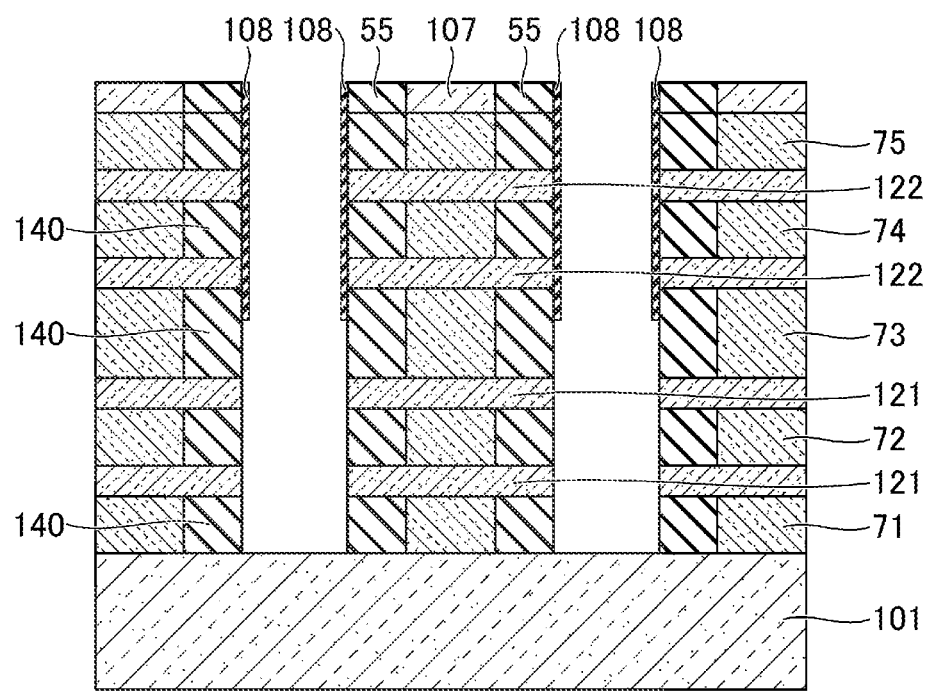

Thereafter, as depicted in FIGS. 16 and 55, cover films 108 are formed in such a manner as to cover both end surfaces of the nanosheets 122 and 222 with respect to the X direction.

Figure 17:
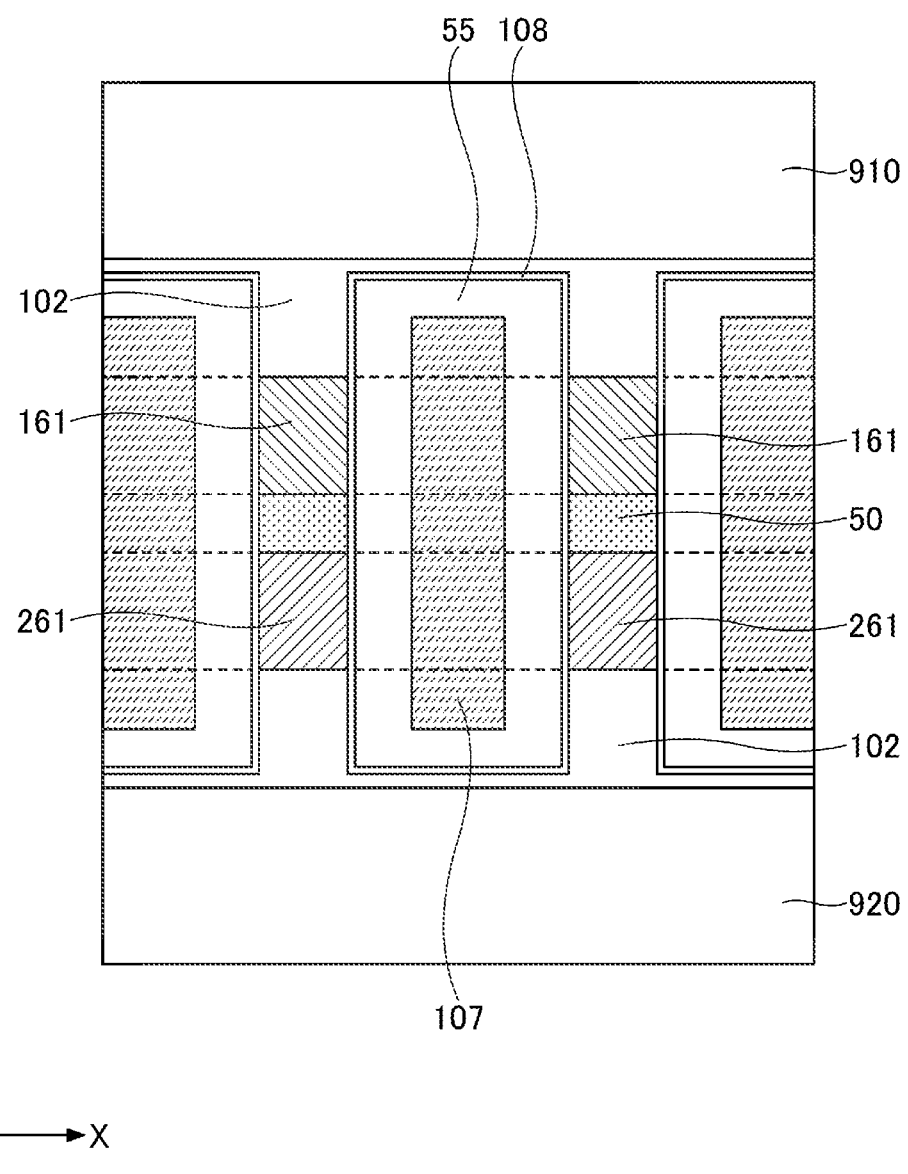
Figure 18:
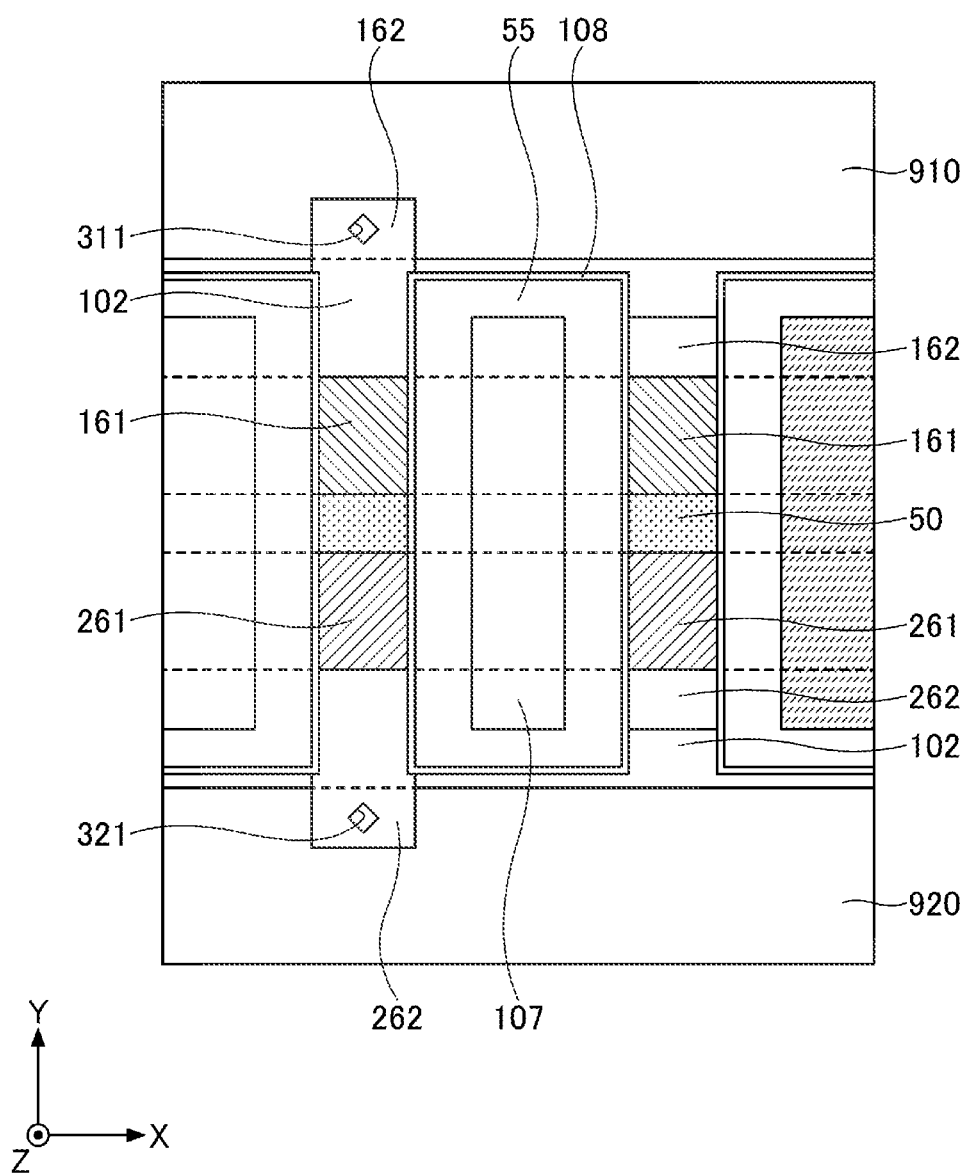
Figure 19:
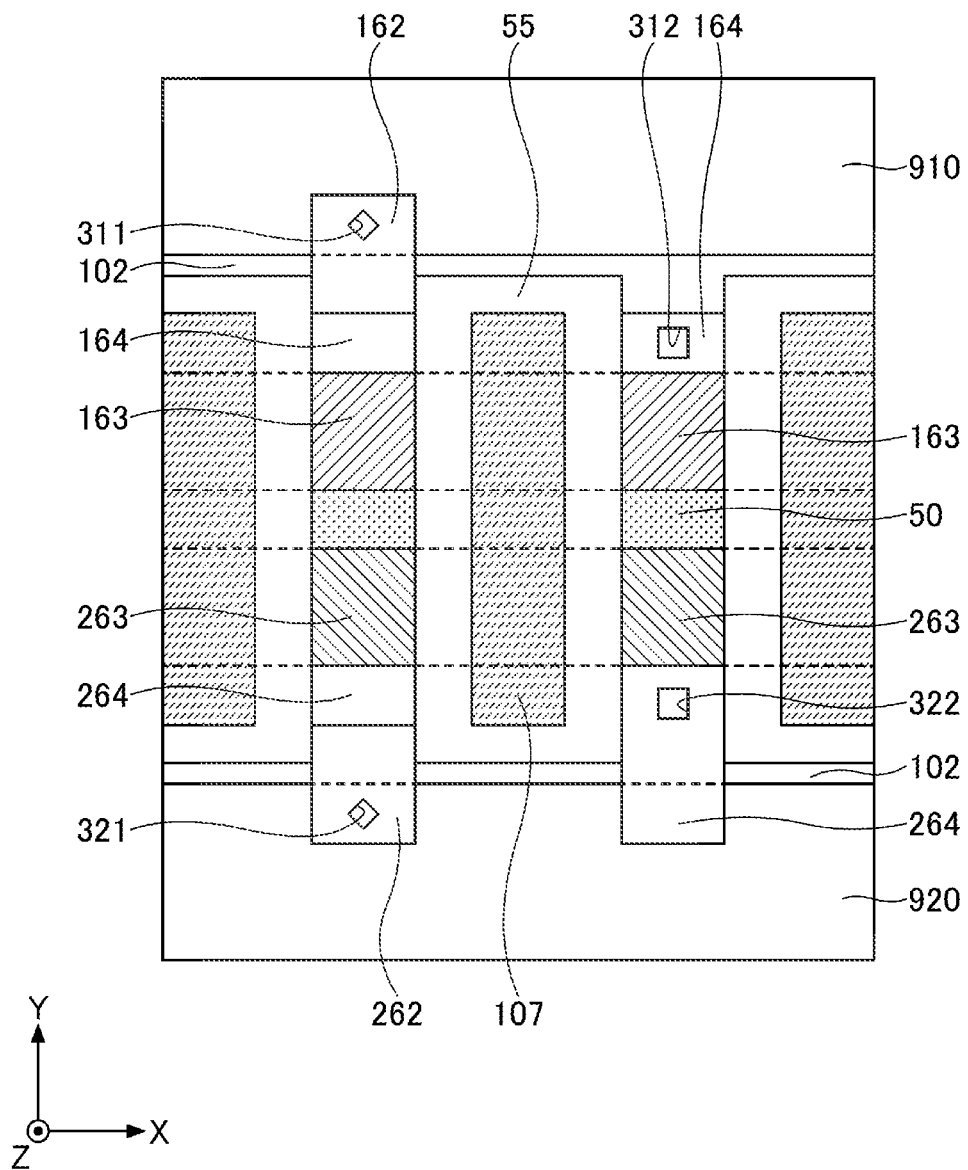
Figure 40:
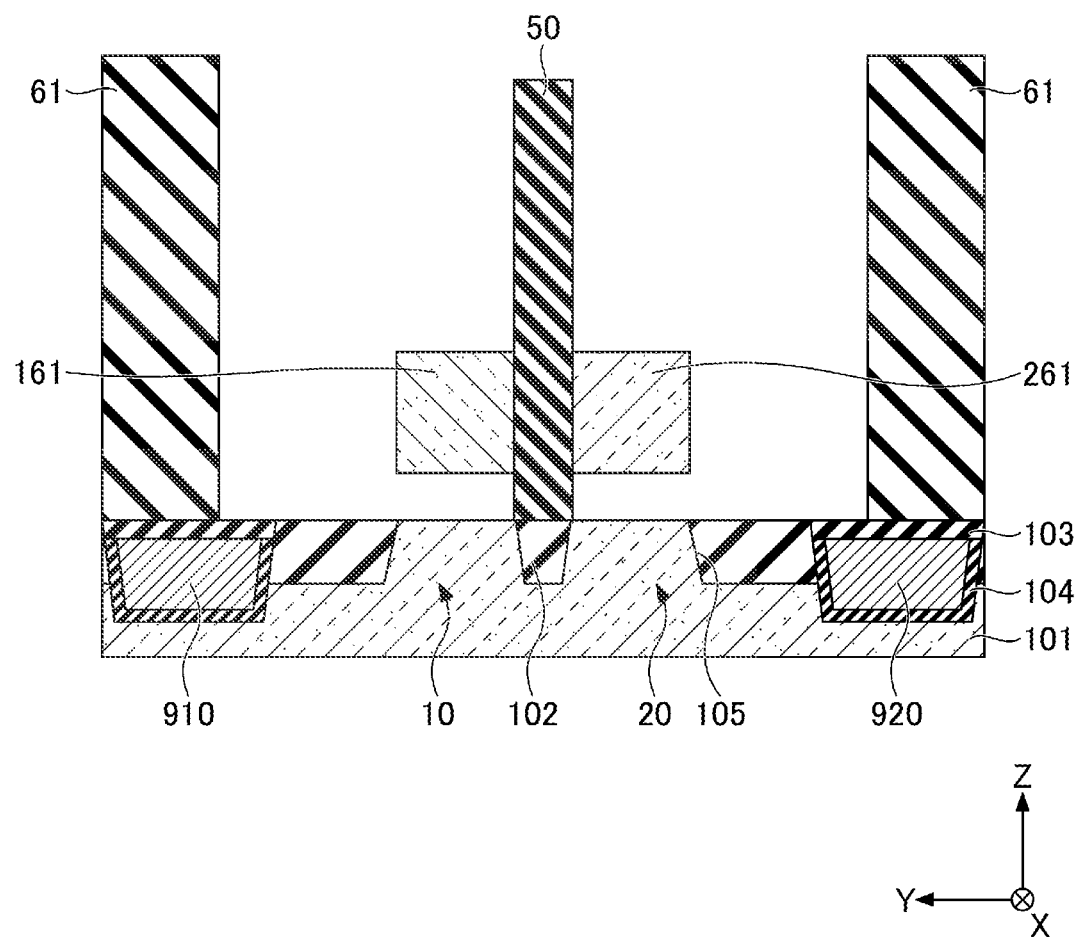
Figure 41:
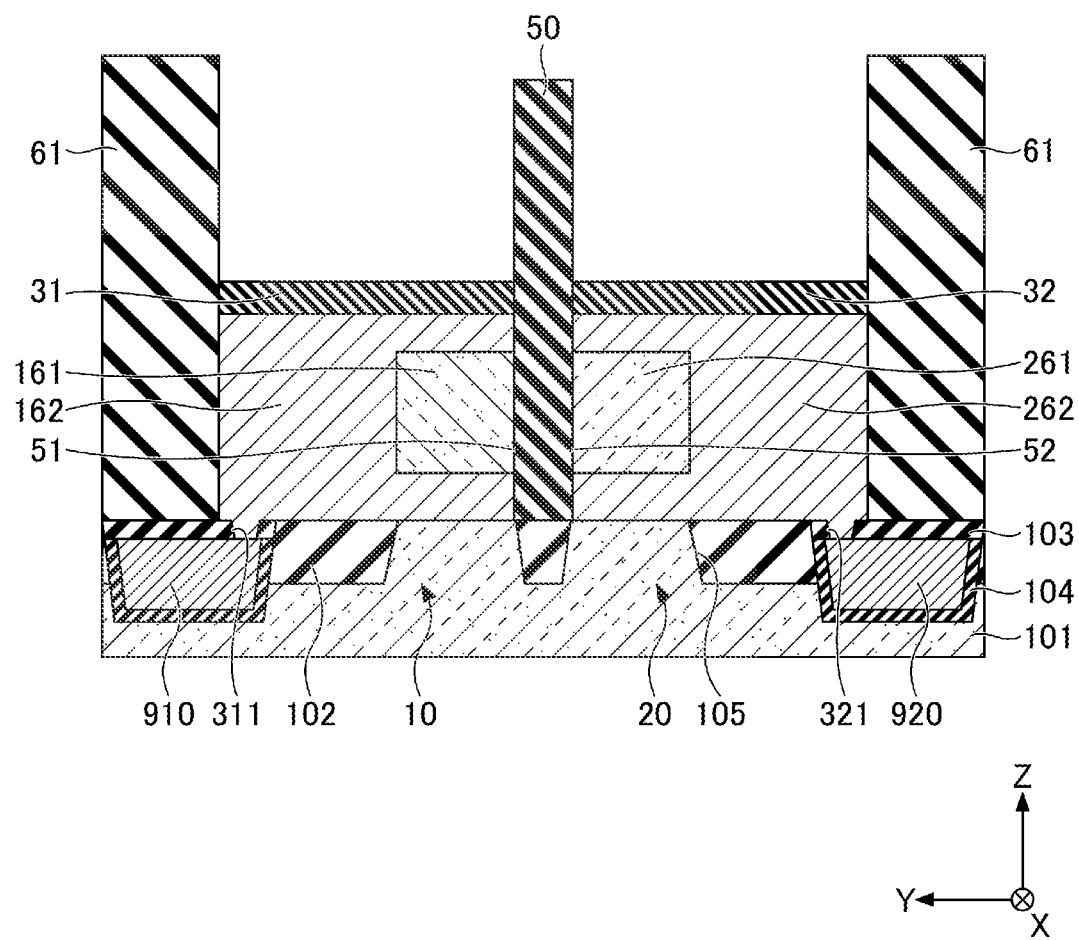
Figure 42:
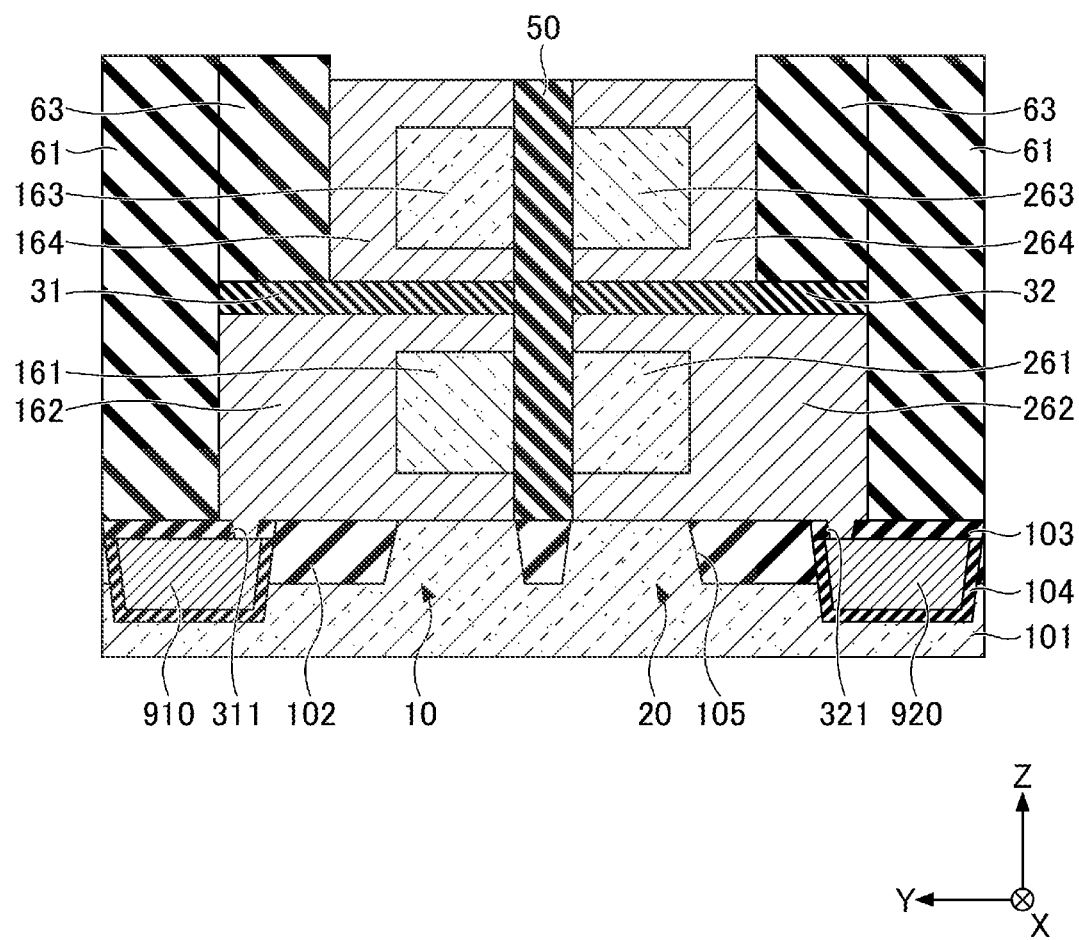
Figure 43:
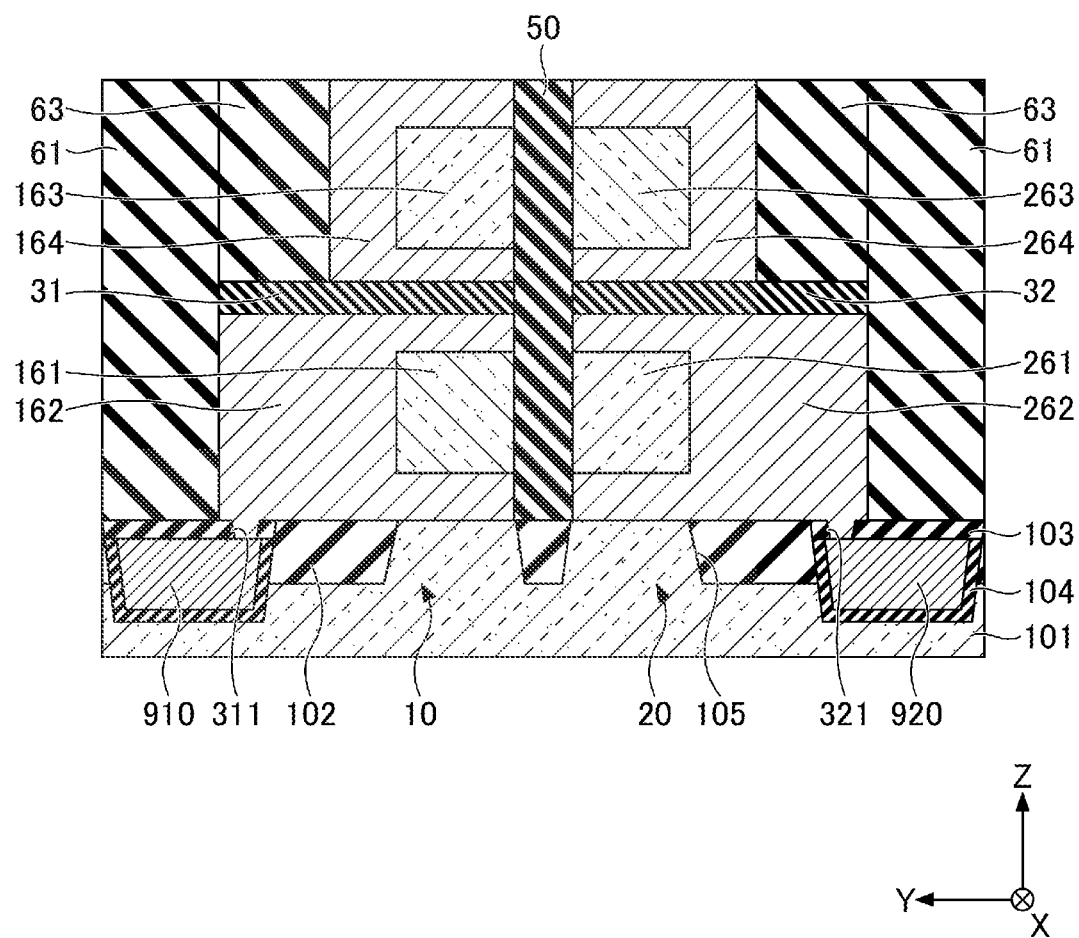
Figure 44:
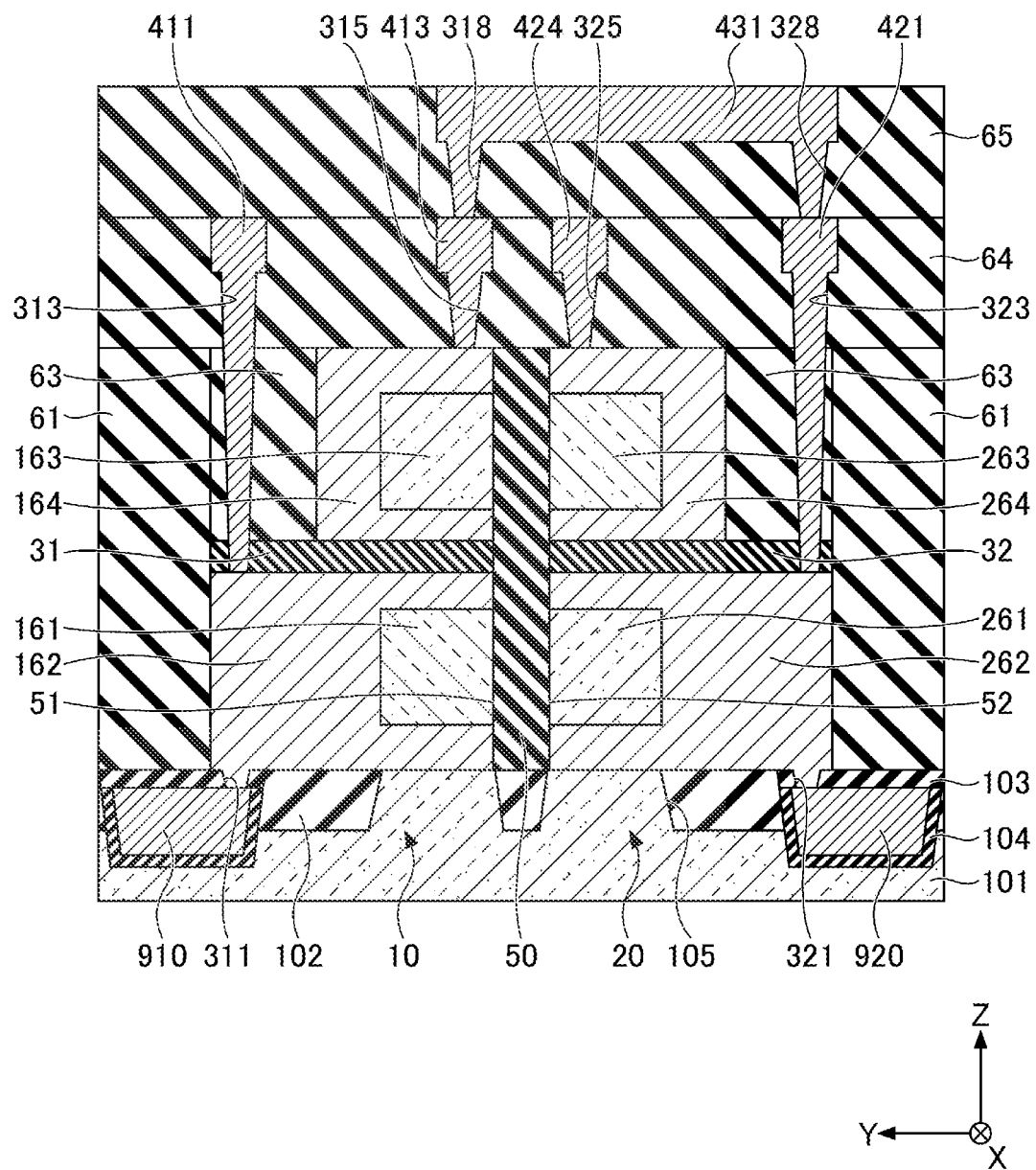
Figure 45:
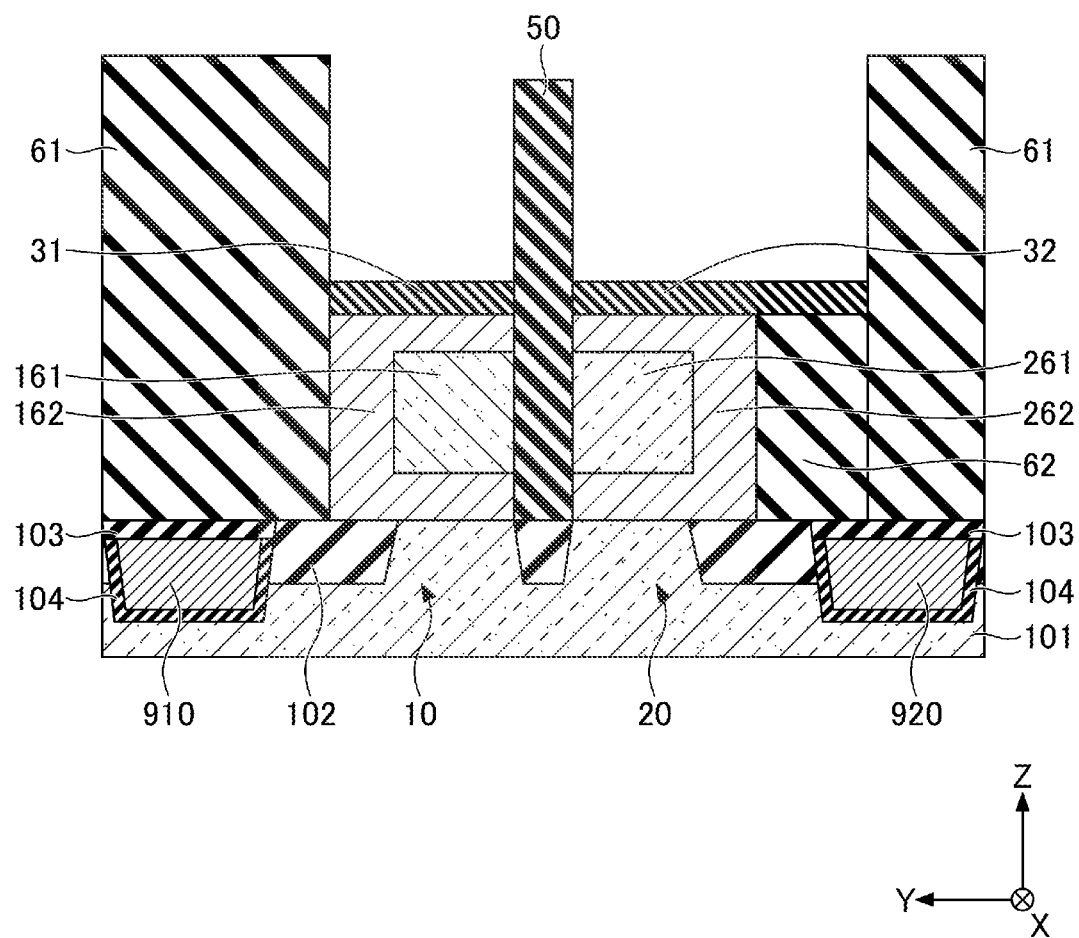
Figure 46:
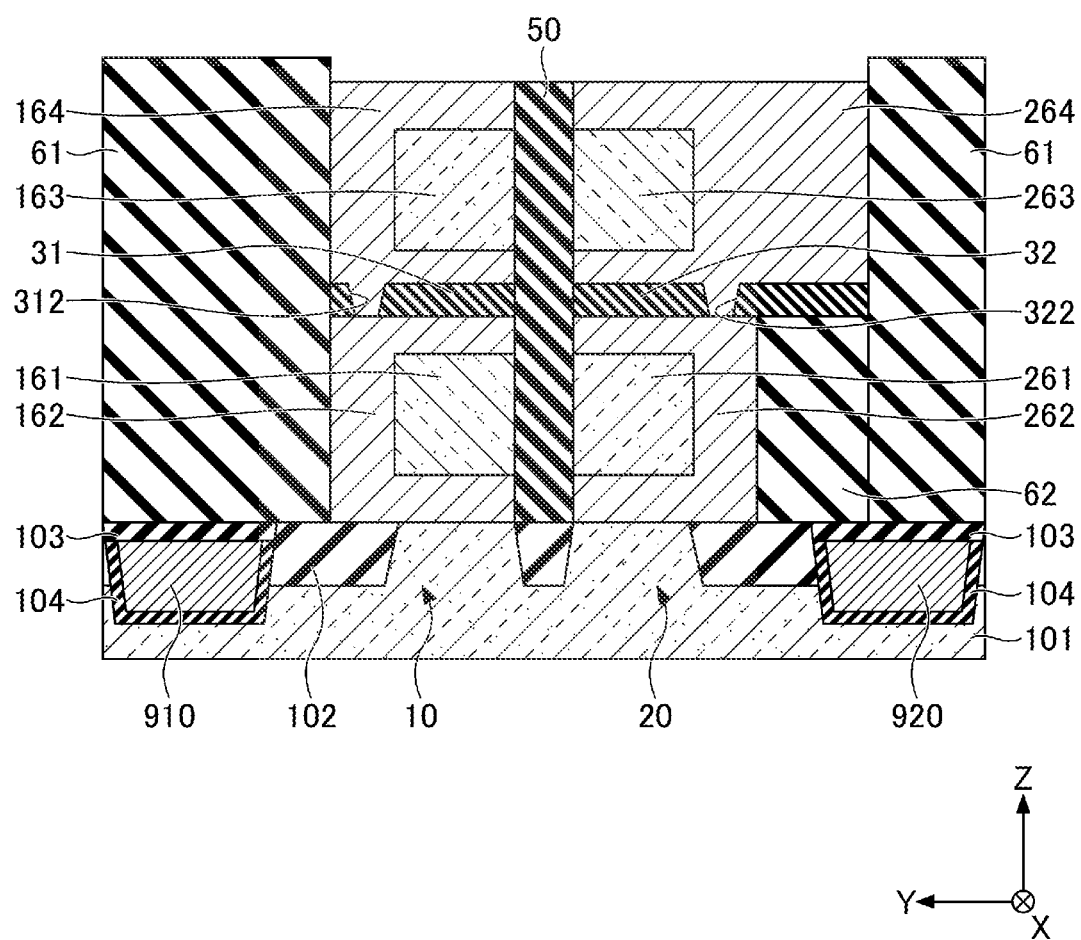
Figure 47:
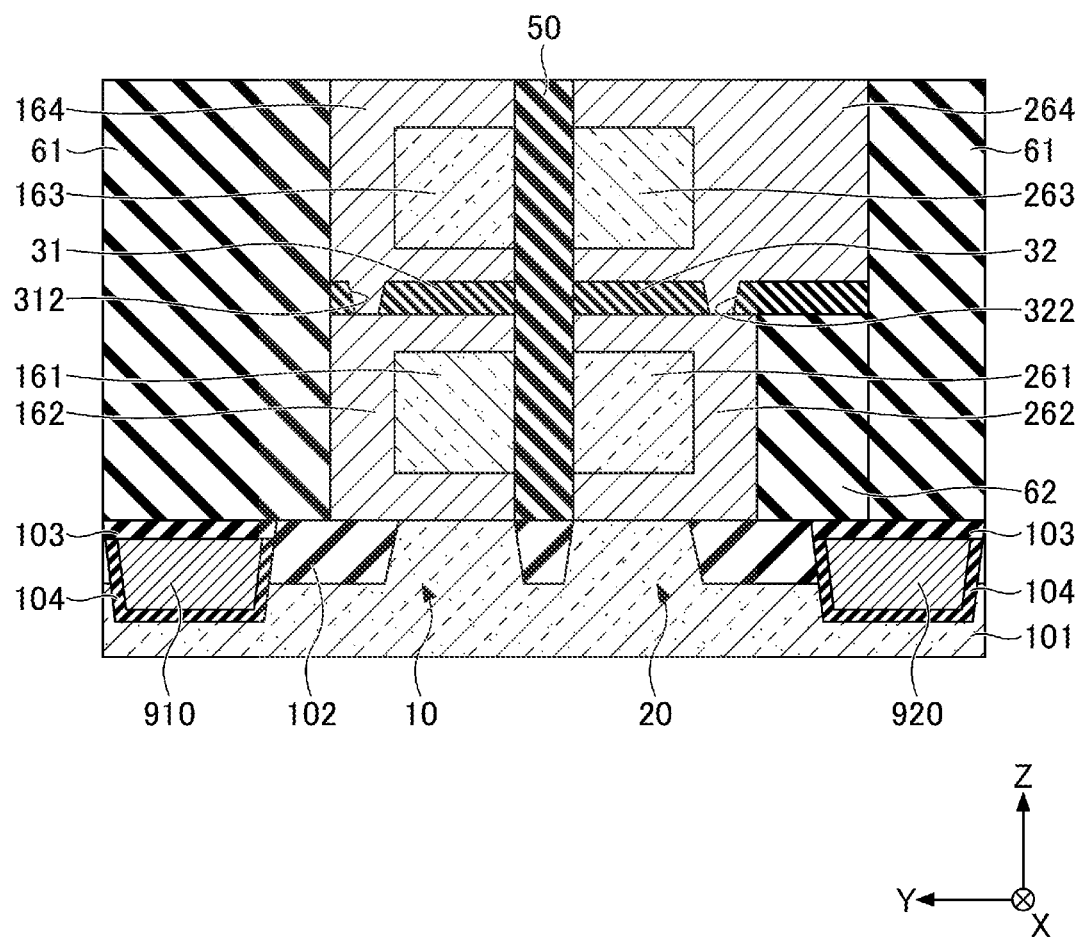
Figure 48:
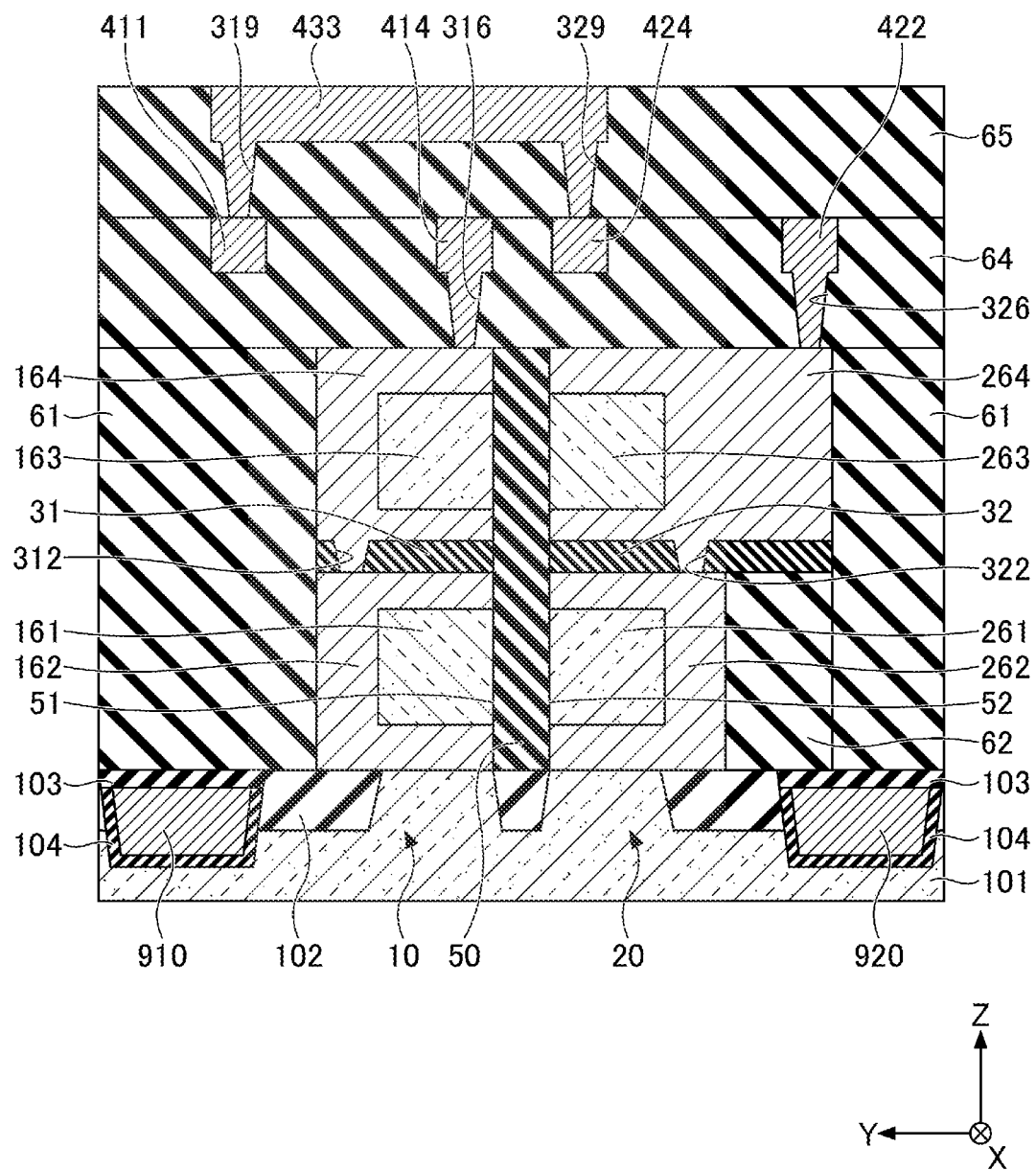
Figure 56:
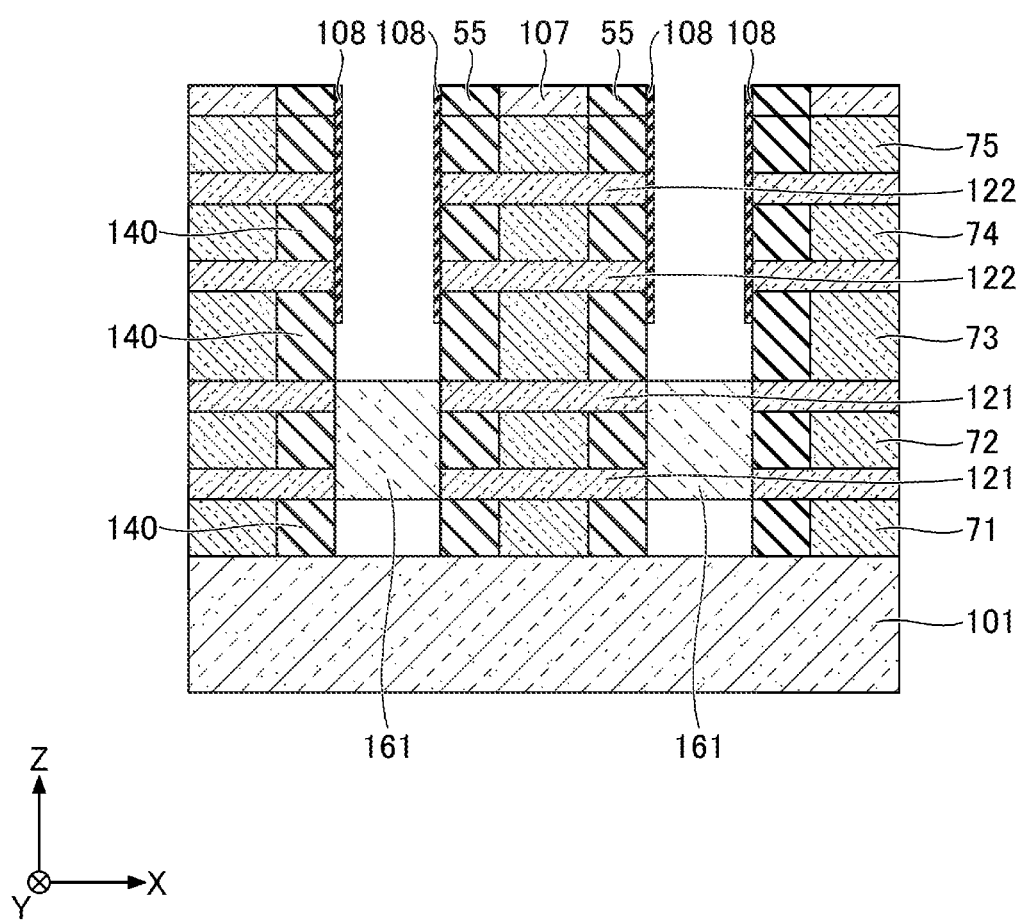
Figure 57:
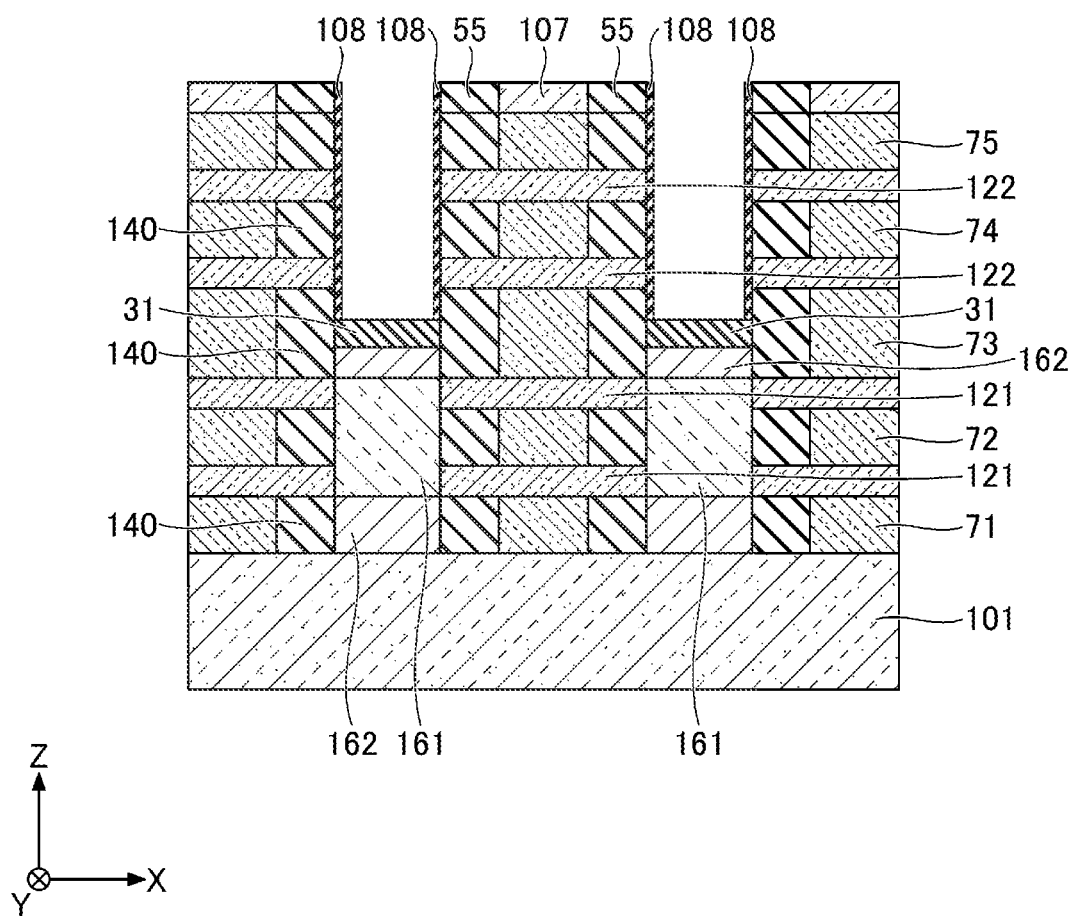
Figure 58:
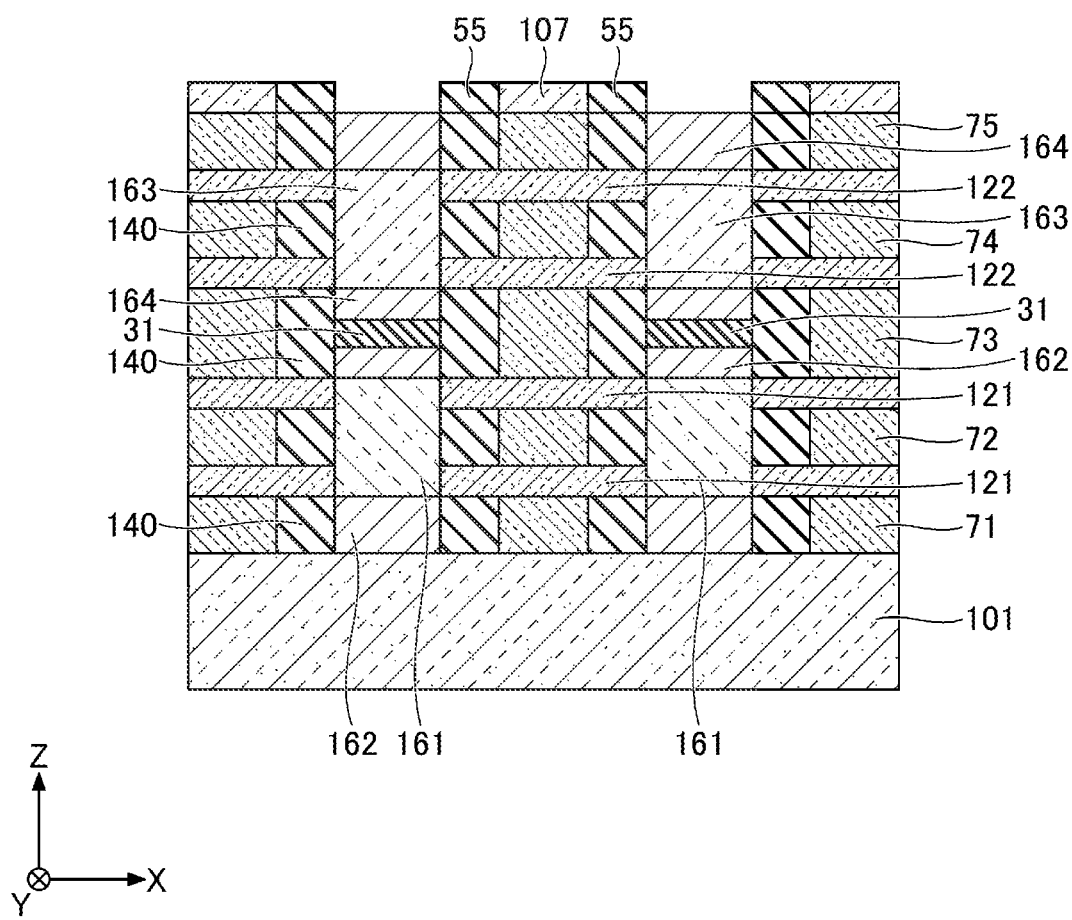

Subsequently, as depicted in FIGS. 17, 40, and 56, the n-type semiconductor layers 161 are caused to epitaxially grow on the side surfaces of the nanosheets 121, and the p-type semiconductor layers 261 are caused to epitaxially grow on the side surfaces of the nanosheets 221. For example, phosphorus (P) is introduced as an n-type impurity into the n-type semiconductor layers 161 using phosphine ($PH_3$), and boron (B) is introduced as a p-type impurity into the p-type semiconductor layers 261 using diborane ($B_2H_6$). Either the n-type semiconductor layers 161 or the p-type semiconductor layers 261 may be formed first. It is preferable that the cover films 108 are formed also on the side surfaces of either the nanosheets 121 or the nanosheets 221 on which either the n-type semiconductor layers 161 or the p-type semiconductor layers 261 formed later are caused to grow, and are removed from portions on which the semiconductor layers formed later are caused to grow after the growth of the semiconductor layers that are formed earlier.

Next, as depicted in FIGS. 18, 41, 45, and 57, the insulating film 62 is formed, and the two local wirings 162 in contact with the n-type semiconductor layers 161 and the two local wirings 262 in contact with the p-type semiconductor layers 261 are formed. The local wirings 162 and 262 can be formed simultaneously. The local wirings 162 and 262 can be formed by, for example, forming conductive films and performing etching back thereon. Further, the insulating films 31 are formed on the local wirings 162, and the insulating films 32 are formed on the local wirings 262. The insulating films 31 and 32 can be formed simultaneously. Before forming the local wirings 162 and 262, the contact holes 311 and 321 may be formed in the insulating films 103; one of the local wirings 162 may be formed in such a manner as to be in contact with the power supply line 910; and one of the local wirings 262 may be formed in such a manner as to be in contact with the power supply line 920.

Thereafter, as depicted in FIGS. 19, 42, 46, and 58, the cover films 108 are removed, the p-type semiconductor layers 163 are caused to epitaxially grow on the side surfaces of the nanosheets 122, and the n-type semiconductor layers 263 are caused to epitaxially grow on the side surfaces of the nanosheets 222. For example, boron (B) is introduced as a p-type impurity into the p-type semiconductor layers 163 using diborane ($B_2H_6$), and phosphorus (P) is introduced as an n-type impurity into the n-type semiconductor layers 263 using phosphine ($PH_3$). Either the p-type semiconductor layers 163 or the n-type semiconductor layers 263 may be formed first. It is preferable that either the p-type semiconductor layers 163 or the n-type semiconductor layers 263 formed earlier are caused to grow while the cover films 108 are left unremoved on the side surfaces of either the nanosheets 122 or the nanosheets 222 on which either the p-type semiconductor layers 163 or the n-type semiconductor layers 263 formed later are caused to grow; and thereafter, the entirety of the cover films 108 are removed.

Subsequently, the insulating films 63 are formed, and the local wirings 164 in contact with the p-type semiconductor layers 163 and the local wirings 264 in contact with the n-type semiconductor layers 263 are formed. The local wirings 164 and 264 can be formed simultaneously. The local wirings 164 and 264 can be formed by, for example, forming conductive films and performing etching back thereon. Before forming the local wirings 164 and 264, the contact holes 312 and 322 may be formed in the insulating films 31 and 32, respectively, and one of the local wirings 164 may be formed in such a manner as to be in contact with the local wiring 162, and one of the local wirings 264 may be formed in such a manner as to be in contact with the local wiring 262.

Figure 20:
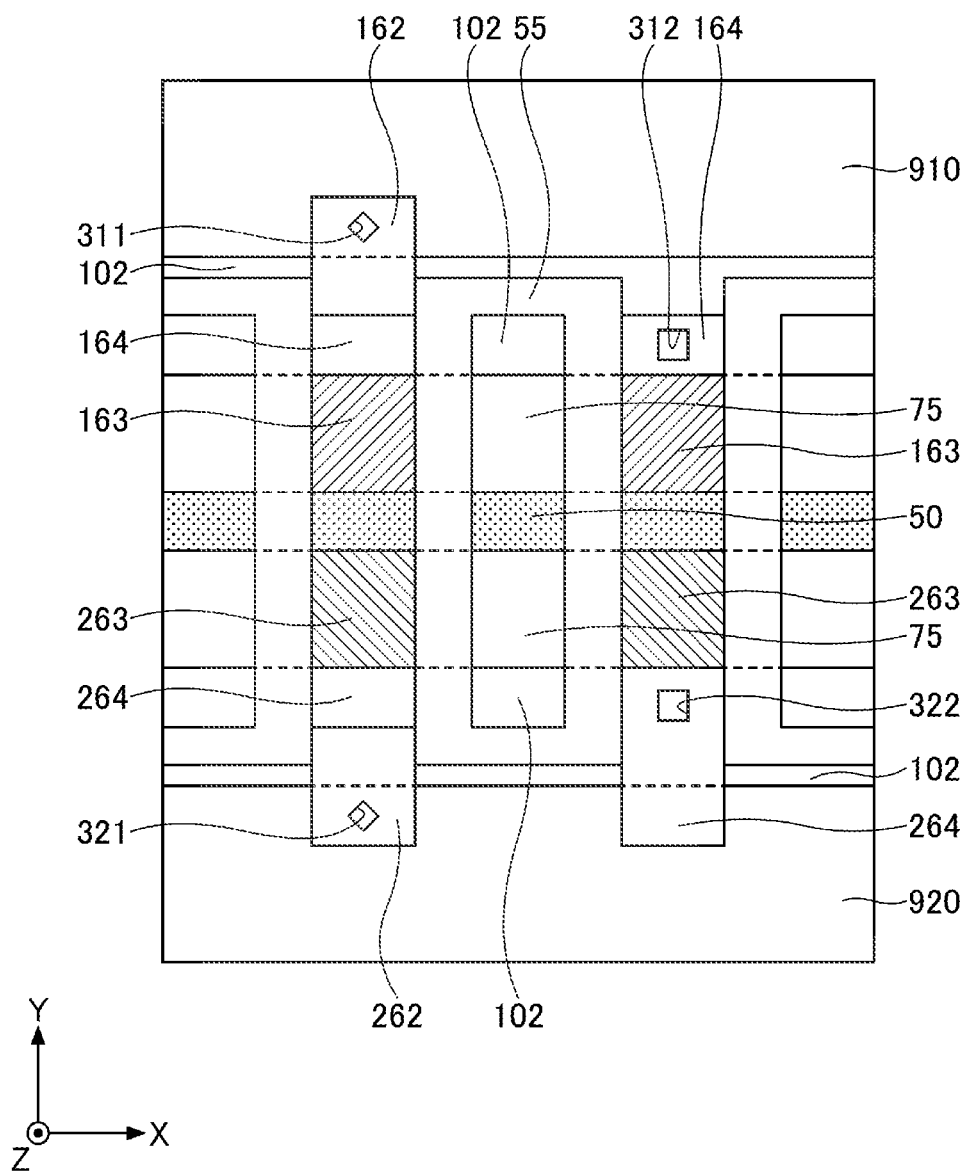
Figure 33:
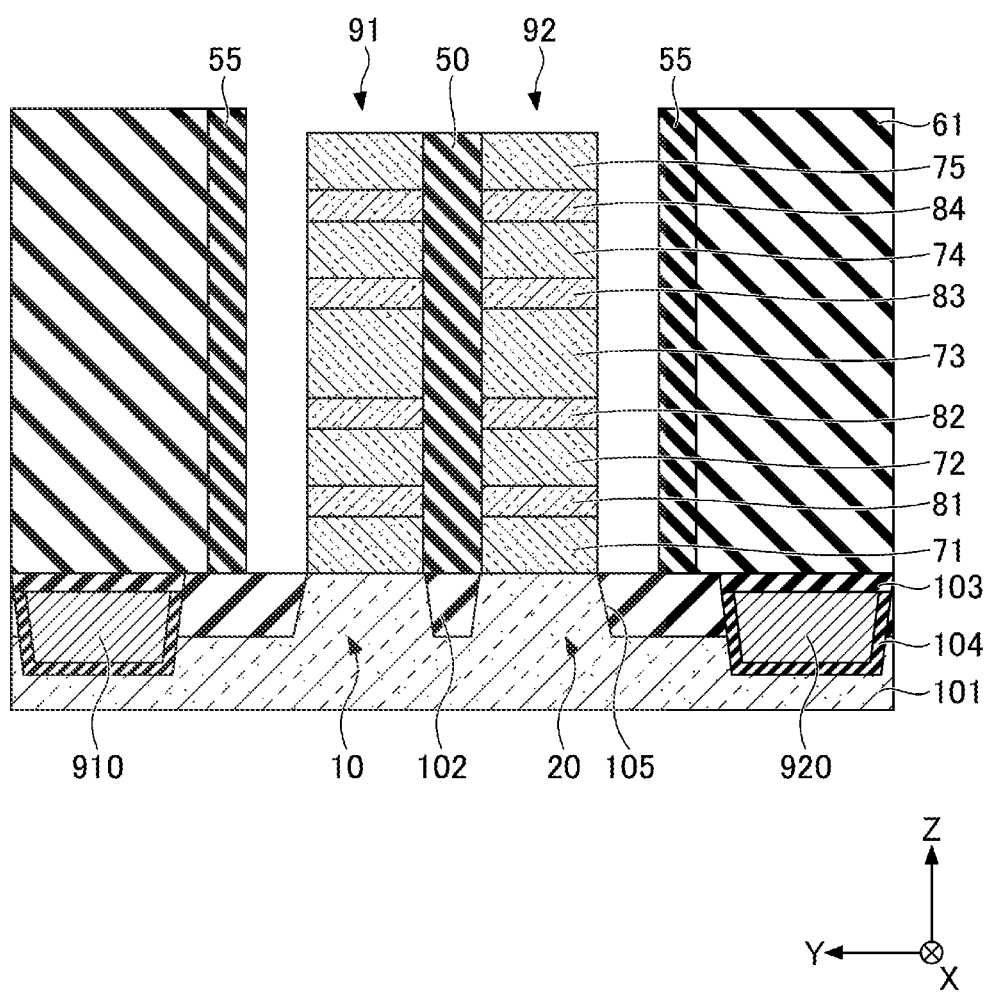
Figure 59:
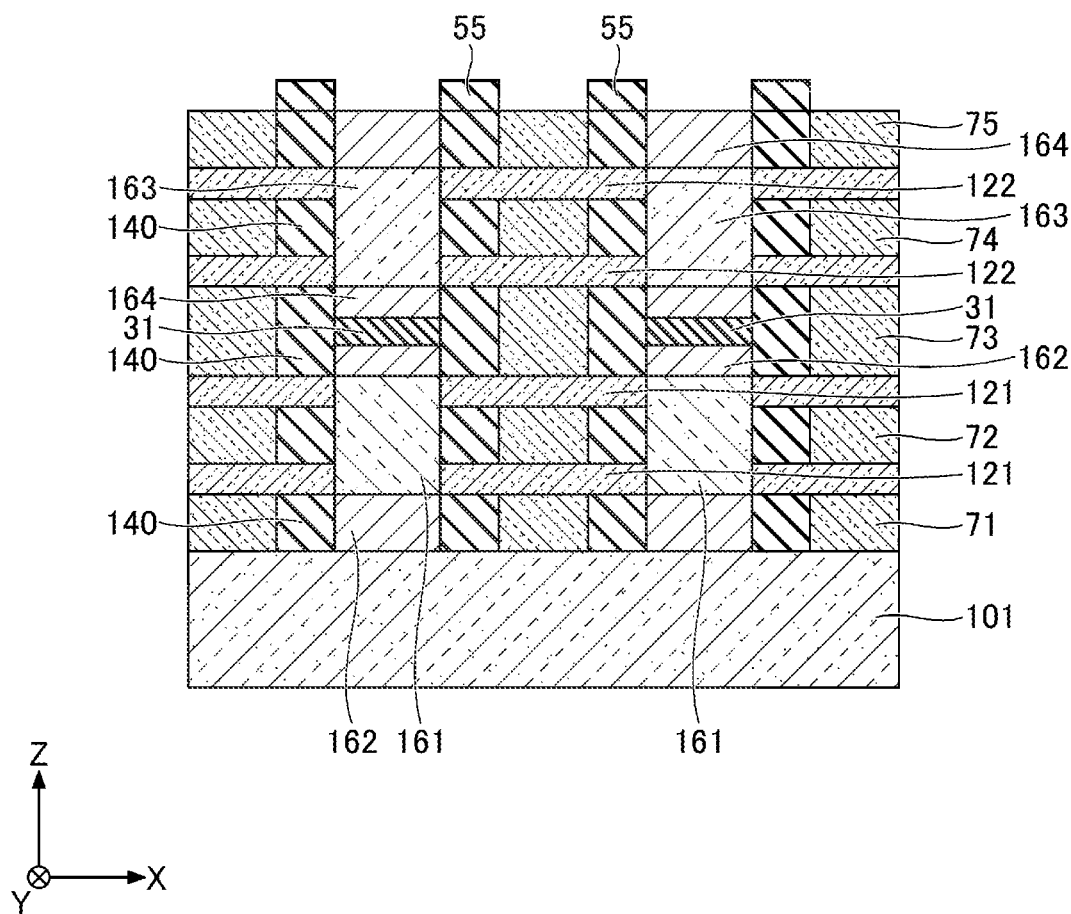

Next, as depicted in FIGS. 20, 33, and 59, the sacrificial gates 107 are removed.

Figure 21:
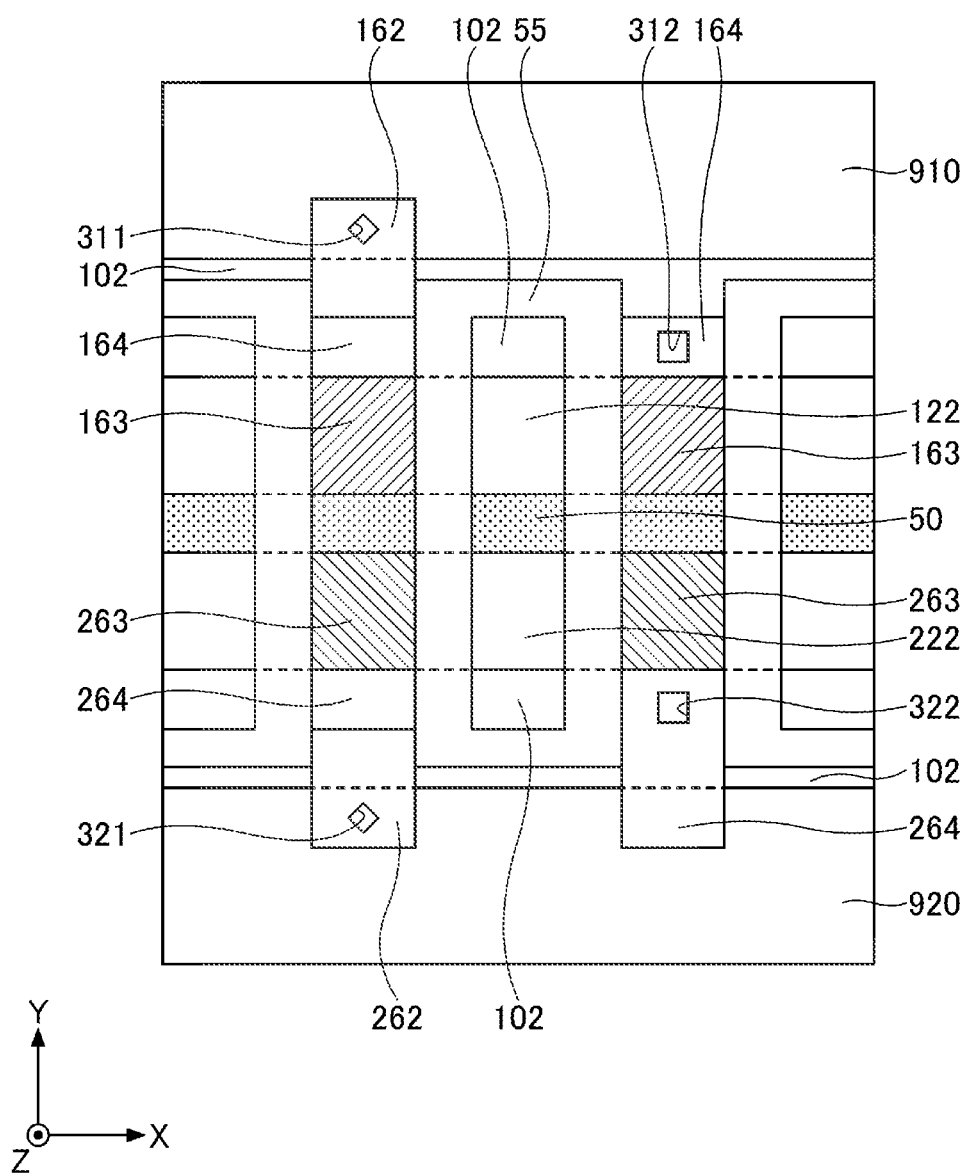
Figure 34:
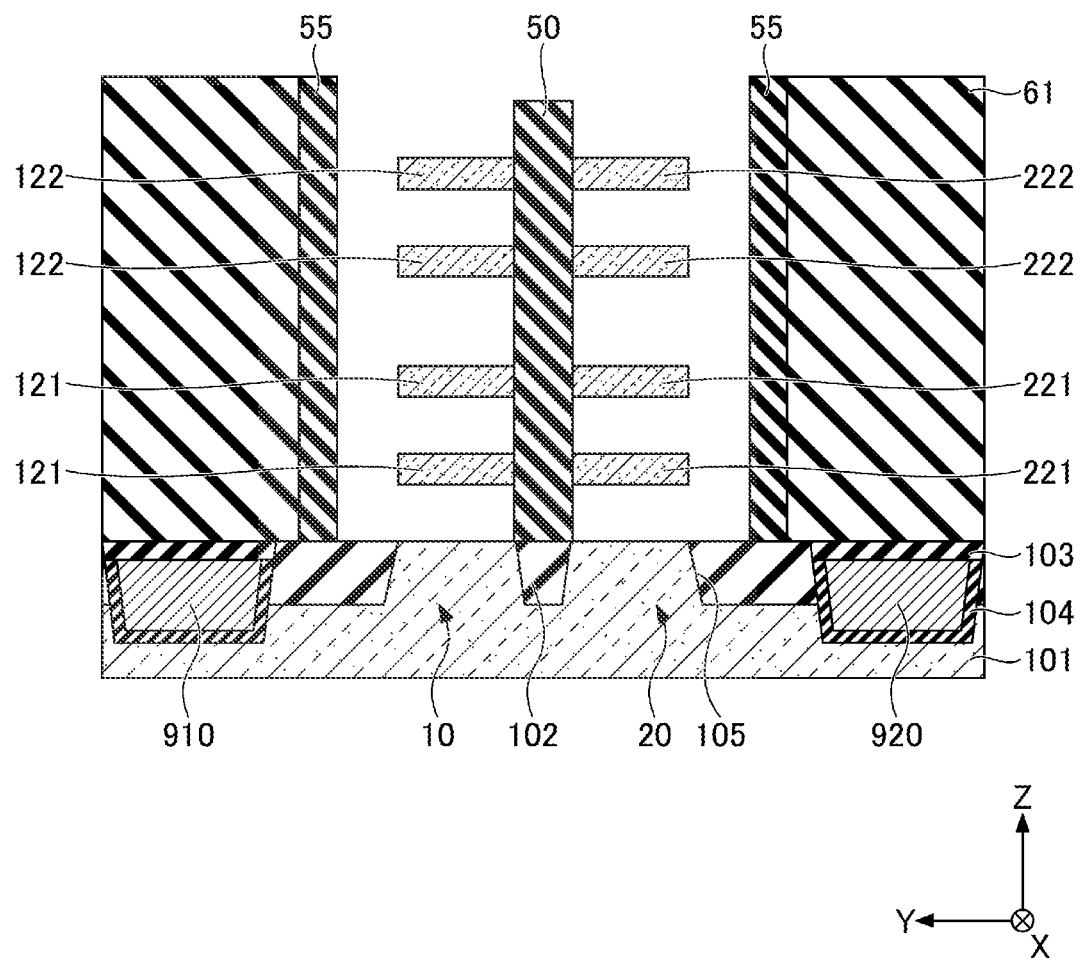
Figure 60:
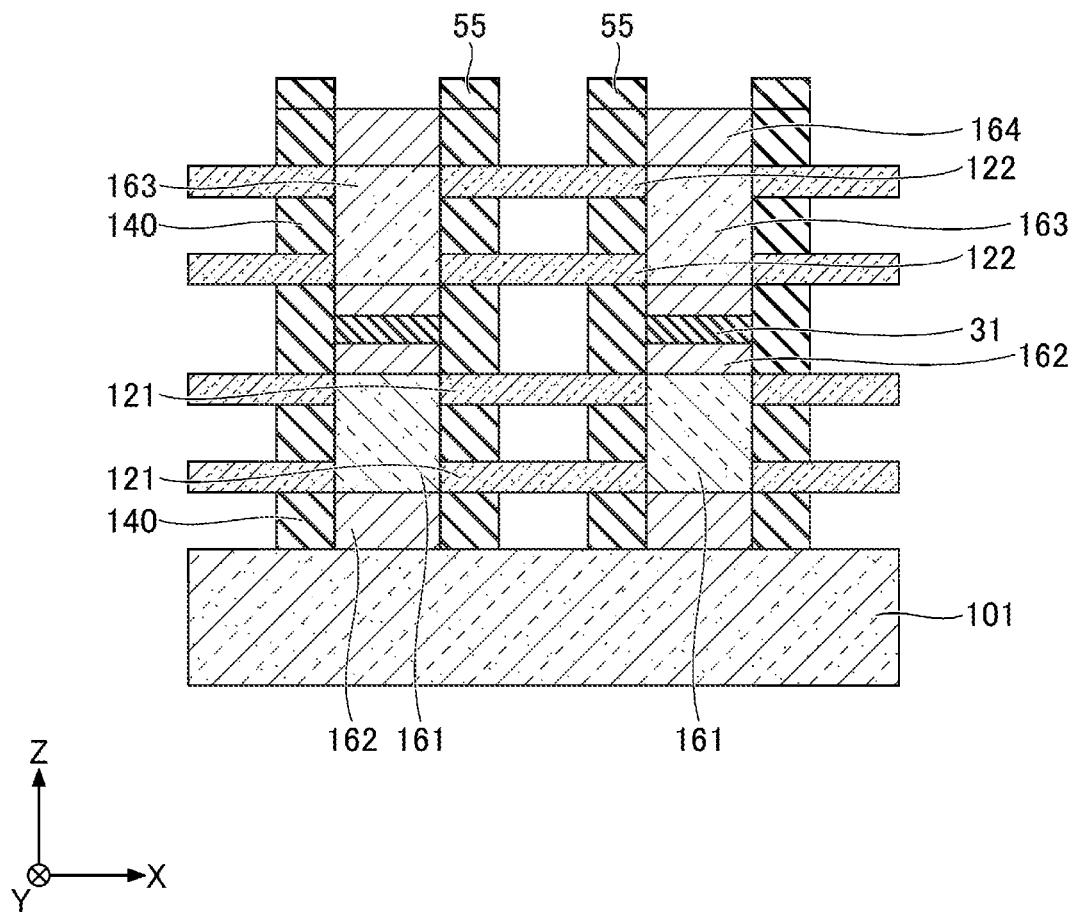

Thereafter, as depicted in FIGS. 21, 34, and 60, the SiGe films 71 to 75 are removed. As a result, spaces are created around the nanosheets 121, 122, 221, and 222.

Figure 22:
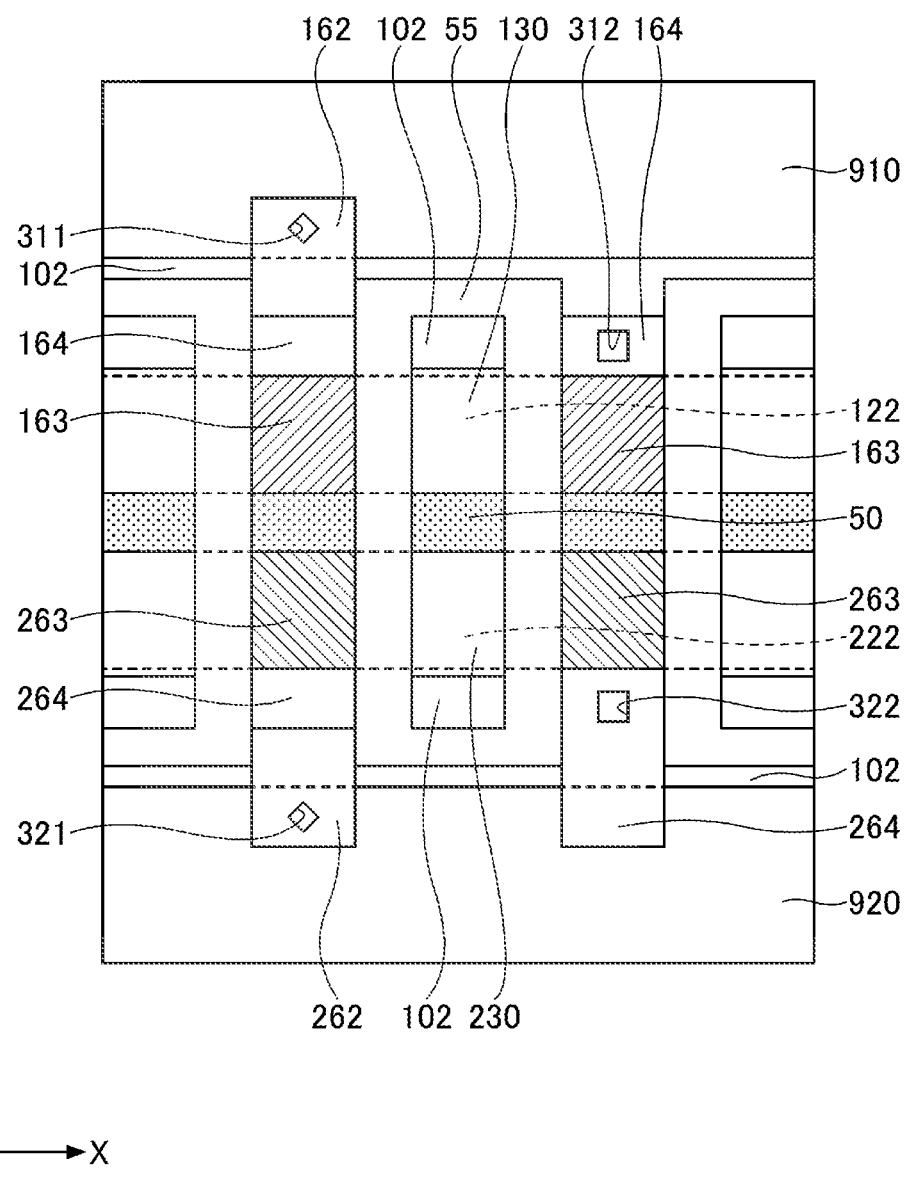
Figure 23:
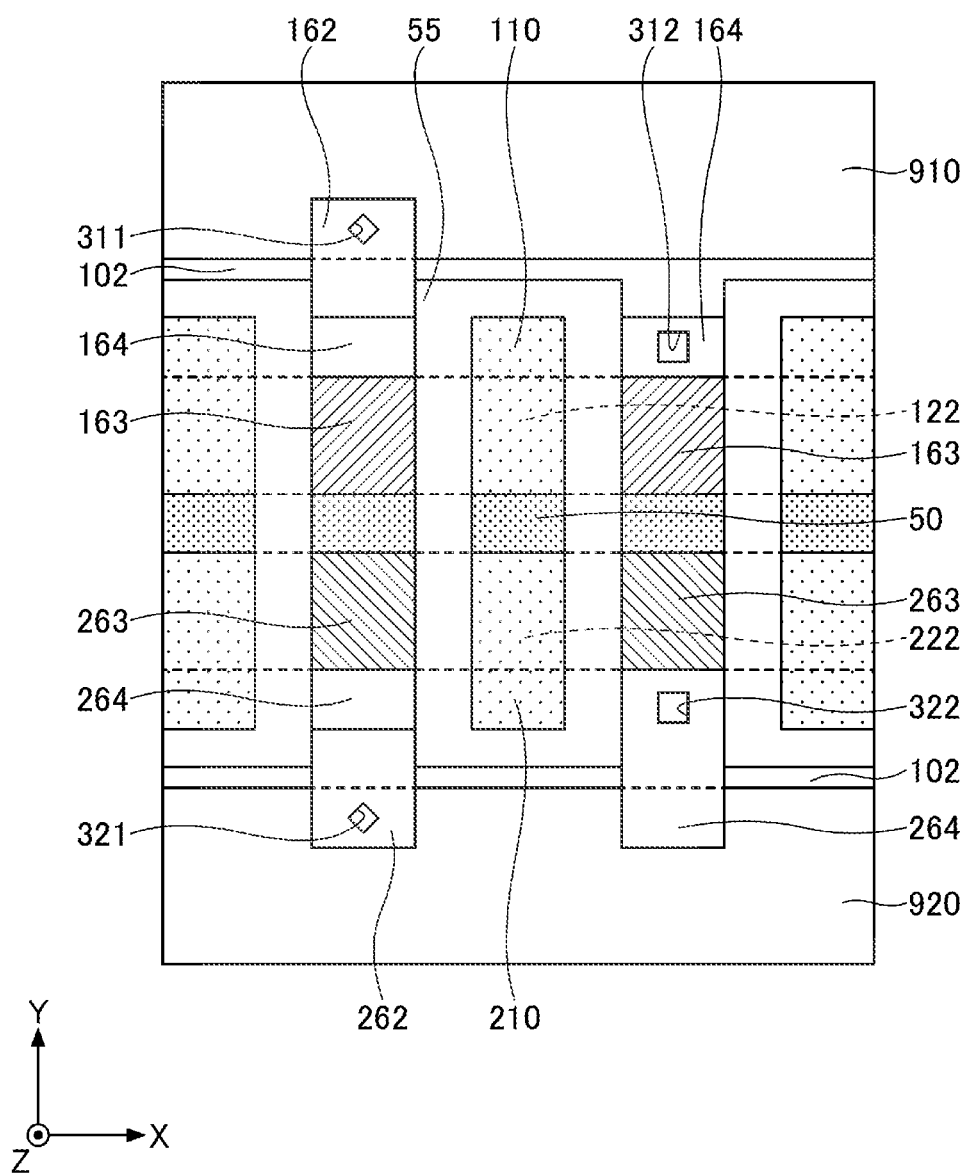
Figure 24:
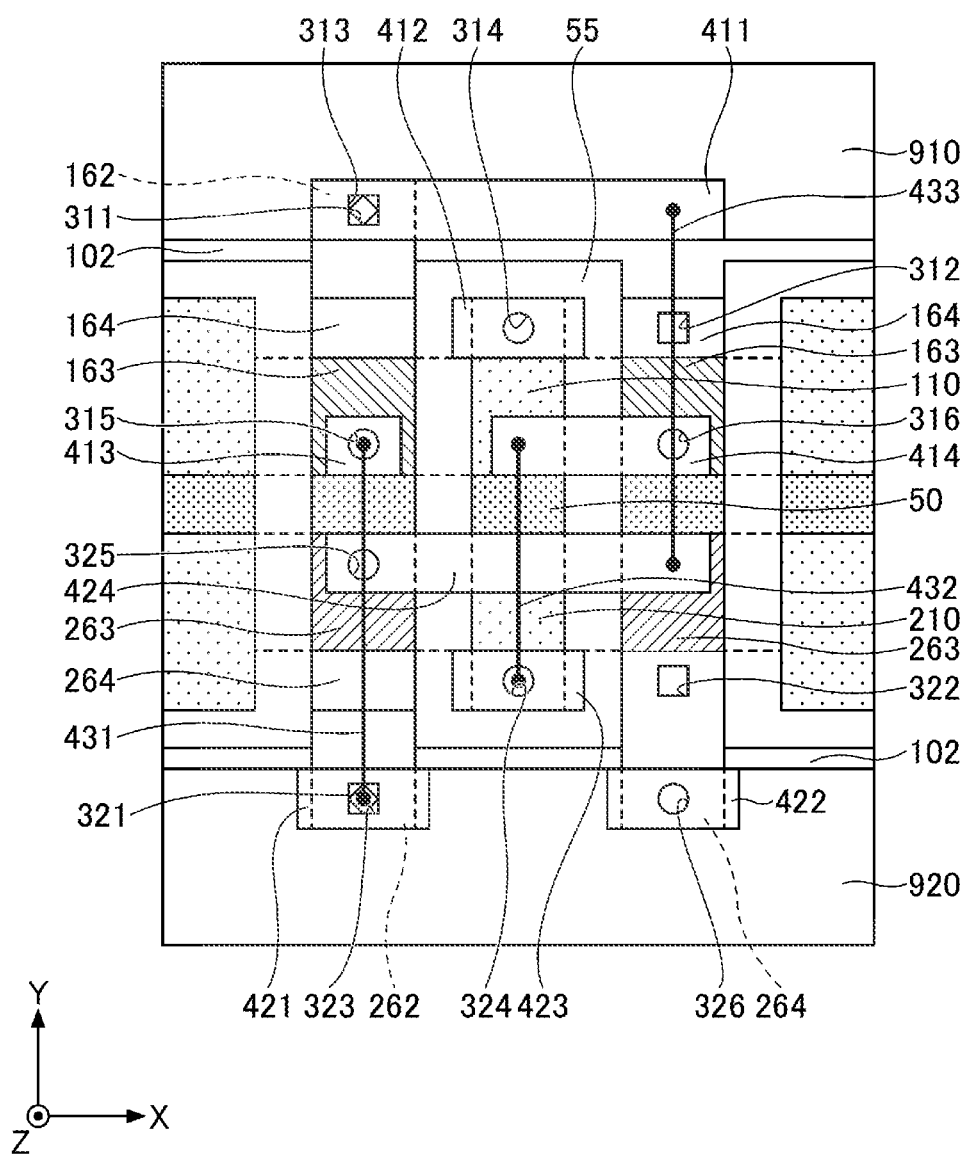
Figure 35:
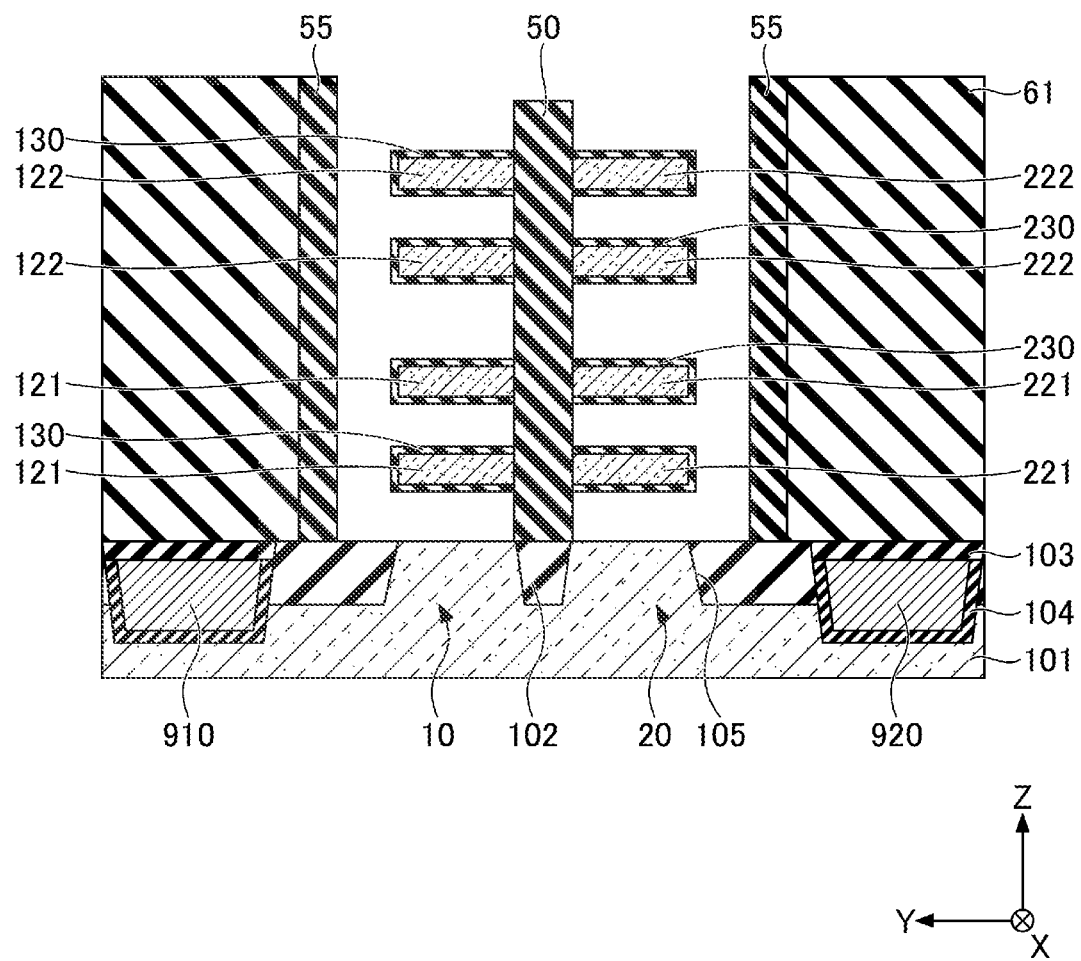
Figure 36:
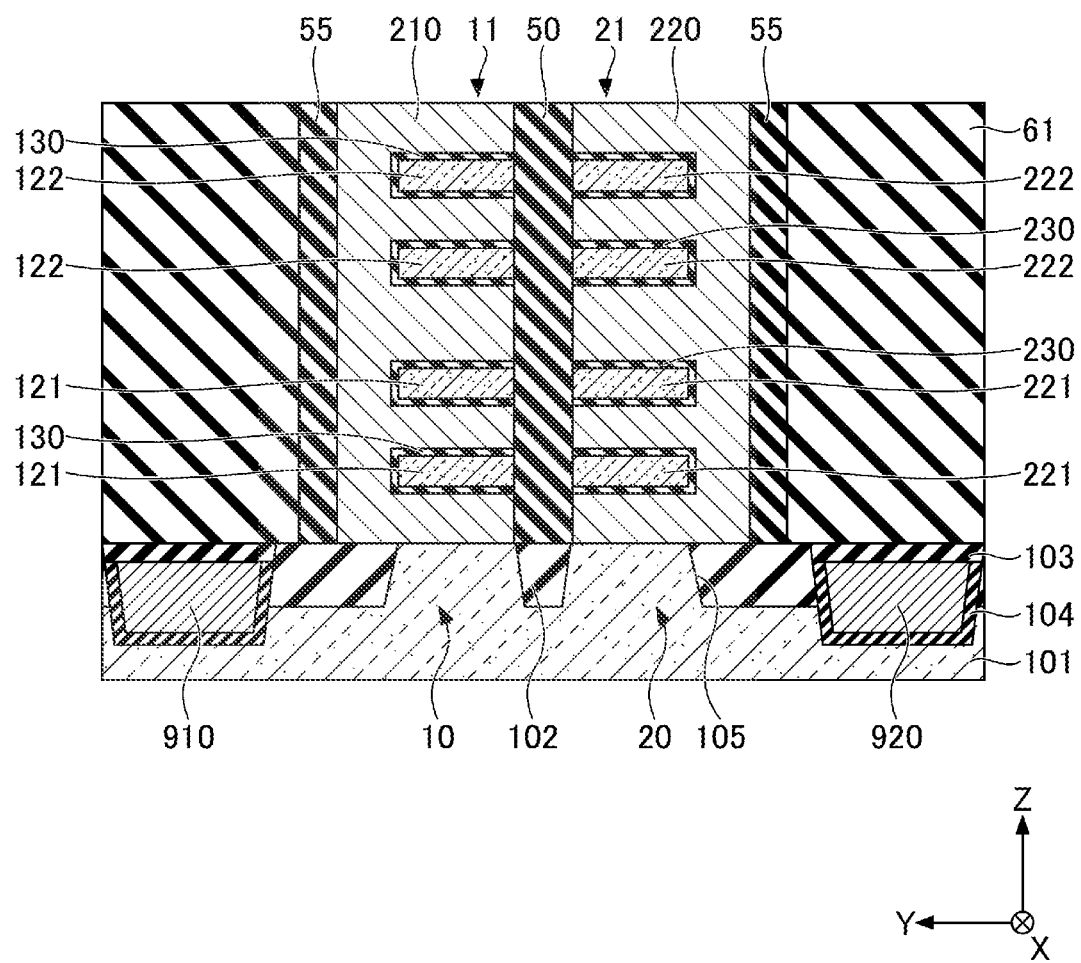
Figure 37:
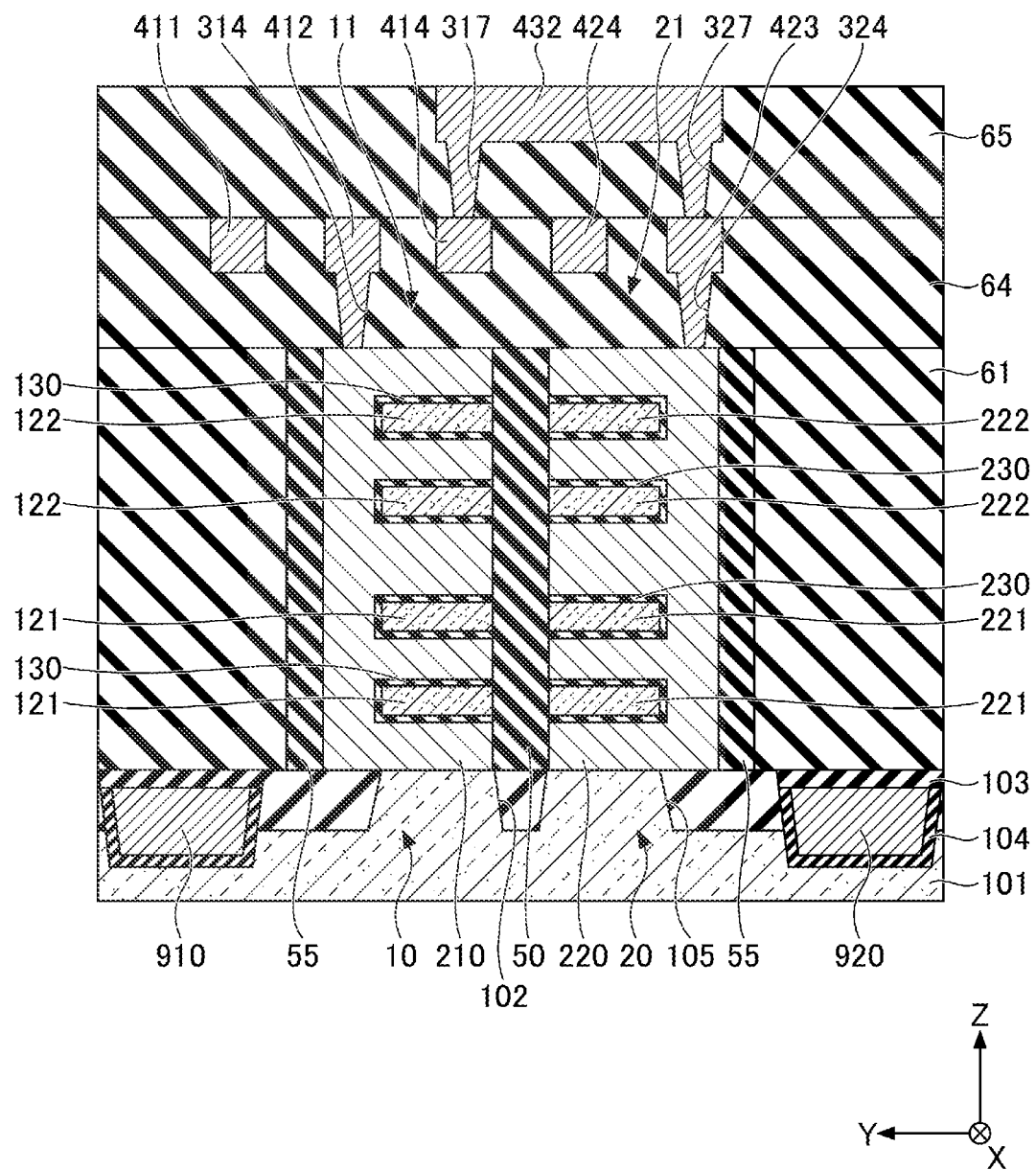
Figure 38:
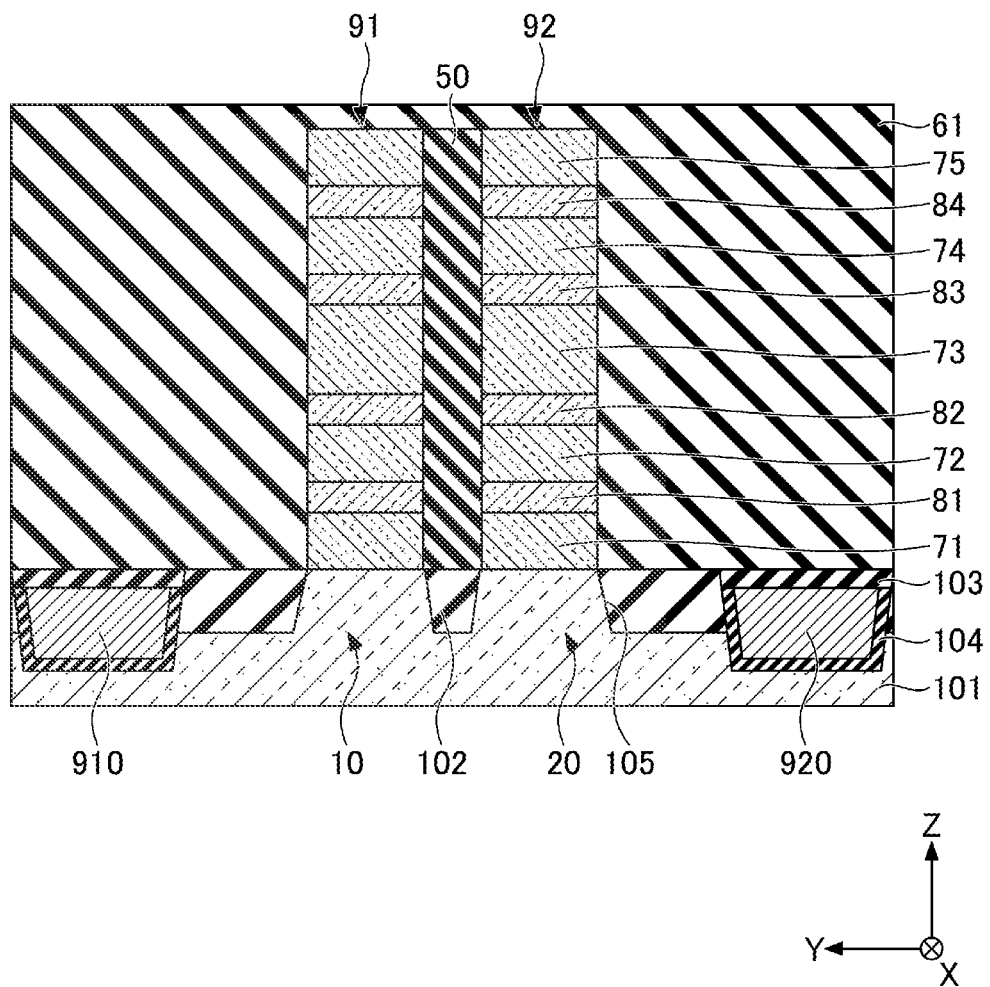
Figure 61:
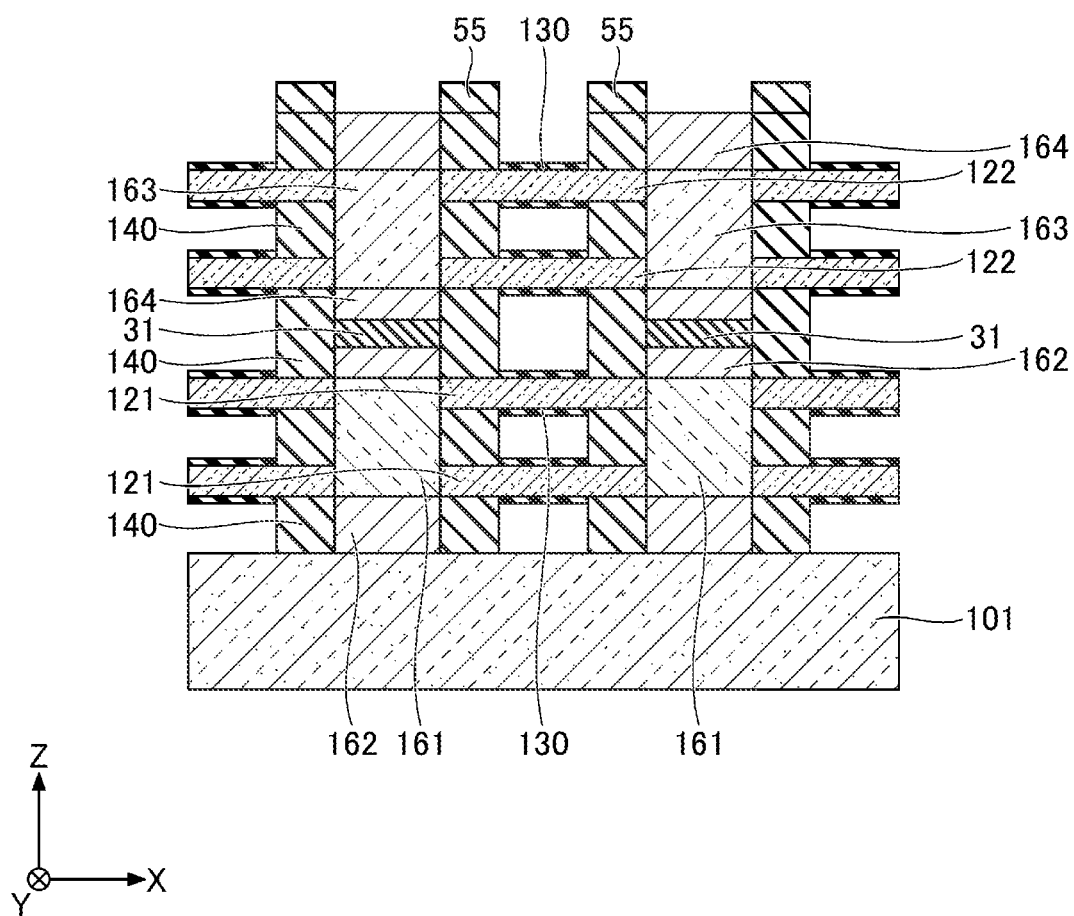
Figure 62:
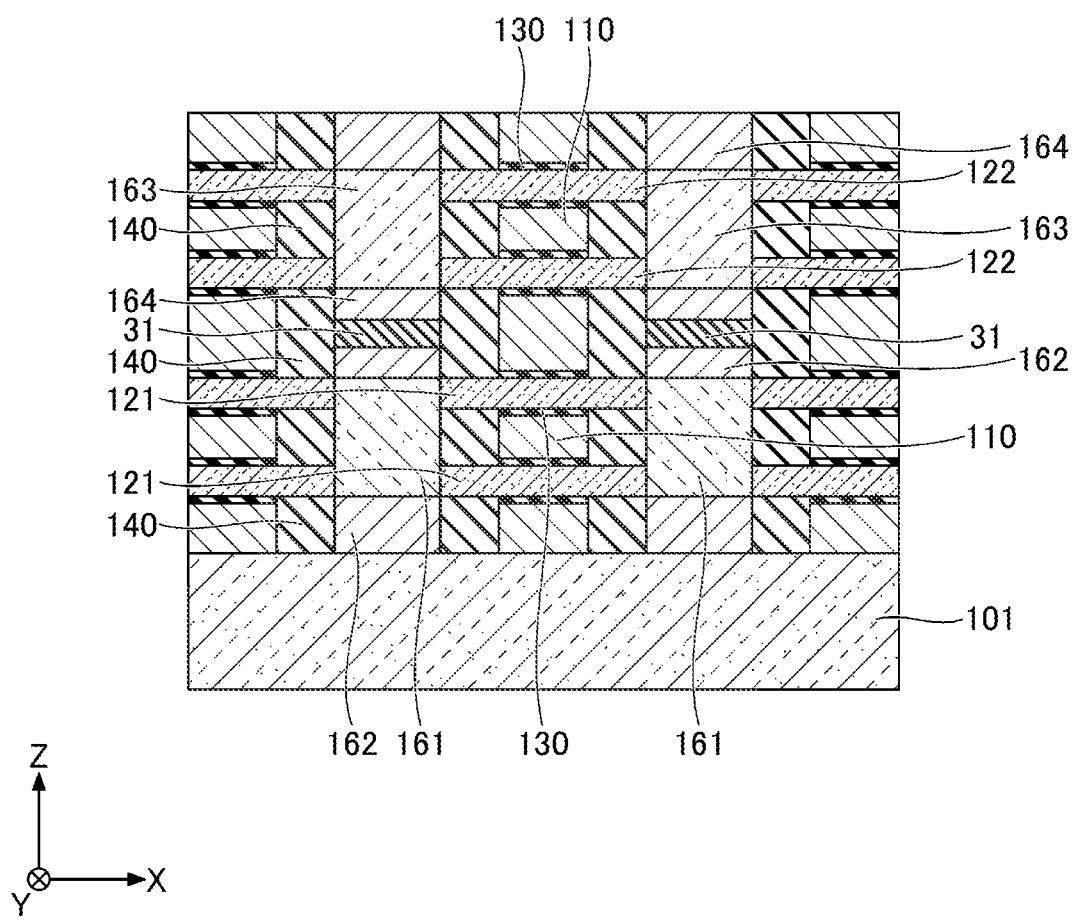
Figure 63:
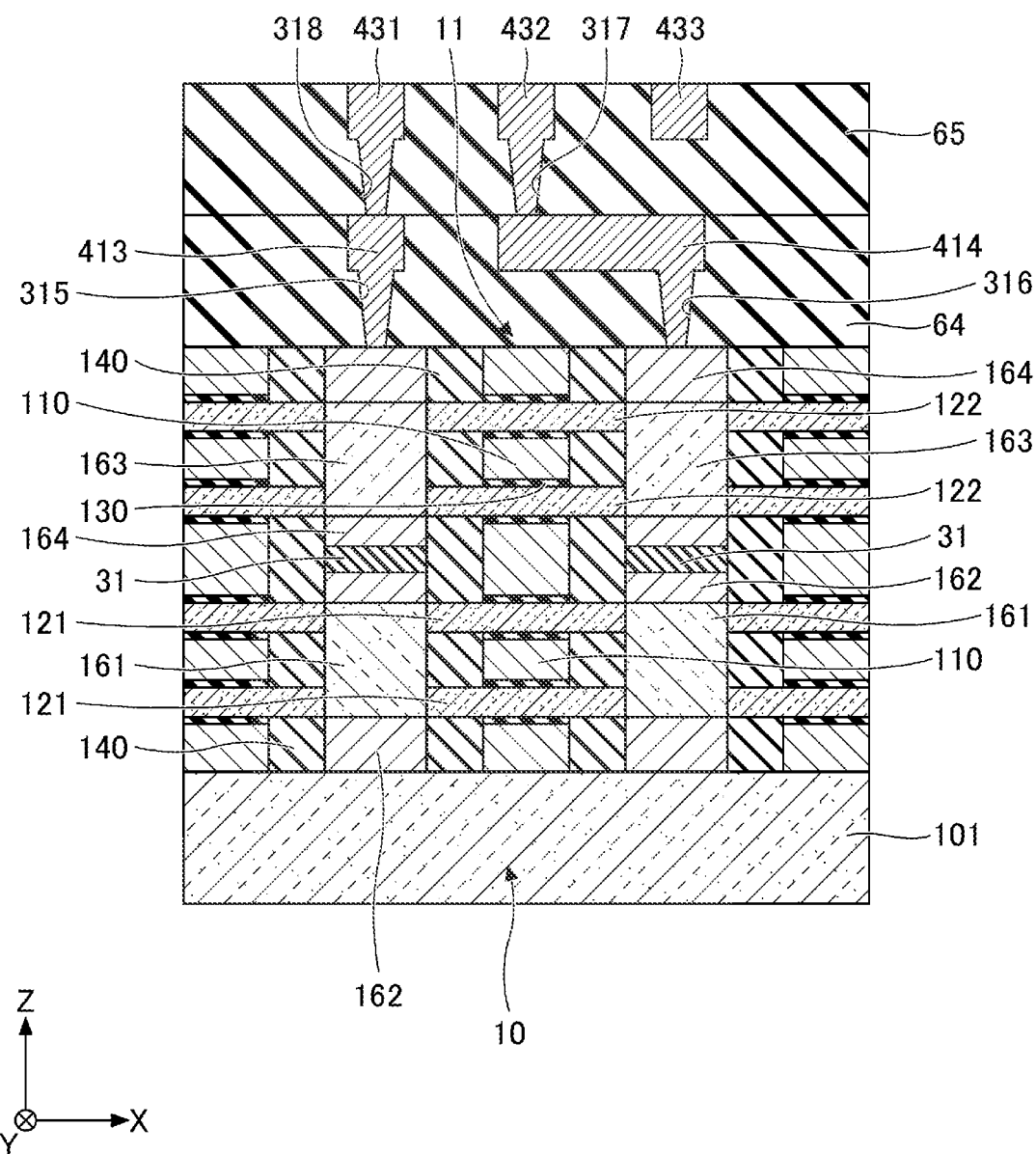

Subsequently, as depicted in FIGS. 22, 35, and 61, the gate insulating films 130 and 230 are formed around the nanosheets 121, 122, 221, and 222. The gate insulating films 130 and 230 can be formed by a deposition method such as a chemical vapor deposition (CVD) method or an atomic layer deposition (ALD) method. The gate insulating films 130 and 230 are formed also on the surface of the substrate 101 or the like, but forming of the gate insulating films 130 and 230 there is not depicted in the drawings.

Next, as depicted in FIGS. 23, 36, 43, 47, and 62, the gate electrodes 110 and 210 are formed; and, for example, the insulating films 61 and the like are polished until the upper surfaces of the walls 50 are exposed, and the upper surfaces of the gate electrodes 110 and 210 are planarized. Thus, the stacked transistor structure 11 is formed in the region 10, and the stacked transistor structure 21 is formed in the region 20.

Thereafter, as depicted in FIGS. 24, 37, 44, 48, and 63, the insulating film 64 is formed, the contact holes 313 to 316 and 323 to 326 are formed, and the signal lines 411 to 414 and 421 to 424 are formed. Subsequently, the insulating film 65 is formed, the contact holes 317 to 319 and 327 to 329 are formed, and the signal lines 431 to 433 are formed.

Thereafter, upper-layer wirings and the like are formed if necessary to complete the semiconductor device 100.

A circuit included in a semiconductor device according to an embodiment of the present disclosure is not limited to a buffer such as that described above in which two inverters are connected in series. Connecting relations with respect to local wirings and signal lines may be different from those in the embodiment described above, and, for example, a circuit in which two inverters are connected in parallel may be included in a semiconductor device according to an embodiment of the present disclosure, or a circuit in which two inverters independent from each other may be included in a semiconductor device according to an embodiment of the present disclosure.

First to fourth semiconductor regions may have the same conductivity types, and fifth to eighth semiconductor regions may have the same conductivity types. For example, the conductivity types of the semiconductor regions connected to the semiconductor layers (nanosheets) in contact with the side surface 51 may be all n-types, and the conductivity types of the semiconductor regions connected to the semiconductor layers (nanosheets) in contact with the side surface 52 may be all p-types. Further, the first to eighth semiconductor regions may have the same conductivity types.

The power supply lines 910 and 920 need not be embedded in the substrate 101, and may be provided above the insulating film 61, for example.

Although the present invention has been described based on the embodiments, the present invention is not limited to the requirements depicted in the above embodiments. These points can be changed without departing from the gist of the present invention, and can be appropriately determined according to the application form.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a depicting of the superiority and inferiority of the invention. Although the semiconductor devices and the semiconductor device manufacturing methods have been described with reference to the embodiments, it should be understood that the present invention is not limited to these embodiments, and various changes, substitutions, and alterations could be made thereto without departing from the spirit and scope of the present invention.

What is claimed is:

1. A semiconductor device comprising:
    a substrate;
    a first semiconductor layer disposed above the substrate;
    a first semiconductor region and a second semiconductor region that are disposed above the substrate, the first semiconductor layer being disposed between the first semiconductor region and the second semiconductor region with respect to a first direction in plan view;
    a second semiconductor layer disposed above the first semiconductor layer;
    a third semiconductor region and a fourth semiconductor region that are disposed above the first semiconductor region and the second semiconductor region, respectively, the second semiconductor layer being disposed between the third semiconductor region and the fourth semiconductor region with respect to the first direction;
    a third semiconductor layer disposed above the substrate and disposed side by side with respect to the first semiconductor layer with respect to a second direction different from the first direction in plan view;
    a fifth semiconductor region and a sixth semiconductor region disposed above the substrate, the third semiconductor layer being disposed between the fifth semiconductor region and the sixth semiconductor region with respect to the first direction in plan view;
    a fourth semiconductor layer disposed above the third semiconductor layer and disposed side by side with respect to the second semiconductor layer with respect to the second direction in plan view;
    a seventh semiconductor region and an eighth semiconductor region disposed above the fifth semiconductor region and the sixth semiconductor region, respectively, the fourth semiconductor layer being disposed between the seventh semiconductor region and the eighth semiconductor region with respect to the first direction;
    an insulating wall having an insulating property, disposed above the substrate, extending in the first direction, and having a first side surface and a second side surface opposite the first side surface;

a first gate electrode disposed above the first semiconductor layer and the second semiconductor layer, first gate insulating films being disposed between the first gate electrode and the first semiconductor layer and between the first gate electrode and the second semiconductor layer;

a second gate electrode disposed above the third semiconductor layer and the fourth semiconductor layer, second gate insulating films being disposed between the second gate electrode and the third semiconductor layer and between the second gate electrode and the fourth semiconductor layer;

a first power supply line electrically connected to the first semiconductor region;

a second power supply line electrically connected to the fifth semiconductor region;

a first wiring disposed above the first power supply line and electrically connected to the first power supply line and the first semiconductor region; and a second wiring disposed above the second power supply line and electrically connected to the second power supply line and the fifth semiconductor region, wherein the first side surface is in contact with the first semiconductor layer and the second semiconductor layer, and the second side surface is in contact with the third semiconductor layer and the fourth semiconductor layer.

2. The semiconductor device as claimed in claim 1, wherein each of conductivity types of the first semiconductor region and the second semiconductor region is a first conductivity type, and each of conductivity types of the third semiconductor region and the fourth semiconductor region is a second conductivity type different from the first conductivity type.

3. The semiconductor device as claimed in claim 2, wherein the second semiconductor region and the fourth semiconductor region are electrically connected to each other.

4. The semiconductor device as claimed in claim 3, wherein the second semiconductor region and the fourth semiconductor region are electrically connected to the second gate electrode.

5. The semiconductor device as claimed in claim 2, wherein each of conductivity types of the fifth semiconductor region and the sixth semiconductor region is the second conductivity type, and each of conductivity types of the seventh semiconductor region and the eighth semiconductor region is the first conductivity type.

6. The semiconductor device as claimed in claim 5, wherein the sixth semiconductor region and the eighth semiconductor region are electrically connected to each other.

7. The semiconductor device as claimed in claim 1, wherein the first power supply line and the second power supply line are embedded in the substrate.

8. The semiconductor device as claimed in claim 1, further comprising an isolation film embedded in the substrate, wherein the insulating wall is disposed above the isolation film.

9. A semiconductor device manufacturing method comprising:

forming a first-semiconductor-material layer above a substrate;

forming a second-semiconductor-material layer above the first-semiconductor-material layer;

forming a first fin and a second fin extending in a first direction in plan view and arranged in a second direction different from the first direction by etching stacked layers including the first-semiconductor-material layer and the second-semiconductor-material layer, the first fin including a first semiconductor layer obtained from the first-semiconductor-material layer and a second semiconductor layer obtained from the second-semiconductor-material layer, the second fin including a third semiconductor layer obtained from the first-semiconductor-material layer and a fourth semiconductor layer obtained from the second-semiconductor-material layer;

forming an insulating wall having an insulating property between the first fin and the second fin, the insulating wall having a first side surface in contact with the first semiconductor layer and the second semiconductor layer and a second side surface in contact with the third semiconductor layer and the fourth semiconductor layer;

forming a first semiconductor region and a second semiconductor region, the first semiconductor layer being disposed between the first semiconductor region and the second semiconductor region with respect to the first direction;

forming a third semiconductor region and a fourth semiconductor region, the second semiconductor layer being disposed between the third semiconductor region and the fourth semiconductor region with respect to the first direction;

forming a fifth semiconductor region and a sixth semiconductor region, the third semiconductor layer being disposed between the fifth semiconductor region and the sixth semiconductor region with respect to the first direction;

forming a seventh semiconductor region and an eighth semiconductor region, the fourth semiconductor layer being disposed between the seventh semiconductor region and the eighth semiconductor region with respect to the first direction;

forming a first gate electrode above the first semiconductor layer and the second semiconductor layer, first gate insulating films being disposed between the first gate electrode and the first semiconductor layer and between the first gate electrode and the second semiconductor layer;

forming a second gate electrode above the third semiconductor layer and the fourth semiconductor layer, second gate insulating films being disposed between the second gate electrode and the third semiconductor layer and between the second gate electrode and the fourth semiconductor layer;

forming a first power supply line to be electrically connected to the first semiconductor region;

forming a second power supply line to be electrically connected to the fifth semiconductor region;

forming a first wiring above the first power supply line to be electrically connected to the first power supply line and the first semiconductor region; and forming a second wiring above the second power supply line to be electrically connected to the second power supply line and the fifth semiconductor region.

\* \* \* \* \*